(12) United States Patent
Shimomura et al.

(10) Patent No.: US 7,678,668 B2
(45) Date of Patent: Mar. 16, 2010

(54) MANUFACTURING METHOD OF SOI SUBSTRATE AND MANUFACTURING METHOD OF SEMICONDUCTOR DEVICE

(75) Inventors: Akihisa Shimomura, Isehara (JP); Hideto Ohnuma, Atsugi (JP); Tetsuya Kakehata, Isehara (JP); Kenichiro Makino, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/213,271

(22) Filed: Jun. 17, 2008

(65) Prior Publication Data

US 2009/0011575 A1    Jan. 8, 2009

(30) Foreign Application Priority Data

Jul. 4, 2007    (JP) .............................. 2007-175757

(51) Int. Cl.
   *H01L 21/30*    (2006.01)
(52) U.S. Cl. .................. 438/458; 438/463; 257/464; 257/E21.568; 257/E21.6
(58) Field of Classification Search ................ 438/308, 438/311, 378, 487, 795, 458, 463, 464; 257/347, 257/E21.134, E21.32, E27.112, E21.568, 257/E21.6
   See application file for complete search history.

(56) References Cited

U.S. PATENT DOCUMENTS

| | | | |
|---|---|---|---|
| 6,335,231 B1 | 1/2002 | Yamazaki et al. | |
| 6,372,609 B1 | 4/2002 | Aga et al. | |
| 6,534,380 B1 | 3/2003 | Yamauchi et al. | |
| 6,573,161 B1 * | 6/2003 | Miyasaka et al. | ........... 438/487 |
| 6,767,799 B2 | 7/2004 | Shimomura et al. | |
| 6,867,067 B2 | 3/2005 | Ghyselen et al. | |
| 2008/0246109 A1 | 10/2008 | Ohnuma et al. | |
| 2009/0004764 A1 | 1/2009 | Ohnuma et al. | |
| 2009/0004878 A1 | 1/2009 | Ohnuma et al. | |

FOREIGN PATENT DOCUMENTS

| | | |
|---|---|---|
| JP | 11-097379 | 4/1999 |
| JP | 11-163363 | 6/1999 |
| JP | 2000-124092 | 4/2000 |
| JP | 2000-294754 | 10/2000 |
| JP | 2005-203596 | 7/2005 |
| JP | 2005-252244 | 9/2005 |

* cited by examiner

*Primary Examiner*—Quoc D Hoang
(74) *Attorney, Agent, or Firm*—Eric J. Robinson; Robinson Intellectual Property Law Office, P.C.

(57) ABSTRACT

It is object to provide a manufacturing method of an SOI substrate provided with a single-crystal semiconductor layer, even in the case where a substrate having a low allowable temperature limit, such as a glass substrate, is used and to manufacture a high-performance semiconductor device using such an SOI substrate. Light irradiation is performed on a semiconductor layer which is separated from a semiconductor substrate and bonded to a support substrate having an insulating surface, using light having a wavelength of 365 nm or more and 700 nm or less, and a film thickness d (nm) of the semiconductor layer which is irradiated with the light is made to satisfy $d = \lambda/2n \times m \pm \alpha$ (nm), when a light wavelength is $\lambda$ (nm), a refractive index of the semiconductor layer is n, m is a natural number greater than or equal to 1 (m=1, 2, 3, 4, ...), and $0 \leq \alpha \leq 10$ is satisfied.

35 Claims, 24 Drawing Sheets

MANUFACTURING METHOD OF SOI SUBSTRATE AND MANUFACTURING METHOD OF SEMICONDUCTOR DEVICE

BACKGROUND OF THE INVENTION

1. Field of the Invention

The present invention relates to a manufacturing method of a so-called SOI (silicon on insulator) having an SOI structure in which a semiconductor layer is provided on an insulating surface, and a manufacturing method of a semiconductor device having an SOI structure.

2. Description of the Related Art

Integrated circuits have been developed, which use a semiconductor substrate called a silicon-on-insulator (hereinafter also referred to as an SOI) which has a thin single-crystal semiconductor layer over an insulating surface, as an alternative to a silicon wafer that is manufactured by thinly slicing an ingot of a single-crystal semiconductor. An integrated circuit using an SOI substrate has been attracting attention because parasitic capacitance between drains of the transistors and the substrate is reduced and the performance of the integrated circuit is improved.

As a method for manufacturing SOI substrates, a hydrogen ion implantation separation method is known (for example, see Reference 1: Japanese Published Patent Application No. 2000-124092). The hydrogen ion implantation separation method is a method in which hydrogen ions are implanted into a silicon wafer to form a microbubble layer in the silicon wafer at a predetermined depth from a surface thereof, the microbubble layer is used as a cleavage plane, and a thin silicon layer is bonded to another silicon wafer. In addition to heat treatment for separation of the silicon layer, it is necessary to form an oxide film on the silicon layer by heat treatment in an oxidative atmosphere, remove the oxide film, and perform heat treatment at 1000 to 1300° C. to increase the bonding strength.

On the other hand, a semiconductor device in which a silicon layer is formed over an insulating substrate such as high heat resistant glass is disclosed (for example, see Patent Document 2: Japanese Published Patent Application No. H11-163363). The semiconductor device has a structure in which an entire surface of crystallized glass, a strain point of which is greater than or equal to 750° C., is protected by an insulating silicon film and the silicon layer obtained by hydrogen ion implantation separation method is firmly fixed over the insulating silicon film.

SUMMARY OF THE INVENTION

In an ion implantation step which is performed to form an embrittlement layer, the silicon layer is damaged due to ions which are implanted. In the above-described heat treatment for increasing the bonding strength between the silicon layer and a support substrate, the damage to the silicon layer due to the ion implantation step is also recovered.

However, when a substrate having a low allowable temperature limit such as a glass substrate is used as the support substrate, heat treatment at 1000° C. or more cannot be performed; thus, the above-described damage to the silicon layer due to the ion implantation step cannot be sufficiently recovered.

In view of such a problem, it is an object of the present invention to provide a manufacturing method of an SOI substrate provided with a semiconductor layer which is sufficient for practical use, even in the case where a substrate having a low allowable temperature limit such as a glass substrate is used. In addition, it is another object of the present invention to manufacture a highly reliable semiconductor device using such an SOI substrate.

In manufacturing an SOI substrate, light irradiation is performed in order to recover crystallinity of a semiconductor layer which is separated from a semiconductor substrate and bonded to a support substrate having an insulating surface.

By light irradiation, at least part of a region of a semiconductor layer can be melted to reduce crystal defects in the semiconductor layer. Since light irradiation treatment is employed and increase in temperature of a support substrate can be suppressed, a substrate having a low allowable temperature limit such as a glass substrate can be used as the support substrate.

In the present invention, as light irradiation treatment performed on a semiconductor layer, light having a wavelength of 365 nm or more and 700 nm or less which reflects and resonates in the semiconductor layer and which can perform heat treatment is used. For the light having a wavelength of 365 nm or more and 700 nm or less in a so-called visible region, laser light can be used which is oscillated from a solid state laser oscillator superior in productivity as compared to an excimer laser or the like which oscillates ultraviolet light.

However, a thin film interference effect is pronounced in the above-described light having a wavelength of 365 nm or more and 700 nm or less in a so-called visible region. FIG. 24A shows a wavelength dispersion data of a refractive index of single-crystal silicon which is used for a semiconductor layer, and FIG. 24B shows a wavelength dispersion data of an extinction coefficient of single-crystal silicon. It is found that, as shown in FIG. 24B, an extinction coefficient of single-crystal silicon is decreased rapidly in the case of light having a wavelength longer than a wavelength of approximately 365 nm, which is extremely small as compared to a short wavelength like a wavelength of 350 nm or less.

The present applicant has found the above-described thin film interference effect from the result of Raman spectroscopy which is performed on single-crystal silicon layers with different film thicknesses. FIG. 21A shows variation of a Raman shift with respect to the film thickness of the single-crystal silicon layers, and FIG. 21B shows variation of Raman intensities. The film thickness is in a linear relation with an accelerating voltage during ion irradiation to the semiconductor substrate, as shown in FIG. 22. The film thickness of the single-crystal silicon layers in FIGS. 21A and 21B was evaluated from an accelerating voltage at ion irradiation. Note that ten samples of the single-crystal silicon layers shown in FIGS. 21A and 21B were formed in the following manner: a silicon oxynitride film (film thickness: 100 nm) and a silicon nitride oxide film (film thickness: 50 nm) were formed over a single-crystal silicon substrate; hydrogen ion irradiation was performed to form an embrittlement layer; the single-crystal silicon substrate was bonded to a glass substrate which is a support substrate, using a silicon oxide film as an insulating layer having a bonding surface; and a single-crystal silicon layer was formed by being separated from the single-crystal silicon substrate. Ion irradiation was performed using hydrogen with an ion doping apparatus. In FIGS. 21A and 21B, six samples with a hydrogen ion dose of $1.8 \times 10^{16}$ ions/cm$^2$ are indicated by x dots, and four samples with a hydrogen ion dose of $2 \times 10^{16}$ ions/cm$^2$ are indicated by circular dots.

From FIGS. 21A and 21B, Raman scattering intensities of the single-crystal silicon layers of approximately 60 nm and 120 nm are four to eight times of those of the single-crystal silicon layers of other film thickness, whereas Raman shifts are smaller than those of the single-crystal silicon layers of other film thickness by 1.0 to 1.5 cm$^{-1}$. This is because incident light which is used for Raman spectroscopy is a second harmonic of a YAG laser, a wavelength of which is 532 nm; therefore, the light resonates in the single-crystal silicon layers, and Raman scattering intensities were obtained high. Accordingly, local temperature rise occurred in the single-crystal silicon layers by resonation, which reduced Raman shifts.

According to the above-described experimental results, it was found that, in the single-crystal silicon layers, the light having a wavelength of 365 nm or more and 700 nm or less which reflects and resonates in the semiconductor layer and which can perform heat treatment has a high thin film interference effect and light irradiation treatment efficiency thereof depends on the film thickness of the single-crystal silicon layers.

Further, optical calculation of dependency of the light absorptance on the film thickness of the single-crystal silicon layers with respect to the light having a wavelength of 365 nm or more and 700 nm or less was performed. As for the optical calculation, the absorptance in the case where light having a 308 nm wavelength and light having a 532 nm wavelength are incident perpendicularly into a support substrate (a synthetic quartz substrate, the thickness of which is 1.1 mm) provided with a single-crystal silicon layer was calculated by a Fresnel coefficient method. A refractive index n and an extinction coefficient k in each of the single-crystal silicon layers and the synthetic quartz substrate in the case of the 308 nm wavelength and the 532 nm wavelength are shown in Table 1.

TABLE 1

| sample | 308 nm wavelength | | 532 nm wavelength | |
|---|---|---|---|---|
| | refractive index: n | extinction coefficient: k | refractive index: n | extinction coefficient: k |
| silicon layer | 5.02 | 3.68 | 4.16 | 0.044 |
| quartz substrate | 1.48 | 0 | 1.46 | 0 |

The optical calculation results of the film thickness and the absorptance of single-crystal silicon layers are shown in FIG. 23. In FIG. 23, a result of when a light wavelength is the 308 nm wavelength is indicated by a thin dotted line, and the result of the 532 nm wavelength is indicated by a thick solid line. Note that light having the 532 nm wavelength is a second harmonic of an Nd: YAG laser.

As shown in FIG. 23, the light absorptance of the single-crystal silicon layers with respect to light having the 308 nm wavelength is almost constant in the case where the film thickness of the single-crystal silicon layers is greater than or equal to 30 nm. On the other hand, it is found that the light absorptance of the single-crystal silicon layers with respect to light having the 532 nm wavelength periodically has a maximum value with respect to the film thickness of the single-crystal silicon layers. When a light wavelength is $\lambda$ (nm) and a refractive index of the single-crystal silicon layers is n, a film thickness d (nm) of the single-crystal silicon layer which shows a maximum value is an integral multiple of $\lambda/2n$. When a correction value is $\alpha$ in consideration of existence of a base film or a structure thereof, and an influence of a phase shift or the like due to the influence of an extinction coefficient of the single-crystal silicon layers, the film thickness d (nm) of a single-crystal silicon layer, light absorptance of which has the maximum value, can be expressed by $d=\lambda/2n\times m+\alpha$ (m=1, 2, 3, 4, ...). Note that m is a natural number greater than or equal to 1. Heat treatment by light irradiation can be performed efficiently even in a case of a single-crystal semiconductor layer such as single-crystal silicon having small absorptance with respect to the above-described light having a wavelength of 365 nm or more and 700 nm or less.

As described above, in the present invention, light irradiation is performed on a semiconductor layer, using light having a wavelength of 365 nm or more and 700 nm or less which reflects and resonates in the semiconductor layer and which can perform heat treatment, and a film thickness d (nm) of the semiconductor layer which is irradiated with the light is made to satisfy $d=\lambda/2n\times m\pm\alpha$ (nm), when a light wavelength is $\lambda$ (nm), a refractive index of the semiconductor layer is n, m is a natural number greater than or equal to 1 (m=1, 2, 3, 4, ...), and $0\leq\alpha\leq10$ is satisfied. By application of the present invention, the semiconductor layer can be irradiated with the light, which reflects and resonates in the semiconductor layer and which can perform heat treatment, under an optimum condition where the light absorptance of the semiconductor layer is high. Thus, damage to the semiconductor layer due to the ion irradiation step can be recovered enough, so that an SOI substrate having a semiconductor layer with reduced crystal defects can be manufactured.

A depth at which the embrittlement layer is formed in the semiconductor substrate is set so as to satisfy $\lambda/2n\times m\pm\alpha$ (m=1, 2, 3, 4, ... $0\leq\alpha\leq10$) (nm), so that the film thickness of the semiconductor layer provided over the support substrate which is irradiated with light can be controlled. Since the embrittlement layer is formed by ion irradiation, the depth may be controlled by an irradiation condition such as an accelerating voltage at the ion irradiation.

In addition, after the semiconductor layer is transferred over the support substrate, etching treatment or polishing treatment may be performed so that the film thickness d of the semiconductor layer satisfies $\lambda/2n\times m\pm\alpha$ (m=1, 2, 3, 4, ..., $0\leq\alpha\leq10$) (nm). When etching treatment or polishing treatment is performed, the surface of a semiconductor layer where there are many crystal defects can be removed, so that crystal defects in the semiconductor layer, after light irradiation is performed thereon, can be further reduced. Further, polishing treatment can planarize the semiconductor layer. Therefore, there is an advantageous effect that heat capacity of the semiconductor layer can be uniformed in the light irradiation step, and uniform crystals can be formed through a uniform heating and cooling process or a uniform melting and solidification process.

In addition, polishing treatment may be performed on the semiconductor layer after the above-described light irradiation. By polishing treatment which is performed after the light irradiation, unevenness on the surface of the semiconductor layer which can be caused due to the light irradiation can also be reduced, so that a semiconductor layer having much higher planarity can be obtained.

As the polishing treatment, a chemical mechanical polishing (CMP) method or a liquid jet polishing method can be used.

The light may be one having a wavelength of 365 nm or more and 700 nm or less (further preferably, a wavelength of 365 nm or more and 550 nm or less). Preferably, laser light can be used.

As for a laser which oscillates laser light, a continuous-wave laser, a pseudo-CW laser, or a pulsed laser can be used. A pulsed laser is preferable because the semiconductor layer is partially melted. For example, a gas laser such as an Ar laser or a Kr laser can be used. Alternatively, as a solid state laser, a YAG laser, a $YVO_4$ laser, a YLF laser, a $YAlO_3$ laser, a $GdVO_4$ laser, a KGW laser, a KYW laser, an Alexandrite laser, Ti: sapphire laser, a $Y_2O_3$ laser, or the like can be used. In the solid state lasers such as a YAG laser, there are lasers which serve as a CW laser, a pseudo-CW laser, or a pulsed laser. Note that in the solid state laser, any of the second harmonic to the third harmonic of a fundamental wave is preferably used. Alternatively, a semiconductor laser such as a GaN laser, a GaAs laser, a GaAlAs laser, or an InGaAsP laser can be used. The solid state laser has an advantage in that productivity is excellent, oscillation output is stable, a frequency of maintenance is reduced, and operational costs are inexpensive.

In boding the semiconductor layer to the support substrate, a silicon oxide film which is deposited using organic silane as a raw material is preferably formed on either one or both of the sides where a bond is formed, as an insulating layer having a bonding surface. Examples of organic silane gas include silicon-containing compounds, such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). That is, in the structure where the semiconductor layer is bonded to the support substrate, a layer which has a smooth surface and forms a hydrophilic surface is provided as a bonding surface.

Note that a chemical vapor deposition (CVD) method in this specification is to include a plasma CVD method, a thermal CVD method, and a photo CVD method in its category.

Alternatively, the silicon oxide film which serves as an insulating layer can be formed by a chemical vapor deposition method, using monosilane, disilane, or trisilane as a raw material. The silicon oxide film which serves as an insulating layer may be a thermal oxide film, and it is preferable to contain chlorine.

The semiconductor layer bonded to the support substrate is obtained by being separated at the embrittlement layer which is formed in the semiconductor substrate to be separated. The embrittlement layer can be formed by ion irradiation performed with halogen typified by helium or fluorine. In this case, the irradiation may be performed with one or a plurality of ions of the same atom, in which the mass are different. In the case of hydrogen ion irradiation, it is preferable to contain $H^+$, $H_2^+$, and $H_3^+$ ions and further to contain $H_3^+$ ions at a high proportion.

As a blocking layer (also referred to as a barrier layer), a silicon nitride film or a silicon nitride oxide film for preventing diffusion of an impurity element may be provided to the support substrate. Further, a silicon oxynitride film may be combined as an insulating film which has the action of relieving the stress.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 atomic %, 0.5 to 15 atomic %, 25 to 35 atomic %, and 0.1 to 10 atomic %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 to 30 atomic %, 20 to 55 atomic %, 25 to 35 atomic %, and 10 to 30 atomic %, respectively. Note that percentages of nitrogen, oxygen, silicon, and hydrogen fall within the ranges given above, where the total number of atoms contained in the silicon oxynitride film or the silicon nitride oxide film is defined as 100 atomic %.

In addition, a protective layer may be formed between the semiconductor substrate and the insulating layer having a bonding surface. The protective layer can be formed of a single layer selected from a silicon nitride layer, a silicon oxide layer, a silicon nitride oxide layer, or a silicon oxynitride layer, or a stacked layer structure of a plurality of the layers. These layers can be formed over the semiconductor substrate before the embrittlement layer is formed in the semiconductor substrate. Alternatively, these layers may be formed over the semiconductor substrate after the embrittlement layer is formed in the semiconductor substrate.

One mode of a method for manufacturing an SOI substrate of the present invention includes the steps of: performing ion irradiation on one surface of a single-crystal semiconductor substrate to form an embrittlement layer at a predetermined depth from one surface of the single-crystal semiconductor substrate; forming an insulating layer either over one surface of the single-crystal semiconductor substrate or over a support substrate; generating a crack in the embrittlement layer with the single-crystal semiconductor substrate and the support substrate overlapped with each other, with the insulating layer interposed therebetween, to perform heat treatment for separating the single-crystal semiconductor substrate at the embrittlement layer; forming a semiconductor layer over the support substrate from the single-crystal semiconductor substrate; and irradiating the semiconductor layer with light having a wavelength λ of 365 nm or more and 700 nm or less from the semiconductor layer side, where a film thickness d of the semiconductor layer irradiated with the light satisfies $d=\lambda/2n \times m \pm \alpha$ (nm) when a wavelength of the light is λ (nm), a refractive index of the semiconductor layer is n, m is a natural number greater than or equal to 1, and $0 \leq \alpha \leq 10$ is satisfied.

Another mode of a method for manufacturing an SOI substrate of the present invention includes the steps of: forming an insulating layer over one surface of a single-crystal semiconductor substrate; performing ion irradiation on the single-crystal semiconductor substrate through the insulating layer which is formed over one surface of the single-crystal semiconductor substrate to form an embrittlement layer at a predetermined depth from one surface of the single-crystal semiconductor substrate; generating a crack in the embrittlement layer with the single-crystal semiconductor substrate and a support substrate overlapped with each other, with the insulating layer interposed therebetween, to perform heat treatment for separating the single-crystal semiconductor substrate at the embrittlement layer; forming a semiconductor layer over the support substrate from the single-crystal semiconductor substrate; and irradiating the semiconductor layer with light having a wavelength λ of 365 nm or more and 700 nm or less from the semiconductor layer side, where a film thickness d of the semiconductor layer irradiated with the light satisfies $d=\lambda/2n \times m \pm \alpha$ (nm) when a wavelength of the light is λ (nm), a refractive index of the semiconductor layer is n, m is a natural number greater than or equal to 1, and $0 \leq \alpha \leq 10$ is satisfied.

Another mode of a method for manufacturing an SOI substrate of the present invention includes the steps of: performing ion irradiation on one surface of a single-crystal semiconductor substrate to form an embrittlement layer at a predetermined depth from one surface of the single-crystal semiconductor substrate; forming an insulating layer either over one surface of the single-crystal semiconductor substrate or over a support substrate; generating a crack in the embrittlement layer with the single-crystal semiconductor substrate and the support substrate overlapped with each other, with the insulating layer interposed therebetween, to perform heat treatment for separating the single-crystal semiconductor substrate at the embrittlement layer; forming a semiconductor layer over the support substrate from the single-crystal semiconductor substrate; performing etching treatment on the surface of the semiconductor layer; and irradiating the semiconductor layer on which etching treatment is performed with light having a wavelength $\lambda$ of 365 nm or more and 700 nm or less from the side of the semiconductor layer on which etching treatment is performed, where a film thickness d of the semiconductor layer irradiated with the light satisfies $d=\lambda/2n\times m\pm\alpha$ (nm) when a wavelength of the light is $\lambda$ (nm), a refractive index of the semiconductor layer is n, m is a natural number greater than or equal to 1, and $0\leq\alpha\leq10$ is satisfied.

Another mode of a method for manufacturing an SOI substrate of the present invention includes the steps of: forming an insulating layer over one surface of a single-crystal semiconductor substrate; performing ion irradiation on the single-crystal semiconductor substrate through the insulating layer which is formed over one surface of the single-crystal semiconductor substrate to form an embrittlement layer at a predetermined depth from one surface of the single-crystal semiconductor substrate; generating a crack in the embrittlement layer with the single-crystal semiconductor substrate and a support substrate overlapped with each other, with the insulating layer interposed therebetween, to perform heat treatment for separating the single-crystal semiconductor substrate at the embrittlement layer; forming a semiconductor layer over the support substrate from the single-crystal semiconductor substrate; performing etching treatment on the surface of the semiconductor layer; and irradiating the semiconductor layer on which etching treatment is performed with light having a wavelength $\lambda$ of 365 nm or more and 700 nm or less from the semiconductor layer side on which etching treatment is performed, where a film thickness d of the semiconductor layer irradiated with the light satisfies $d=\lambda/2n\times m\pm\alpha$ (nm) when a wavelength of the light is $\lambda$ (nm), a refractive index of the semiconductor layer is n, m is a natural number greater than or equal to 1, and $0\leq\alpha\leq10$ is satisfied.

Another mode of a method for manufacturing an SOI substrate of the present invention includes the steps of: performing ion irradiation on one surface of a single-crystal semiconductor substrate to form an embrittlement layer at a predetermined depth from one surface of the single-crystal semiconductor substrate; forming an insulating layer either over one surface of the single-crystal semiconductor substrate or over a support substrate; generating a crack in the embrittlement layer with the single-crystal semiconductor substrate and the support substrate overlapped with each other, with the insulating layer interposed therebetween, to perform heat treatment for separating the single-crystal semiconductor substrate at the embrittlement layer; forming a semiconductor layer over the support substrate from the single-crystal semiconductor substrate; performing polishing treatment on the surface of the semiconductor layer; and irradiating the semiconductor layer on which polishing treatment is performed with light having a wavelength $\lambda$ of 365 nm or more and 700 nm or less from the side of the semiconductor layer on which polishing treatment is performed, wherein a film thickness d of the semiconductor layer irradiated with the light satisfies $d=\lambda/2n\times m\pm\alpha$ (nm) when a wavelength of the light is $\lambda$ (nm), a refractive index of the semiconductor layer is n, m is a natural number greater than or equal to 1, and $0\leq\alpha\leq10$ is satisfied.

Another mode of a method for manufacturing an SOI substrate of the present invention includes the steps of: forming an insulating layer over one surface of a single-crystal semiconductor substrate; performing ion irradiation on the single-crystal semiconductor substrate through the insulating layer which is formed over one surface of the single-crystal semiconductor substrate to form an embrittlement layer at a predetermined depth from one surface of the single-crystal semiconductor substrate; generating a crack in the embrittlement layer with the single-crystal semiconductor substrate and a support substrate overlapped with each other, with the insulating layer interposed therebetween, to perform heat treatment for separating the single-crystal semiconductor substrate at the embrittlement layer; forming a semiconductor layer over the support substrate from the single-crystal semiconductor substrate; performing polishing treatment on the surface of the semiconductor layer; and irradiating the semiconductor layer on which polishing treatment is performed with light having a wavelength $\lambda$ of 365 nm or more and 700 nm or less from the side of the semiconductor layer on which polishing treatment is performed, where a film thickness d of the semiconductor layer irradiated with the light satisfies $d=\lambda/2n\times m\pm\alpha$ (nm) when a wavelength of the light is $\lambda$ (nm), a refractive index of the semiconductor layer is n, m is a natural number greater than or equal to 1, and $0\leq\alpha\leq10$ is satisfied.

With the use of a semiconductor layer which is formed in any of the above-described methods for manufacturing an SOI substrate, a semiconductor element can be formed, and a display element electrically connected to the semiconductor element can be formed.

Note that in the present invention, a semiconductor device refers to a device which can function by utilizing the semiconductor characteristics. By application of the present invention, a device which includes a circuit having semiconductor elements (such as transistors, memory elements, or diodes) or a semiconductor device such as a chip having a processor circuit can be manufactured.

The present invention can also be used for a semiconductor device (also referred to as a display device) which is a device having a display function. As a semiconductor device using the present invention, a semiconductor device in which a light-emitting element including a layer containing an organic material, an inorganic material, or a mixture of an organic material and an inorganic material which produces light emission called electroluminescence (hereinafter also referred to as EL) between electrodes is connected to a TFT (light-emitting display device), a semiconductor device using a liquid crystal element containing a liquid crystal material, as a display element (liquid crystal display device), and the like can be given. In this specification, a display device refers to a device having a display element, and a display device also includes a main body of a display panel in which a plurality of pixels including display elements and a peripheral driver circuits for driving the pixels are formed over a substrate. Further, a display device may include the one provided with a flexible printed circuit (FPC) or a printed wiring board (PWB) (an IC, a resistor, a capacitor, an inductor, a transistor, or the like). Moreover, a display device may include an optical sheet such as a polarizing plate or a retardation film. In addition, a backlight (such as a light guide plate, a prism sheet, a diffusion sheet, a reflection sheet, or a light source (an LED, a cold-cathode tube, or the like)) may be included.

Note that a display element and a semiconductor device can be in various modes and can include various elements. For example, a display medium in which contrast is changed by an electromagnetic effect can be used, such as an EL element (for example, an organic EL element, an inorganic EL element, or an EL element containing an organic material and an inorganic material), an electron emitter, a liquid crystal element, an electron ink, a grating light valve (GLV), a plasma display (PDP), a digital micromirror device (DMD), a piezo-electric ceramic display, or a carbon nanotube. Note that a semiconductor device using an EL element may be an EL display; a semiconductor device using an electron emitter may be a field emission display (FED), an SED (Surface-conduction Electron-emitter Display) type flat panel display, or the like; a semiconductor device using a liquid crystal element may be a liquid crystal display, a transmissive liquid crystal display, a semi-transmissive liquid crystal display, or a reflective liquid crystal display; and a semiconductor device using an electron ink may be electronic paper.

Even in the case where a substrate having a low allowable temperature limit such as a glass substrate is used, an SOI substrate having a semiconductor layer with reduced crystal defects which is sufficient for practical use can be manufactured by preferable light irradiation treatment which is excellent in productivity.

A high-performance semiconductor device including various semiconductor elements, memory elements, integrated circuits, and the like can be manufactured with high yield, using the semiconductor layer provided in such an SOI substrate.

DETAILED DESCRIPTION OF THE INVENTION

Embodiment Mode

Figure 1A:
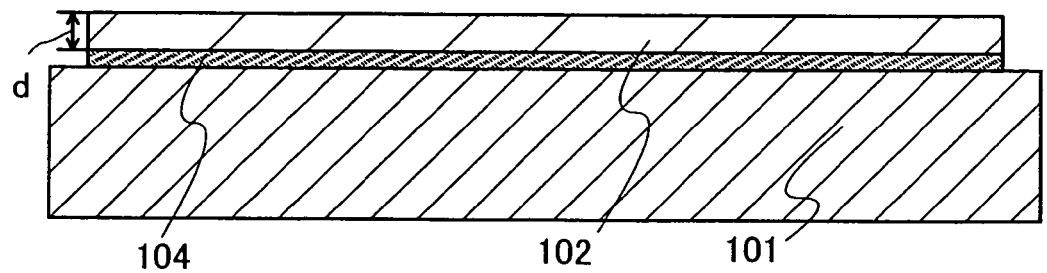
FIGS. 1A and 1B are views showing a manufacturing method of an SOI substrate of the present invention.
Figure 1B:
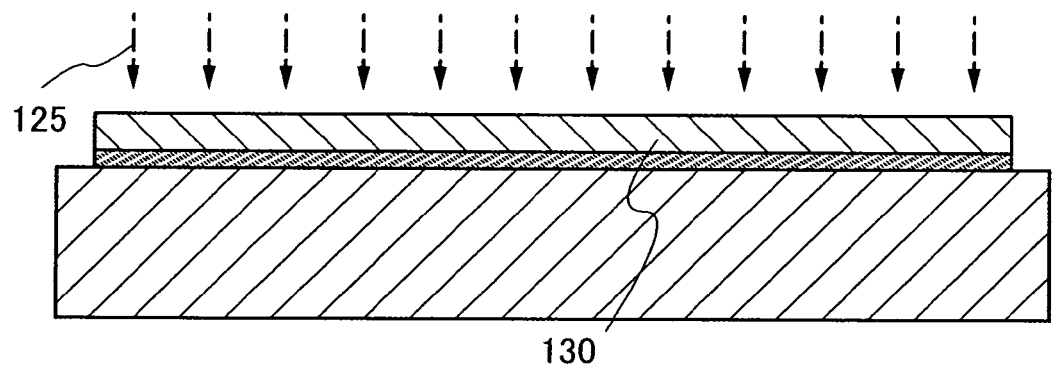

Embodiment modes and an embodiment of the present invention will be hereinafter described with reference to the drawings. However, the present invention is not limited to descriptions below, and it is easily understood by those skilled in the art that modes and details can be modified in various ways without departing from the purpose and the scope of the present invention. Therefore, the present invention should not be interpreted as being limited to the description of the embodiment modes and an embodiment below. Note that reference numerals denoting the identical portions are the same in all figures, and description thereof will not be repeated.

Embodiment Mode 1

This embodiment mode will describe a manufacturing method of a semiconductor device of the present invention with reference to FIGS. 1A and 1B, FIGS. 2A to 2C, FIGS. 3A to 3D, and FIGS. 4A to 4C.

In this embodiment mode, a semiconductor layer, which is separated from a semiconductor substrate and bonded to a support substrate having an insulating surface, is irradiated with light. A single-crystal semiconductor substrate is preferably used as the semiconductor substrate, and a single-crystal semiconductor layer is preferably formed as the semiconductor layer which is separated from the semiconductor substrate and bonded to the support substrate.

By light irradiation, at least part of a region of a semiconductor layer can be melted to reduce crystal defects in the semiconductor layer. Since light irradiation treatment is employed and increase in temperature of a support substrate can be suppressed, a substrate having a low allowable temperature limit such as a glass substrate can be used as the support substrate.

In the present invention, as light irradiation treatment performed on a semiconductor layer, light having a wavelength of 365 nm or more and 700 nm or less which reflects and resonates in the semiconductor layer and which can perform heat treatment is used. As for the light having a wavelength of 365 nm or more and 700 nm or less in a so-called visible region, laser light can be used which is oscillated from a solid state laser oscillator excellent in productivity.

First, a method of forming a semiconductor layer from a semiconductor substrate over a support substrate which is a substrate having an insulating surface is described with reference to FIGS. 3A to 3D and FIGS. 4A to 4C.

Figure 3A:
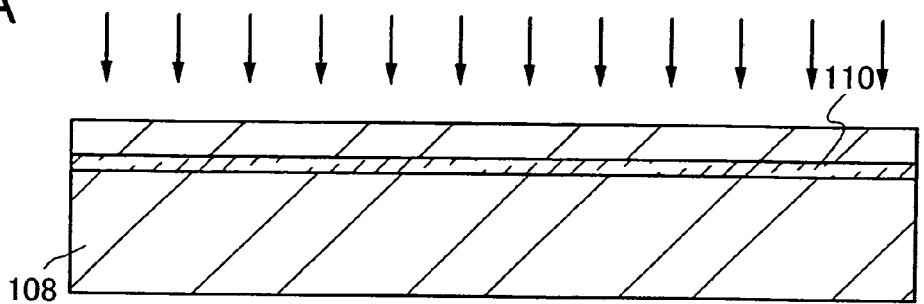
FIGS. 3A to 3D are views showing a manufacturing method of an SOI substrate of the present invention.

A semiconductor substrate 108 shown in FIG. 3A is cleaned, and the semiconductor substrate 108 is irradiated with ions accelerated by an electric field from the surface to form an embrittlement layer 110 at a predetermined depth. The ion irradiation is performed in consideration of the film thickness of a semiconductor layer to be transferred to a support substrate. An accelerating voltage in irradiating the semiconductor substrate 108 with ions is set in consideration of such a film thickness.

In the present invention, irradiation treatment is performed on a semiconductor layer which is transferred over a support substrate with light having a wavelength of 365 nm or more and 700 nm or less to reduce crystal defects of the semiconductor layer. In order to improve efficiency of the above-described light irradiation treatment, a film thickness d of the semiconductor layer irradiated with light is controlled so as to satisfy $d=\lambda/2n \times m \pm \alpha$ (nm) when a wavelength of the light is $\lambda$ (nm), a refractive index of the semiconductor layer is n, m is a natural number greater than or equal to 1 (m=1, 2, 3, 4, ...), and $0 \leq \alpha \leq 10$ is satisfied.

The film thickness of a semiconductor layer can be controlled by a depth at which an embrittlement layer is formed from a surface of a semiconductor substrate irradiated with ions. Since the embrittlement layer is formed by ion irradiation, an ion irradiation condition (for example, ion species or an accelerating voltage) may be set, as appropriate, so that the depth at which an embrittlement layer is formed from a surface of a semiconductor substrate satisfies the above-described film thickness d.

In addition, after the semiconductor layer is transferred over the support substrate, before light irradiation, the film thickness of the semiconductor layer may be controlled by etching treatment or polishing treatment and adjusted so that the film thickness d satisfies $d=\lambda/2n \times m \pm \alpha$ (nm) when a wavelength of the light is $\lambda$ (nm), a refractive index of the semiconductor layer is n, m is a natural number greater than or equal to 1 (m=1, 2, 3, 4, ...), and $0 \leq \alpha \leq 10$ is satisfied.

As the semiconductor substrate 108, a semiconductor substrate such as a silicon substrate or a germanium substrate, or a compound semiconductor substrate such as a gallium arsenide substrate or an indium phosphide substrate is used. It is preferable that a single-crystal semiconductor substrate be used as the semiconductor substrate 108, but a polycrystalline semiconductor substrate may also be used. A semiconductor layer obtained over a support substrate can be determined by selecting a semiconductor substrate to serve as a base.

In this embodiment mode, an ion irradiation separation method is employed in which a semiconductor substrate is irradiated with hydrogen, helium, or fluorine ions at a predetermined depth, heat treatment is then performed, and a semiconductor layer, which is an outer layer, is separated. Alternatively, a method in which single-crystal silicon is epitaxially grown over porous silicon and then the porous silicon layer is separated by water jetting may be employed.

For example, a single-crystal silicon substrate is used as the semiconductor substrate 108, the surface thereof is processed with dilute hydrofluoric acid, a natural oxide film is removed and a contaminant such as dust which is attached to the surface is also removed, and the surface of the semiconductor substrate 108 is cleaned.

The embrittlement layer 110 may be formed by irradiation with ions by an ion doping method or an ion implantation method. The embrittlement layer 110 is formed by irradiation with ions of hydrogen, helium, or a halogen typified by fluorine. When irradiation is performed using fluorine ions as a halogen element, $BF_3$ may be used as a source gas. Note that an ion implantation method is a method in which ionized gas is mass separated and a semiconductor is irradiated with the ionized gas.

When the single-crystal silicon substrate is irradiated with halogen ions such as fluorine ions by an ion irradiation method, fluorine which is added knocks out (expels) silicon atoms in silicon crystal lattice, so that blank portions are created effectively and microvoids are made in the embrittlement layer. In this case, the volume change of microvoids formed in the embrittlement layer occurs by heat treatment at a relatively low temperature, and a thin single-crystal semiconductor layer can be formed by separation along the embrittlement layer. The irradiation with fluorine ions is performed, and then irradiation with hydrogen ions may be performed, so that hydrogen may be contained in the void. Since the embrittlement layer which is formed to separate the thin semiconductor layer from the semiconductor substrate is separated using the volume change of microvoids formed in the embrittlement layer, it is preferable to make such effective use of fluorine ion action or hydrogen ion action.

In addition, irradiation may be performed using one or a plurality of ions of the same atom, in which the mass are different. For example, in the case of hydrogen ion irradiation, it is preferable to contain $H^+$, $H_2^+$, and $H_3^+$ ions and further to contain $H_3^+$ ions at a high proportion. In the case of hydrogen ion irradiation, the irradiation efficiency can be increased and the irradiation time can be shortened when $H^+$, $H_2^+$, and $H_3^+$ ions are contained and further $H_3^+$ ions are contained at a high proportion. With such a structure, separation can be performed easily.

It is necessary to perform irradiation with ions under high dose conditions in the formation of the embrittlement layer, and the surface of the semiconductor substrate 108 becomes rough in some cases. Therefore, a protective layer against the ion irradiation, such as a silicon nitride film, a silicon nitride oxide film, or a silicon oxide film may be provided with a film thickness of 50 to 200 nm on the surface which is irradiated with ions. In forming the protective layer, the ion irradiation condition such as an accelerating voltage may be set in consideration of the film thickness of the protective layer to control the depth at which the embrittlement layer is formed in the semiconductor substrate.

For example, a stacked layer of a silicon oxynitride film (a film thickness of 5 to 300 nm, preferably 30 to 150 nm (e.g., 50 nm)) and a silicon nitride oxide film (a film thickness of 5 to 150 nm, preferably 10 to 100 nm (e.g., 50 nm)) is formed by a plasma CVD method as the protective layer over the semiconductor substrate 108. As an example, a silicon oxynitride film is formed with a film thickness of 50 nm over the semiconductor substrate 108, and a silicon nitride oxide film is formed with a thickness of 50 nm over the silicon oxynitride film to be stacked. A silicon oxynitride film may be a silicon oxide film formed by a chemical vapor deposition method, using an organic silane gas.

Alternatively, the semiconductor substrate 108 may be degreased and washed, an oxide film of the surface may be removed, and thermal oxidation may be performed. Although normal dry oxidation for thermal oxidation may be performed, it is preferable to perform oxidation in an oxidative atmosphere to which halogen is added. For example, heat treatment is performed at a temperature of 700° C. or more in an atmosphere which contains HCl at 0.5 to 10% by volume (preferably 3% by volume) with respect to oxygen. Preferably, thermal oxidation is performed at a temperature of 950 to 1100° C. Processing time may be set at 0.1 to 6 hours, preferably 0.5 to 1 hour. An oxide film to be formed has a thickness of 10 to 1000 nm (preferably 50 to 200 nm), for example, 100 nm.

Instead of HCl, one or more selected from HF, $NF_3$, HBr, $Cl_2$, $ClF_3$, $BCl_3$, $F_2$, $Br_2$, or the like can be used as a substance containing a halogen.

Heat treatment is performed in such a temperature range, so that a gettering effect can be obtained by a halogen element. The gettering has an advantageous effect of removing a metal impurity, in particular. That is, by the action of chlorine, an impurity such as metal turns into volatile chloride, and then moved into the air and removed. It has an advantageous effect on the case where the surface of the semiconductor substrate 108 is subjected to a chemical mechanical polishing (CMP) treatment. In addition, hydrogen has action of compensating a defect at the interface between the semiconductor substrate 108 and the oxide film to be formed so as to lower a localized-level density at the interface, whereby the interface between the semiconductor substrate 108 and the oxide film is inactivated to stabilize electric characteristics.

A halogen can be contained in the oxide film which is formed by heat treatment. A halogen element is contained at a concentration of $1 \times 10^{17}$ to $5 \times 10^{20}/cm^3$, whereby the oxide film can function as a protective layer which captures an impurity such as metal and prevents contamination of the semiconductor substrate 108.

When the embrittlement layer 110 is formed, an accelerating voltage and the number of total ions can be adjusted in accordance with the thickness of a film deposited over the semiconductor substrate, the thickness of the targeted semiconductor layer which is separated from the semiconductor substrate and transferred to a support substrate, and ion species which are used for irradiation.

An example of forming the embrittlement layer is shown. For example, a hydrogen gas is used for a raw material, and irradiation with ions is performed at an accelerating voltage of 40 kV with the total ion number of $2 \times 10^{16}$ ions/$cm^2$ by an ion doping method, so that the embrittlement layer can be formed. If the protective layer is made to be thick, when irradiation with ions is performed under the same condition and the embrittlement layer is formed, a thin semiconductor layer can be formed as a targeted semiconductor layer which is separated from the semiconductor substrate and transferred to the support substrate. For example, although it depends on the proportion of ion species ($H^+$, $H_2^+$, and $H_3^+$ ions), in the case where the embrittlement layer is formed under the above conditions and a silicon oxynitride film (film thickness: 50 nm) and a silicon nitride oxide film (film thickness: 50 nm) are stacked as a protective layer over the semiconductor substrate, the film thickness of the semiconductor layer to be transferred to the support substrate is approximately 120 nm; or in the case where a silicon oxynitride film (film thickness: 100 nm) and a silicon nitride oxide film (film thickness: 50 nm) are stacked as a protective layer over the semiconductor substrate under the above conditions, the film thickness of the semiconductor layer to be transferred to the support substrate is approximately 70 nm. In this manner, the film thickness of the semiconductor layer to be transferred over the support substrate can be controlled.

When helium (He) or hydrogen is used for a source gas, irradiation is performed with an accelerating voltage in the range of 10 kV to 200 kV with a dose in the range of $1 \times 10^{16}$ to $6 \times 10^{16}$ ions/$cm^2$, so that the embrittlement layer can be formed. When helium is used for a source gas, $He^+$ ions can be used as main ions for irradiation even when mass separation is not performed. In addition, when hydrogen is used for a source gas, $H_3^+$ and $H_2^+$ ions can be used as main ions for irradiation. Ion species change depending on a plasma generation method, a pressure, the supply quantity of a source gas, or an accelerating voltage.

As an example of forming the embrittlement layer, a silicon oxynitride film (film thickness: 50 nm), a silicon nitride oxide film (film thickness: 50 nm), and a silicon oxide film (film thickness: 50 nm) are stacked as a protective layer over the semiconductor substrate, irradiation with hydrogen is performed at an accelerating voltage of 40 kV with a dose of $2 \times 10^{16}$ ions/$cm^2$, and the embrittlement layer is formed in the semiconductor substrate. Then, a silicon oxide film (film thickness: 50 nm) is formed as an insulating layer having a bonding surface over the silicon oxide film, which is an uppermost layer of the protective layer. As another example of forming the embrittlement layer, a silicon oxide film (film thickness: 100 nm) and a silicon nitride oxide film (film thickness: 50 nm) are stacked as a protective layer over the semiconductor substrate, and irradiation with hydrogen is performed at an accelerating voltage of 40 kV with a dose of $2 \times 10^{16}$ ions/$cm^2$, and the embrittlement layer is formed in the semiconductor substrate. Then, a silicon oxide film (film thickness: 50 nm) is formed as an insulating layer over the silicon nitride oxide film, which is an uppermost layer of the protective layer. Note that the silicon oxynitride film and the silicon nitride oxide film may be formed by a plasma CVD method, and the silicon oxide film may be formed by a CVD method, using an organic silane gas.

Figure 3B:
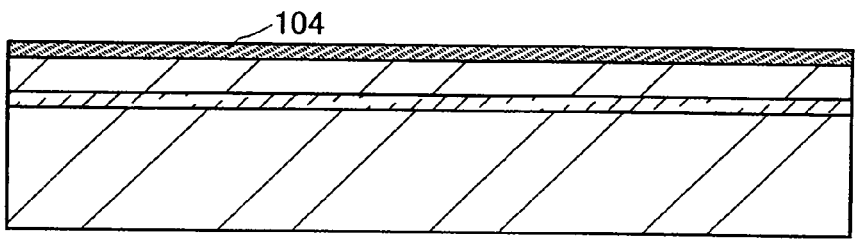

Next, as shown in FIG. 3B, a silicon oxide film is formed as an insulating layer 104 on the surface which forms a bond to the support substrate. It is preferable to use a silicon oxide film formed by a chemical vapor deposition method, using an organic silane gas as the silicon oxide film. Alternatively, a silicon oxide film formed by a chemical vapor deposition method, using a silane gas, can be used. In film formation by a chemical vapor deposition method, a film formation temperature of, for example, 350° C. or less (a specific example is 300° C.) is applied as the temperature at which degasification does not occur from the embrittlement layer 110, which is formed in the single-crystal semiconductor substrate. In addition, heat treatment temperature which is higher than the film formation temperature is applied for heat treatment by which the single-crystal semiconductor layer or a polycrystalline semiconductor layer is separated from a single-crystal semiconductor substrate or a polycrystalline semiconductor substrate.

The insulating layer 104 forms a smooth surface and has a hydrophilic surface. A silicon oxide film is suitable for the insulating layer 104. In particular, a silicon oxide film formed by a chemical vapor deposition method, using an organic silane gas, is preferable. Examples of organic silane gas which can be used include silicon-containing compounds, such as tetraethyl orthosilicate (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). Note that in the case where a silicon oxide layer is formed by a chemical vapor deposition method, using organic silane as a source gas, it is preferable to mix a gas which provides oxygen. As a gas which provides oxygen, oxygen, nitrous oxide, nitrogen dioxide, or the like can be used. Further, an inert gas such as argon, helium, nitrogen, or hydrogen may be mixed. Alternatively, as the insulating layer 104, a silicon oxide layer formed by a chemical vapor deposition method, using silane such as monosilane, disilane, or trisilane as a source gas, can be used. Also in this case, it is preferable to mix a gas which provides oxygen, an inert gas, or the like. In film formation by a chemical vapor deposition method, a film formation temperature of, for example, 350° C. or less is applied as the temperature at which degasification does not occur from the embrittlement layer 110, which is formed in the semiconductor substrate 108. In addition, heat treatment temperature which is higher than the film formation temperature is applied for heat treatment by which a semiconductor layer is separated from a single-crystal semiconductor substrate or a polycrystalline semiconductor substrate. Note that a chemical vapor deposition method includes a plasma CVD method, a thermal CVD method, and a photo CVD method in its category.

In addition, as the insulating layer 104, silicon oxide formed by heat treatment under an oxidative atmosphere, silicon oxide which grows by reaction of an oxygen radical, chemical oxide formed using an oxidative chemical solution, or the like can be used. As the insulating layer 104, an insulating layer including a siloxane (Si—O—Si) bond may be used. Alternatively, the organic silane gas may be reacted with an oxygen radical or a nitrogen radical to form the insulating layer 104.

The insulating layer 104 which forms a smooth surface and has a hydrophilic surface is provided with a thickness of 5 to 500 nm, preferably 10 to 200 nm. With such a thickness, it is possible to smooth the roughness of a surface on which the insulating layer 104 is formed and also to ensure smoothness of a surface of the insulating layer 104. In addition, the insulating layer 104 is provided, so that distortion between the support substrate and the insulating layer 104 which are bonded to each other can be eased. The surface of the insulating layer 104 is preferably set as follows: preferably, arithmetic mean roughness $R_a$ is less than 0.8 nm and root-mean-square roughness $R_{ms}$ is less than 0.9 nm; more preferably $R_a$ is less than or equal to 0.4 nm and $R_{ms}$ is less than or equal to 0.5 nm; and still preferably $R_a$ is less than or equal to 0.3 nm and $R_{ms}$ is less than or equal to 0.4 nm. For example, $R_a$ is 0.27 nm and $R_{ms}$ is 0.34 nm. In this specification, $R_a$ is arithmetic mean roughness, $R_{ms}$ is root-mean-square roughness, and the measurement range is 2 or 10 µm².

A silicon oxide film which is similar to the insulating layer 104 may also be provided for a support substrate 101. That is, when a semiconductor layer 102 is bonded to the support substrate 101, a strong bond can be formed by preferably providing the insulating layer 104 which is formed of a silicon oxide film deposited using organic silane as a raw material for one surface or both surfaces which form a bond.

Figure 3C:
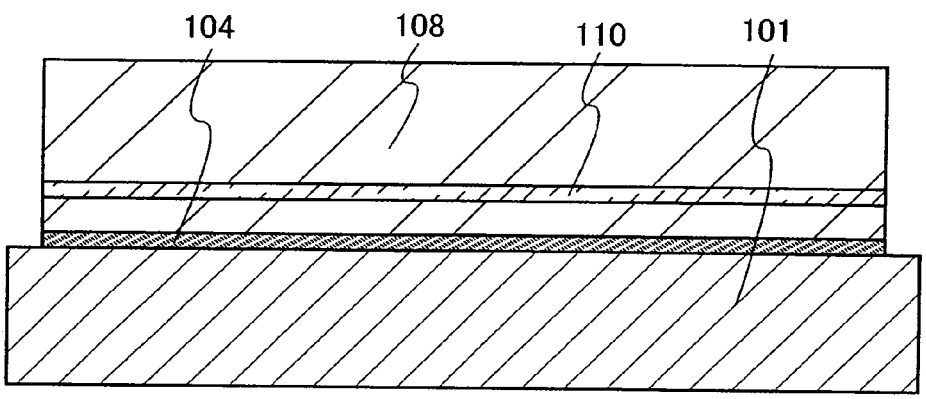

In FIG. 3C, a mode is shown in which the support substrate 101 and the surface of the insulating layer 104, which is formed over the semiconductor substrate 108, are disposed in close contact with each other and bonded. Surfaces which are to form a bond are cleaned sufficiently. The surfaces of the support substrate 101 and the insulating layer 104 of the semiconductor substrate 108 may be cleaned by megasonic cleaning or the like. In addition, the surfaces may be cleaned with ozone water after the megasonic cleaning, an organic substance may be removed, and the hydrophilicity of the surfaces may be improved.

In the case where a glass substrate which is used in the electronics industry, such as an aluminosilicate glass substrate, an aluminoborosilicate glass substrate, or a barium borosilicate glass substrate, is used as the support substrate 101, alkali metal such as sodium is contained in a very small amount in a glass substrate, and a very small number of impurities may adversely affect the characteristics of semiconductor elements such as transistors. The silicon nitride oxide film has an advantageous effect of preventing such an impurity like a metal impurity contained in the support substrate 101 from diffusing into the semiconductor substrate side. Note that instead of the silicon nitride oxide film, a silicon nitride film may be formed. A stress relaxation layer such as a silicon oxynitride film or a silicon oxide film may be provided between the semiconductor substrate and the silicon nitride oxide film. When a stacked layer structure of the silicon nitride oxide film and the silicon oxynitride film is provided, an impurity can be prevented from diffusing into the semiconductor substrate and stress distortion can be reduced.

By making the support substrate 101 and the insulating layer 104 face each other and pressing one part thereof from the outside, the support substrate 101 and the insulating layer 104 attract each other by increase in van der Waals forces or influence of hydrogen bonds due to local reduction in distance between the bonding surfaces. Further, since the distance between the support substrate 101 and the insulating layer 104 in an adjacent region, which also face each other, is reduced, a region in which van der Waals forces strongly act or a region which is influenced by hydrogen bonds is widened. Accordingly, bonding proceeds and spreads to the entire bonding surfaces. For example, a pressure of 100 to 5000 kPa may be applied in pressing.

The surfaces may be activated so as to form a favorable bond. For example, surfaces where a bond is formed are irradiated with an atomic beam or an ion beam. When an atomic beam or an ion beam is used, an inert gas neutral atom beam or an inert gas ion beam of argon or the like can be used. In addition, plasma irradiation or radical treatment is performed. By such surface treatment, a bond between different kinds of materials is easily formed even at a temperature of 200 to 400° C.

In order to improve the bonding strength of a bond interface between the support substrate and the insulating layer, heat treatment is preferably performed. For example, heat treatment is performed under a temperature condition of 70 to 350° C. (e.g., at 200° C. for 2 hours) in an oven, a furnace, or the like.

Figure 3D:
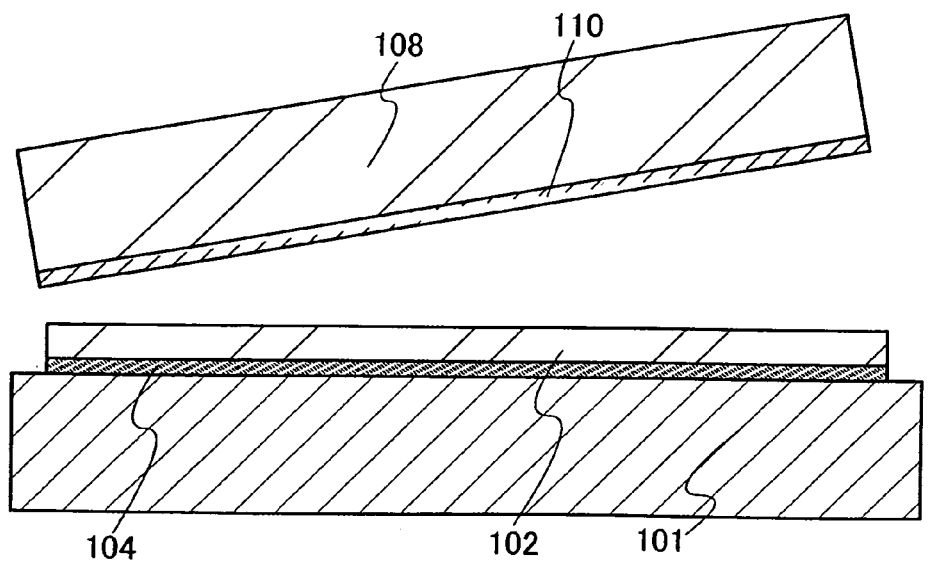

In FIG. 3D, after the support substrate 101 and the semiconductor substrate 108 are attached to each other, heat treatment is performed, and the semiconductor substrate 108 is separated from the support substrate 101 with the embrittlement layer 110 serving as a separation plane. When heat treatment is performed at, for example, 400 to 700° C., the volume change of microvoids formed in the embrittlement layer 110 occurs, which enables the semiconductor substrate 108 to separate along the embrittlement layer 110. Since the insulating layer 104 is bonded to the support substrate 101, the semiconductor layer 102 having the same crystallinity as the semiconductor substrate 108 remains over the support substrate 101. Note that FIG. 3D shows an example in which the semiconductor substrate 108 is separated so that the embrittlement layer 110 remains on the semiconductor substrate 108 side; however, the present invention is not limited thereto. The semiconductor substrate 108 may be separated so that the embrittlement layer 110 remains on the support substrate 101 side, or the semiconductor substrate 108 may be separated so that the embrittlement layer 110 partially remains on each of the semiconductor substrate 108 and the support substrate 101.

Heat treatment in a temperature range of 400 to 700° C. may be continuously performed with the same device as the above heat treatment for improving the bonding strength or with another device. For example, after heat treatment in a furnace at 200° C. for 2 hours, a temperature is increased to approximately 600° C. and is held for 2 hours, the temperature is decreased to a temperature ranging from 400° C. to a room temperature, and then the substrate is taken out of the furnace. Alternatively, heat treatment may be performed with a temperature increasing from a room temperature. Further, after heat treatment may be performed in a furnace at 200° C. for 2 hours, heat treatment may be performed in a temperature range of 600 to 700° C. with a rapid thermal annealing (RTA) device for 1 to 30 minutes (e.g., at 600° C. for 7 minutes, or at 650° C. for 7 minutes).

By heat treatment in a temperature range of 400 to 700° C., bonding between the insulating layer 104 and the support substrate 101 shifts from hydrogen bonds to covalent bonds, and an element added to the embrittlement layer 110 precipitates and pressure rises, whereby the semiconductor layer can be separated from the semiconductor substrate 108. After the heat treatment, the support substrate 101 and the semiconductor substrate 108 are in a state where one of the support substrate 101 and the semiconductor substrate 108 is provided over the other, and the support substrate 101 and the semiconductor substrate 108 can be separated from each other without application of large force. For example, a substrate provided over the other is lifted by a vacuum chuck, so that the substrate can be easily separated. At this time, if a substrate on a lower side is fixed with a vacuum chuck or a mechanical chuck, both the support substrate 101 and the semiconductor substrate 108 can be separated from each other without horizontal misalignment.

Note that in FIGS. 1A and 1B, FIGS. 2A to 2C, FIGS. 3A to 3D, and FIGS. 4A to 4C, an example is shown in which the semiconductor substrate 108 is smaller than the support substrate 101; however, the present invention is not limited thereto, and the semiconductor substrate 108 and the support substrate 101 may be the same size or the semiconductor substrate 108 may be larger than the support substrate 101.

Figure 4A:
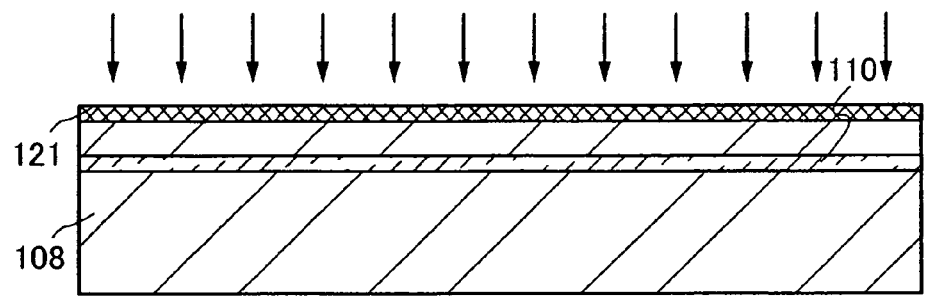
FIGS. 4A to 4C are views showing a manufacturing method of an SOI substrate of the present invention.
Figure 4B:
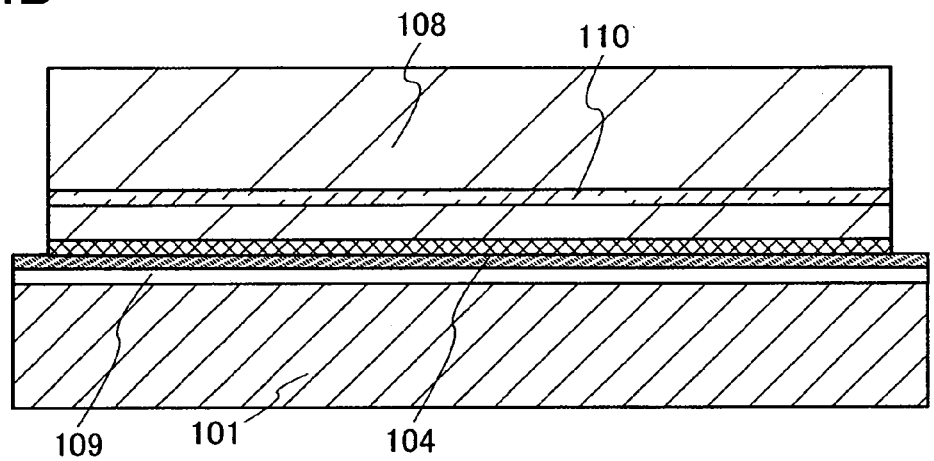
Figure 4C:
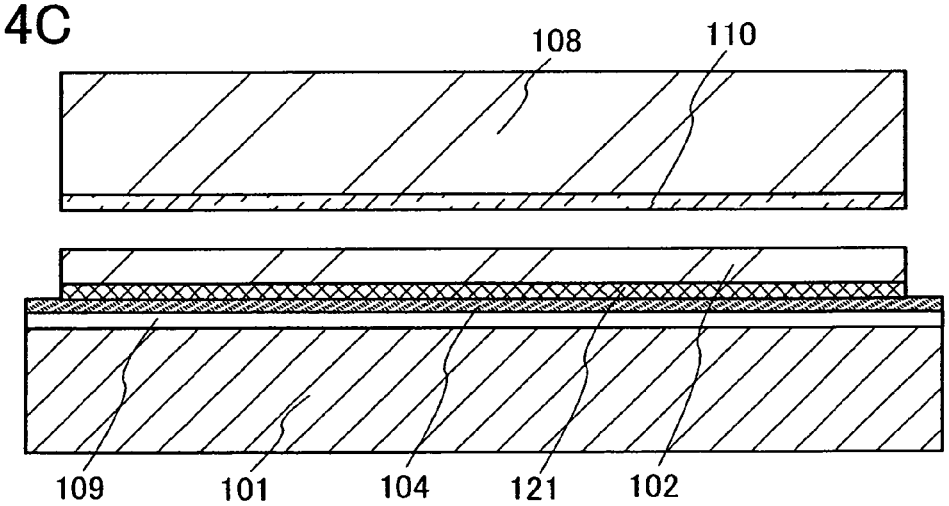

In FIGS. 4A to 4C, steps are shown in which the insulating layer 104 is provided on the support substrate 101 side and the single-crystal semiconductor layer is formed. In FIG. 4A, a step is shown in which the semiconductor substrate 108 provided with a silicon oxide film as a protective layer 121 is irradiated with ions accelerated by an electric field to form the embrittlement layer 110 at a predetermined depth. Ion irradiation is performed similarly to the case of FIG. 3A. The protective layer 121 is formed on the surface of the semiconductor substrate 108, so that the surface can be prevented from being damaged by ion irradiation and planarity can be prevented from being lost. In addition, the protective layer 121 has an advantageous effect of preventing the diffusion of an impurity into the semiconductor layer 102 formed using the semiconductor substrate 108.

In FIG. 4B, a step is shown in which the support substrate 101 provided with a blocking layer 109 and the insulating layer 104, and the protective layer 121 of the semiconductor substrate 108 are disposed in close contact with each other to form a bond. The bond is formed by disposing the insulating layer 104 over the support substrate 101 in close contact with the protective layer 121 of the semiconductor substrate 108.

Then, the semiconductor substrate 108 is separated, as shown in FIG. 4C. Heat treatment by which the single-crystal semiconductor layer is separated is performed in a similar manner to the case of FIG. 3D. The temperature of the heat treatment in a bonding and separation step is less than or equal to that of the heat treatment which is performed in advance on the support substrate 101. In this manner, a semiconductor substrate shown in FIG. 4C can be obtained.

As the support substrate 101, a substrate having an insulating property or a substrate having an insulating surface can be used, and it is possible to use any of a variety of glass substrates which are used in the electronics industry and are referred to as non-alkali glass substrates, such as an aluminosilicate glass substrate, an aluminoborosilicate glass substrate, or a barium borosilicate glass substrate. In addition, a quartz substrate, a ceramic substrate, a sapphire substrate, a metal substrate, a surface of which is coated with an insulating layer, or the like can be used.

Through the above-described process, as shown in FIG. 1A, the insulating layer 104 is provided over the support substrate 101 which is a substrate having an insulating surface, and the semiconductor layer 102 which is separated from the semiconductor substrate 108 is formed.

A crystal defect is generated in the semiconductor layer 102 of an SOI substrate by a separation step and an ion irradiation step. Light irradiation is performed in order to recover the crystallinity of the semiconductor layer 102.

By light irradiation, at least part of a region of the semiconductor layer 102 can be melted to reduce crystal defects in the semiconductor layer 102. Since light irradiation treatment is employed and increase in temperature of the support substrate 101 can be suppressed, a substrate having a low allowable temperature limit such as a glass substrate can be used as the support substrate 101.

In the present invention, in order to efficiently perform light irradiation treatment performed on the semiconductor layer 102, light 125 having a wavelength of 365 nm or more and 700 nm or less which reflects and resonates in the semiconductor layer 102 and which can perform heat treatment is used. For the light 125 having a wavelength of 365 nm or more and 700 nm or less in a so-called visible region, laser light can be used which is oscillated from a solid state laser oscillator superior in productivity as compared to an excimer laser or the like which oscillates ultraviolet light.

In this embodiment mode using the present invention, light irradiation is performed on the semiconductor layer 102, using the light 125 having a wavelength of 365 nm or more and 700 nm or less which reflects and resonates in the semiconductor layer 102 and which can perform heat treatment, and the film thickness d (nm) of the semiconductor layer 102 which is irradiated with the light 125 is made to satisfy $d=\lambda/2n \times m \pm \alpha$ (nm), when a light wavelength is $\lambda$ (nm), a refractive index of the semiconductor layer is n, m is a natural number greater than or equal to 1 (m=1, 2, 3, 4, ... ), and $0 \leq \alpha \leq 10$ is satisfied. By application of the present invention, the semiconductor layer 102 can be irradiated with the light 125, which reflects and resonates in the semiconductor layer 102 and which can perform heat treatment, under an optimum condition where the light absorptance of the semiconductor layer 102 is high. Thus, damage to the semiconductor layer 102 due to the ion irradiation step can be recovered enough, so that an SOI substrate having a semiconductor layer 130 with reduced crystal defects can be manufactured (see FIG. 1B).

In this embodiment mode, the support substrate 101 provided with the semiconductor layer 102 is irradiated with the light 125 having a wavelength of 365 nm or more and 700 nm or less, from the semiconductor layer 102 side. Note that an oxide film (a natural oxide film or a chemical oxide film) formed on the surface of the semiconductor layer 102 may be removed using dilute hydrofluoric acid before irradiation with the light 125.

The light 125 may be one having a wavelength of 365 nm or more and 700 nm or less (preferably, a wavelength of 365 nm or more and 550 nm or less). Preferably, laser light can be used.

As for a laser which oscillates laser light, a continuous-wave laser, a pseudo-CW laser, or a pulsed laser can be used.

A pulsed laser is preferable to partially melt the semiconductor layer 102. For example, a gas laser such as an Ar laser or a Kr laser can be used. Alternatively, as a solid state laser, a YAG laser, a YVO$_4$ laser, a YLF laser, a YAlO$_3$ laser, a GdVO$_4$ laser, a KGW laser, a KYW laser, an Alexandrite laser, Ti: sapphire laser, a Y$_2$O$_3$ laser, or the like can be used. In the solid state lasers such as a YAG laser, there are lasers which serve as a CW laser, a pseudo-CW laser, or a pulsed laser. Note that in the solid state laser, any of the second harmonic to the third harmonic of a fundamental wave is preferably used. Alternatively, a semiconductor laser such as a GaN laser, a GaAs laser, a GaAlAs laser, or an InGaAsP laser can be used. The solid state laser has an advantage in that productivity is excellent, oscillation output is stable, a frequency of maintenance is reduced, and operational costs are inexpensive.

A shutter; a reflector such as a mirror or a half mirror; or an optical system including a cylindrical lens, a convex lens or the like may be provided to adjust the shape or path of the light.

As for an irradiation method of the light, the light can selectively irradiate an object, or the light can irradiate an object by scanning in the XY directions. In this case, it is preferable to use a polygon mirror or a galvanometer mirror for an optical system.

Irradiation with the light can be performed in an atmosphere which contains oxygen such as an atmospheric atmosphere or in an inert atmosphere such as a nitrogen atmosphere. In order to perform irradiation with the light in an inert atmosphere, irradiation with the light may be performed in an airtight chamber, and an atmosphere in this chamber may be controlled. In the case where a chamber is not used, a nitrogen atmosphere can be formed also by spraying an inert gas such as a nitrogen gas on a surface to be irradiated with the light.

When the light irradiation treatment is performed in a nitrogen atmosphere which contains oxygen of 10 ppm or less, preferably 6 ppm or less, the surface of the semiconductor layer can be relatively flat. On the other hand, when the light irradiation treatment is performed in an atmosphere which contains 10% or more oxygen, for example, in an atmospheric atmosphere, crystal defects of the semiconductor layer can be reduced by lower energy than the nitrogen atmosphere.

Further, the surface of the semiconductor layer 130 may be polished by polishing treatment, and unevenness of the surface of the semiconductor layer 130 may be reduced, so that the surface may be planarized. The film thickness to be polished by polishing treatment may be set as appropriate in accordance with the film thickness and the surface roughness of the semiconductor layer 130 before the polishing treatment.

As the polishing treatment, a chemical mechanical polishing (CMP) method or a liquid jet polishing method can be employed. Note that the surface of the semiconductor layer is cleaned and purified before the polishing treatment. Cleaning may be performed using megasonic cleaning, two-fluid jet cleaning, or the like; and dust or the like of the surface of the semiconductor layer is removed by cleaning. In addition, it is preferable to remove a natural oxide film or the like over the surface of the semiconductor layer with the use of dilute hydrofluoric acid and to expose the semiconductor layer. As the polishing treatment, when a CMP method is used, slurry in which fine particles such as silica having a grain size of 10 to 200 nm are dispersed in an alkaline solution of pH 10 to 14 is used. The pressure to be applied to the semiconductor layer by a CMP method may be 0.001 to 0.1 MPa, and is preferably 0.005 to 0.05 MPa. The spindle rotation speed (the number of rotations) may be 10 to 100 rpm, and is preferably 20 to 60 rpm. The table rotation speed (the number of rotations) may be 5 to 80 rpm, and is preferably 10 to 40 rpm. As an example of process conditions of a CMP method, slurry of pH 12 containing silica having a grain size of 60 nm may be used with a pressure of 0.01 MPa, with a spindle rotation speed (the number of rotations) of 20 rpm, and with a table rotation speed (the number of rotations) of 20 rpm.

Figure 2A:
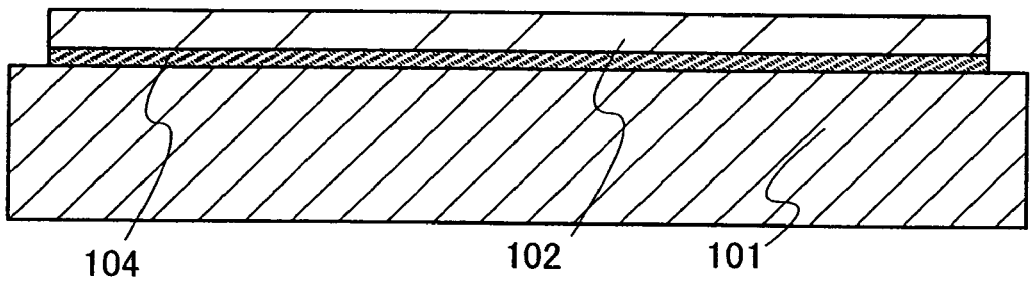
FIGS. 2A to 2C are views showing a manufacturing method of an SOI substrate of the present invention.
Figure 2B:
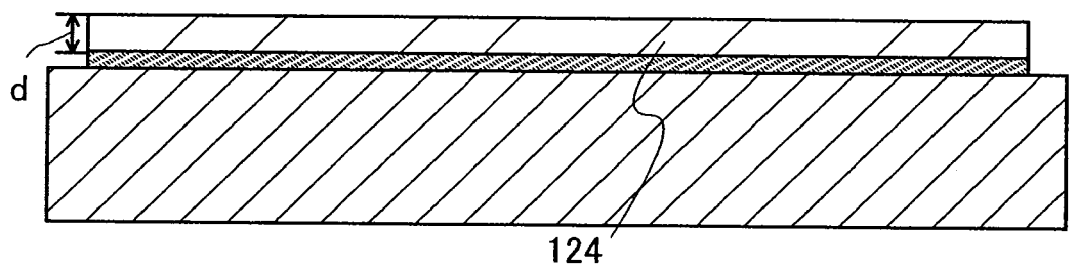
Figure 2C:
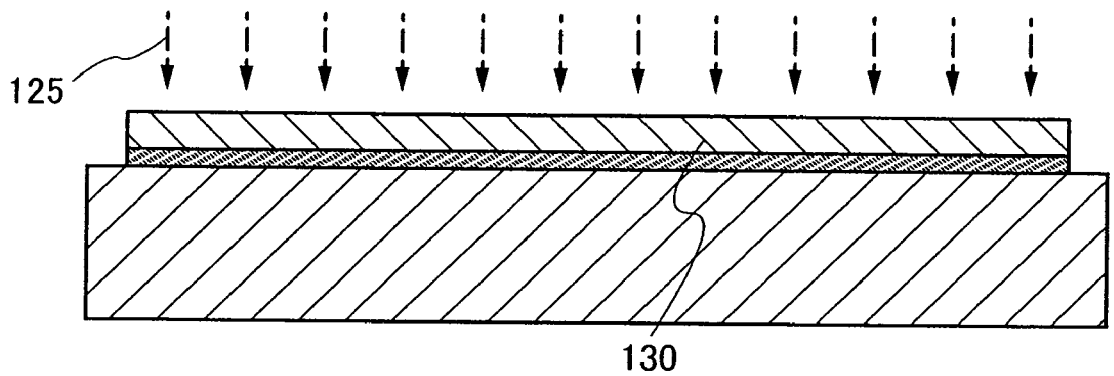

In addition, etching treatment or polishing treatment may be performed on the surface of the semiconductor layer before the light irradiation. In FIGS. 2A to 2C, an example is shown in which etching treatment or polishing treatment is performed on the surface of the semiconductor layer 102 before the light irradiation.

FIG. 2A corresponds to FIG. 1A. The insulating layer 104 is provided and the semiconductor layer 102 separated from the semiconductor substrate 108 is formed over the support substrate 101.

The film thickness of the semiconductor layer 102 is controlled by etching treatment to form a semiconductor layer 124 (see FIG. 2B). The etching treatment can be performed by a wet etching method, a dry etching method, or a combination of a wet etching method and a dry etching method.

Polishing treatment may be performed instead of the etching treatment, or etching treatment and polishing treatment may be combined.

After the semiconductor layer is transferred over the support substrate, etching treatment or polishing treatment is performed, and the film thickness of the semiconductor layer 124 is adjusted so that a film thickness d of the semiconductor layer 124 satisfies $d=\lambda/2n \times m \pm \alpha$ ($m=1, 2, 3, 4, \ldots, 0 \leq \alpha \leq 10$) (nm).

When etching treatment or polishing treatment is performed, the surface of a semiconductor layer where there are many crystal defects can be removed, so that crystal defects in the semiconductor layer, after the light irradiation is performed thereon, can be further reduced. Further, polishing treatment can planarize the semiconductor layer. Therefore, there is an advantageous effect that heat capacity of the semiconductor layer can be uniformed in the light irradiation step, and uniform crystals can be formed through a uniform heating and cooling process or a uniform melting and solidification process.

In addition, polishing treatment may be performed on the semiconductor layer after the above-described light irradiation. By polishing treatment which is performed after the light irradiation, unevenness on the surface of the semiconductor layer which can be caused due to the light irradiation can also be reduced, so that a semiconductor layer having much higher planarity can be obtained.

By etching treatment (or polishing treatment), the semiconductor layer 124 having the film thickness d which satisfies $d=\lambda/2n \times m \pm \alpha$ a ($m=1, 2, 3, 4, \ldots, 0 \leq \alpha \leq 10$) (nm) is irradiated with the light 125 to obtain the semiconductor layer 130. The semiconductor layer 124 can be irradiated with the light 125, which reflects and resonates in the semiconductor layer 124 and which can perform heat treatment, under an optimum condition where the light absorptance of the semiconductor layer 124 is high. Thus, damage to the semiconductor layer 124 due to the ion irradiation step can be recovered enough, so that an SOI substrate having the semiconductor layer 130 with reduced crystal defects can be manufactured (see FIG. 2C).

In this embodiment as described above, it is possible to manufacture an SOI substrate having a semiconductor layer where crystal defects are more reduced by preferable light irradiation treatment which is excellent in productivity.

In this embodiment mode, when a single-crystal silicon substrate is used as the semiconductor substrate 108, a single-crystal silicon layer can be obtained as the semiconductor layer 130. In addition, in a manufacturing method of an SOI substrate related to this embodiment mode, a process temperature can be set at less than or equal to 700° C.; therefore, a glass substrate can be used as the support substrate 101. That is, similarly to the conventional thin film transistor, a transistor can be formed over a glass substrate and a single-crystal silicon layer can be used as the semiconductor layer. These make it possible to form a high-performance transistor in which high speed operation is possible and which can be driven with high field effect mobility and low consumption voltage can be formed over a support substrate such as a glass substrate.

Thus, a high-performance semiconductor device can be manufactured with high yield.

Embodiment Mode 2

This embodiment mode will describe a manufacturing method of a CMOS (complementary metal oxide semiconductor) as an example of a manufacturing method of a high-performance semiconductor device having a semiconductor element with high yield, with reference to FIGS. 5A to 5E and FIGS. 6A to 6D. Note that repetitive descriptions for the same components as or components having similar functions to the components in Embodiment Mode 1 are omitted.

Figure 5A:
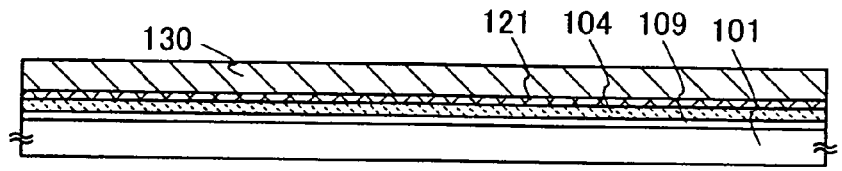
FIGS. 5A to 5E are views showing a manufacturing method of a semiconductor device of the present invention.

In FIG. 5A, a blocking layer 109, an insulating layer 104, a protective layer 121, and a semiconductor layer 130 are formed over a support substrate 101. The semiconductor layer 130 corresponds to FIG. 1B or 2C, and the blocking layer 109, the insulating layer 104, and the protective layer 121 correspond to FIG. 4C. Although an example is shown here in which an SOI substrate having the structure shown in FIG. 5A is used, an SOI substrate having another structure shown in this specification can also be used.

Since the semiconductor layer 130 is separated from the semiconductor substrate 108 and subjected to the preferable light irradiation treatment which is excellent in productivity as shown in Embodiment Mode 1, the semiconductor layer 130 with reduced crystal defects is obtained.

In the semiconductor layer 130, a p-type impurity such as boron, aluminum, or gallium or an n-type impurity such as phosphorus or arsenic is preferably added to correspond to a formation region of an n-channel field-effect transistor or a p-channel field-effect transistor. In other words, a p-type impurity is added to a formation region of an n-channel field-effect transistor or an n-type impurity is added to a formation region of a p-channel field-effect transistor, whereby a so-called well region is formed. The dose of impurity ions may range from approximately $1\times10^{12}$ to $1\times10^{14}$ ions/cm$^2$. Furthermore, in the case of controlling the threshold voltage of the field-effect transistor, a p-type or n-type impurity may be added to the well region.

Figure 5B:
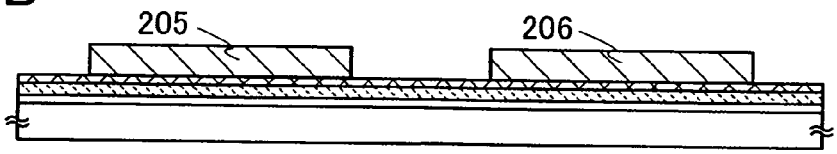

The semiconductor layer 130 is etched into island-like shapes to correspond to the arrangement of the semiconductor element to form separated semiconductor layers 205 and 206 (see FIG. 5B).

An oxide film over the semiconductor layer is removed, and a gate insulating layer 207 which covers the semiconductor layers 205 and 206 is formed.

The gate insulating layer 207 may be formed of silicon oxide or a stacked layer structure of silicon oxide and silicon nitride. The gate insulating layer 207 may be formed by depositing an insulating film by a plasma CVD method or a low pressure CVD method or may be formed by solid phase oxidation or solid phase nitridation by plasma treatment. This is because a gate insulating layer which is formed using a semiconductor layer which is oxidized or nitrided by plasma treatment is dense, has high withstand voltage, and is excellent in reliability.

As the gate insulating layer 207, a high dielectric constant material such as zirconium dioxide, hafnium oxide, titanium dioxide, or tantalum pentoxide may be used. If a high dielectric constant material is used for the gate insulating layer 207, a gate leakage current can be reduced.

Figure 5C:
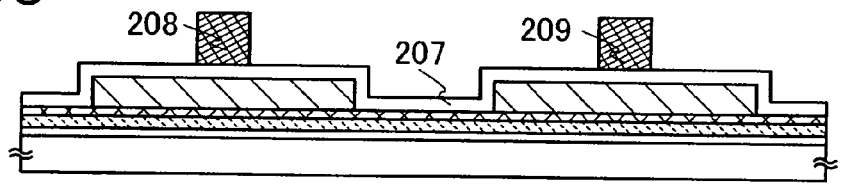
Figure 5D:
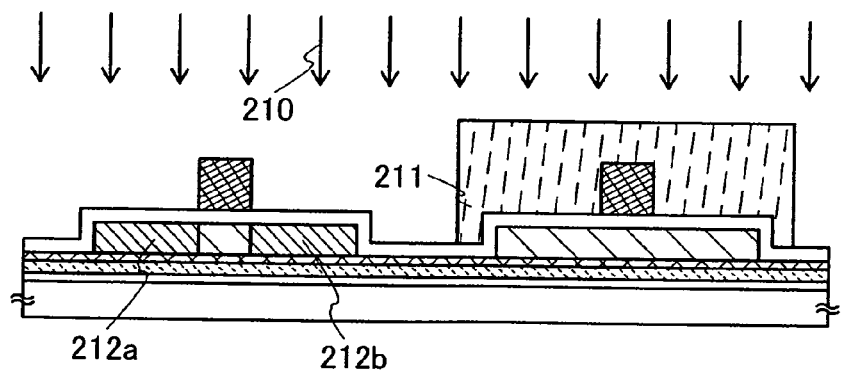
Figure 5E:
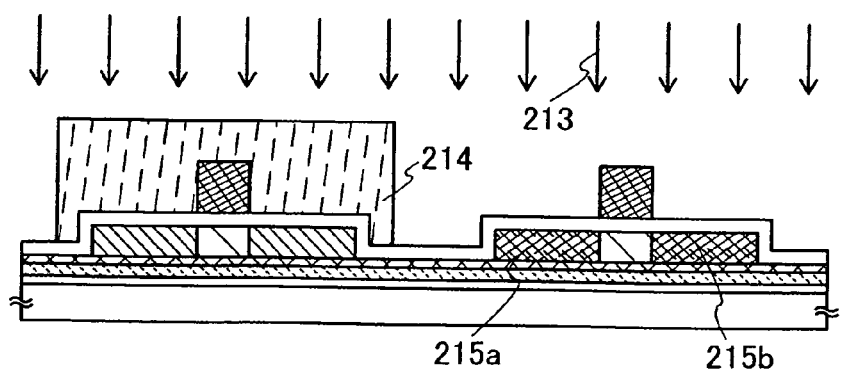

A gate electrode layer 208 and a gate electrode layer 209 are formed over the gate insulating layer 207 (see FIG. 5C). The gate electrode layers 208 and 209 can be formed by a sputtering method, an evaporation method, a CVD method, or the like. The gate electrode layers 208 and 209 may be formed of an element selected from tantalum (Ta), tungsten (W), titanium (Ti), molybdenum (Mo), aluminum (Al), copper (Cu), chromium (Cr), or neodymium (Nd); or an alloy material or a compound material containing any of these elements as its main component. In addition, as the gate electrode layers 208 and 209, a semiconductor film typified by a polycrystalline silicon film doped with an impurity element such as phosphorus, or an AgPdCu alloy may be used.

A mask 211 which covers the semiconductor layer 206 is formed. An impurity element 210 imparting n-type conductivity is added, using the mask 211 and the gate electrode layer 208 as masks, to form first n-type impurity regions 212a and 212b (see FIG. 5D). In this embodiment mode, phosphine (PH$_3$) is used as a doping gas which contains an impurity element. Here, the impurity element 210 imparting n-type conductivity is added so that the first n-type impurity regions 212a and 212b contain the impurity element imparting n-type conductivity at a concentration of approximately $1\times10^{17}$ to $5\times10^{18}$/cm$^3$. In this embodiment mode, phosphorus (P) is used as the impurity element imparting n-type conductivity.

Next, a mask 214 which covers the semiconductor layer 205 is formed. An impurity element 213 imparting p-type conductivity is added, using the mask 214 and the gate electrode layer 209 as masks, to form first p-type impurity regions 215a and 215b (see FIG. 5E). In this embodiment mode, diborane (B$_2$H$_6$) or the like is used as a doping gas which contains an impurity element because boron (B) is used as an impurity element.

Figure 6A:
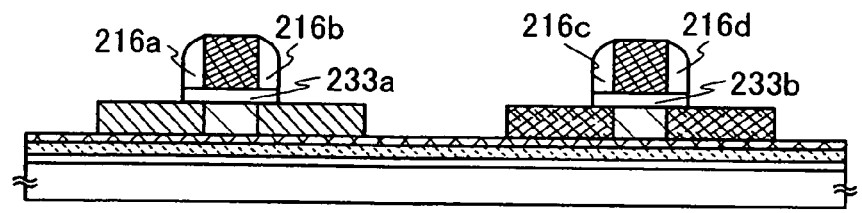
FIGS. 6A to 6D are views showing a manufacturing method of a semiconductor device of the present invention.
Figure 6B:
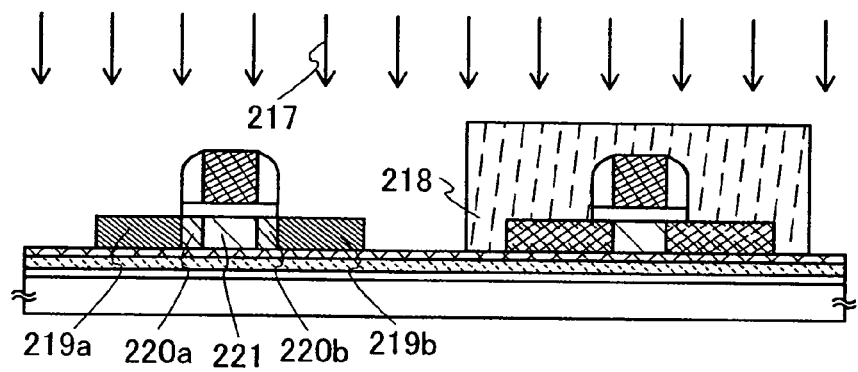
Figure 6C:
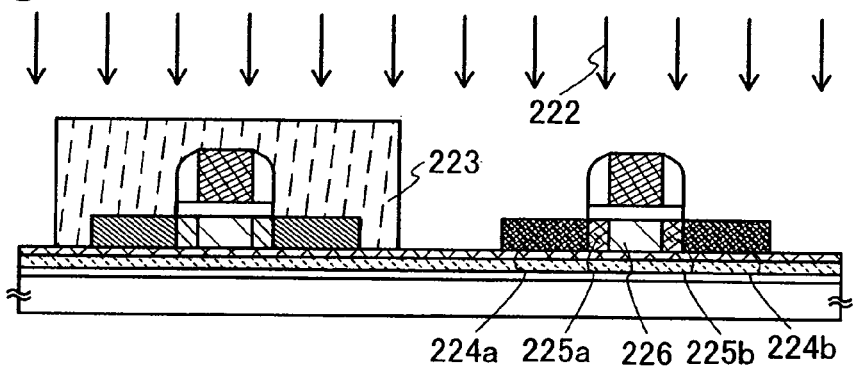

The mask 214 is removed, sidewall insulating layers 216a to 216d with a sidewall structure are formed on side surfaces of the gate electrode layers 208 and 209, and gate insulating layers 233a and 233b are formed (see FIG. 6A). The sidewall insulating layers 216a to 216d with a sidewall structure may be formed on the side surfaces of the gate electrode layers 208 and 209 in a self-aligning manner, in the following manner: an insulating layer which covers the gate electrode layers 208 and 209 is formed and then is processed by anisotropic etching using an RIE (reactive ion etching) method. Here, there is no particular limitation on the insulating layers and the insulating layers are preferably layers of silicon oxide with favorable step coverage, which are formed by reacting TEOS (tetraethyl orthosilicate), silane, or the like with oxygen, nitrous oxide, or the like. The insulating layers can be formed by a thermal CVD method, a plasma CVD method, a normal-pressure CVD method, a bias ECRCVD method, a sputtering method, or the like. The gate insulating layers 233a and 233b can be formed, using the gate electrode layers 208 and 209 and the sidewall insulating layers 216a to 216d as masks and etching the gate insulating layer 207.

In this embodiment mode, in etching the insulating layer, the insulating layer over the gate electrode layers are removed to expose the gate electrode layers. However, the sidewall insulating layers 216a to 216d may be formed to have a shape in which the insulating layer over the gate electrode layers remains. In addition, a protective film may be formed over the gate electrode layers in a later step. By protecting the gate electrode layers in this manner, film reduction of the gate electrode layers can be prevented at the etching process. In the case of forming silicide in a source region and a drain region, since a metal film formed for formation of the silicide is not in contact with the gate electrode layers, even when a material of the metal film can easily react with a material of the gate electrode layer, defects such as chemical reaction or diffusion can be prevented. Various etching methods such as a dry etching method or a wet etching method may be employed for the etching. In this embodiment mode, a dry etching method is employed. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used, as appropriate.

Next, a mask 218 which covers the semiconductor layer 206 is formed. An impurity element 217 imparting n-type conductivity is added, using the mask 218, the gate electrode layer 208, and the sidewall insulating layers 216a and 216b as masks, to form second n-type impurity regions 219a and 219b and third n-type impurity regions 220a and 220b. In this embodiment mode, $PH_3$ is used as a doping gas which contains an impurity element. Here, the impurity element 217 imparting n-type conductivity is added so that the second n-type impurity regions 219a and 219b contain the impurity element imparting n-type conductivity at a concentration of approximately $5 \times 10^{19}$ to $5 \times 10^{20}/cm^3$. In addition, a channel formation region 221 is formed in the semiconductor layer 205 (see FIG. 6B).

The second n-type impurity regions 219a and 219b are high-concentration n-type impurity regions and function as a source and a drain. On the other hand, the third n-type impurity regions 220a and 220b are low-concentration impurity regions, and LDD (lightly doped drain) regions. Since the third n-type impurity regions 220a and 220b are formed in Loff regions, which are not covered with the gate electrode layer 208, an off current can be reduced. Consequently, a semiconductor device with high reliability and low power consumption can be manufactured.

The mask 218 is removed, and a mask 223 which covers the semiconductor layer 205 is formed. An impurity element 222 imparting p-type conductivity is added, using the mask 223, the gate electrode layer 209, and the sidewall insulating layers 216c and 216d as masks, to form second p-type impurity regions 224a and 224b, and third p-type impurity regions 225a and 225b.

The impurity element 222 imparting p-type conductivity is added so that the second p-type impurity regions 224a and 224b contain the impurity element imparting p-type conductivity at a concentration of approximately $1 \times 10^{20}$ to $5 \times 10^{21}/cm^3$. In this embodiment mode, the third p-type impurity regions 225a and 225b are formed in a self-aligning manner by the sidewall insulating layers 216c and 216d so as to have a lower concentration than the second p-type impurity regions 224a and 224b. In addition, a channel formation region 226 is formed in the semiconductor layer 206 (see FIG. 6C).

The second p-type impurity regions 224a and 224b are high-concentration p-type impurity regions and function as a source and a drain. On the other hand, the third p-type impurity regions 225a and 225b are low-concentration impurity regions, and LDD (lightly doped drain) regions. Since the third p-type impurity regions 225a and 225b are formed in Loff regions, which are not covered with the gate electrode layer 209, an off current can be reduced. Consequently, a semiconductor device with high reliability and low power consumption can be manufactured.

The mask 223 is removed, and heat treatment, strong light irradiation, or laser light irradiation may be performed in order to activate the impurity element. At the same time as the activation, plasma damage to the gate insulating layer and plasma damage to an interface between the gate insulating layer and the semiconductor layer can be repaired.

Next, an interlayer insulating layer which covers the gate electrode layers and the gate insulating layers is formed. In this embodiment mode, a stacked layer structure of an insulating film 227 which contains hydrogen to serve as a protective film and an insulating layer 228 is employed. The insulating film 227 and the insulating layer 228 may be formed of a silicon nitride film, a silicon nitride oxide film, a silicon oxynitride film, or a silicon oxide film by a sputtering method or a plasma CVD method. Alternatively, a single layer structure or a stacked layer structure of three or more layers using a different insulating film containing silicon may be employed.

Further, a step in which heat treatment is performed at 300 to 550° C. for 1 to 12 hours in a nitrogen atmosphere and the semiconductor layer is hydrogenated is performed. Preferably, the temperature is 400 to 500° C. This step is a step for terminating a dangling bond of the semiconductor layer by hydrogen contained in the insulating film 227, which is an interlayer insulating layer. In this embodiment mode, heat treatment is performed at 410° C. for 1 hour.

The insulating film 227 and the insulating layer 228 can also be formed of a material selected from aluminum nitride (AlN), aluminum oxynitride (AlON), aluminum nitride oxide having a higher content of nitrogen than that of oxygen (AlNO), aluminum oxide, diamond-like carbon (DLC), nitrogen-containing carbon (CN), or other substances containing an inorganic insulating material. A siloxane resin may also be used. The siloxane resin is a resin including a Si—O—Si bond. Siloxane has a skeletal structure formed of a bond of silicon (Si) and oxygen (O). As a substituent, an organic group containing at least hydrogen (e.g., an alkyl group or an aryl group) or a fluoro group may be used. In addition, as a substituent, both an organic group containing at least hydrogen and a fluoro group may also be used. Further, an organic insulating material such as polyimide, acrylic, polyamide, polyimide amide, resist, benzocyclobutene, or polysilazane can be used. A coating film with a favorable planarity formed by a coating method may also be employed.

The insulating film 227 and the insulating layer 228 can be formed by dipping, spray coating, a doctor knife, a roll coater, a curtain coater, a knife coater, a CVD method, an evaporation method, or the like. The insulating film 227 and the insulating layer 228 may also be formed by a droplet discharge method. In the case of using a droplet discharge method, material solution can be saved. In addition, a method capable of transferring or drawing a pattern similarly to a droplet discharge method, for example, a printing method (a method of forming a pattern such as screen printing or offset printing) can also be employed.

Next, contact holes (openings) which reach the semiconductor layers are formed in the insulating film 227 and the insulating layer 228, using a resist mask. Etching may be performed once or plural times depending on selectivity of a material to be used. The insulating film 227 and the insulating layer 228 are partially removed by the etching to form the openings which reach the second n-type impurity regions 219a and 219b and the second p-type impurity regions 224a and 224, which are source regions and drain regions. The etching may be performed by wet etching, dry etching, or both wet etching and dry etching. A hydrofluoric-acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used, as appropriate. Further, an inert gas may be added to an etching gas to be used. As an inert element to be added, one or a plurality of elements selected from He, Ne, Ar, Kr, or Xe can be used.

A conductive film is formed so as to cover the openings, and the conductive film is etched to form wiring layers 229a, 229b, 230a, and 230b which each function as a source or drain electrode layer which is electrically connected to part of a source or drain region. The wiring layers can be formed by depositing a conductive film by a PVD method, a CVD method, an evaporation method, or the like, and then, etching the conductive film into a desired shape. Further, a conductive film can be selectively formed in a predetermined position by a droplet discharge method, a printing method, an electroplating method, or the like. Alternatively, a reflow method or a damascene method may be employed. As a material for the wiring layers, metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. A stacked layer structure of these materials may also be employed.

Figure 6D:
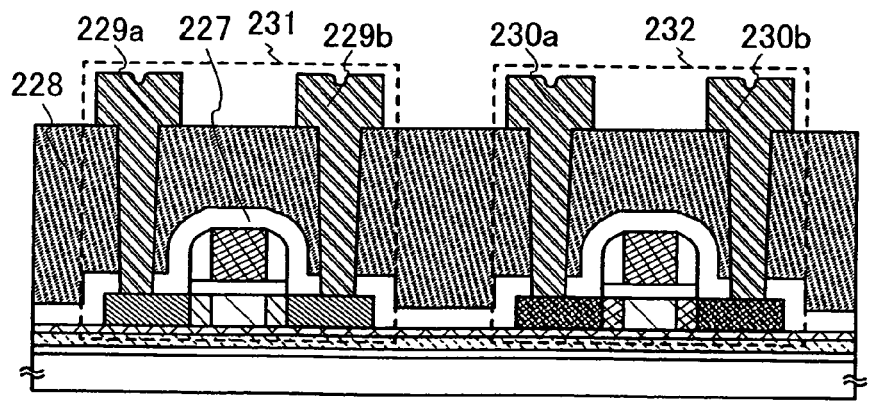

Through the above-described process, a semiconductor device having a CMOS structure which includes a thin film transistor 231, which is an n-channel thin film transistor, and a thin film transistor 232, which is a p-channel thin film transistor, can be manufactured (see FIG. 6D). Although not shown in the drawings, a CMOS structure is described in this embodiment mode; therefore, the thin film transistor 231 and the thin film transistor 232 are electrically connected to each other.

A structure of the thin film transistor is not limited to this embodiment mode, and a single gate structure in which one channel formation region is formed, a double gate structure in which two channel formation regions are formed, or a triple gate structure in which three channel formation regions are formed may be employed.

In this embodiment as described above, a high-performance semiconductor device can be manufactured with high yield, using an SOI substrate having a semiconductor layer with reduced crystal defects by preferable light irradiation treatment which is excellent in productivity.

Embodiment Mode 3

Figure 7A:
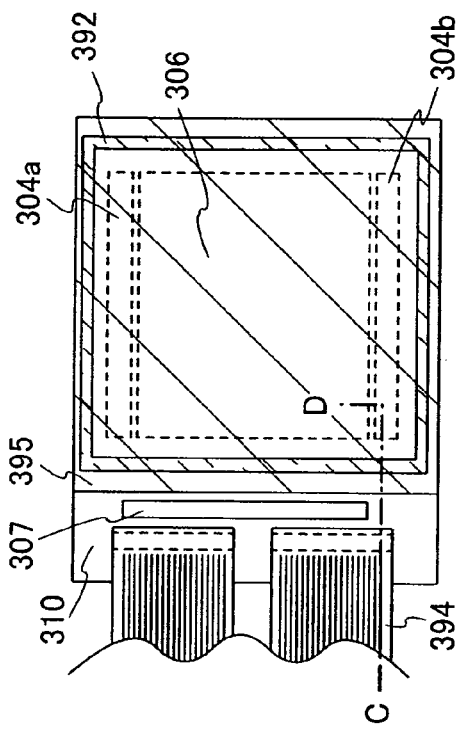
FIGS. 7A and 7B are a plan view and a cross-sectional view showing a semiconductor device of the present invention, respectively.
Figure 7B:
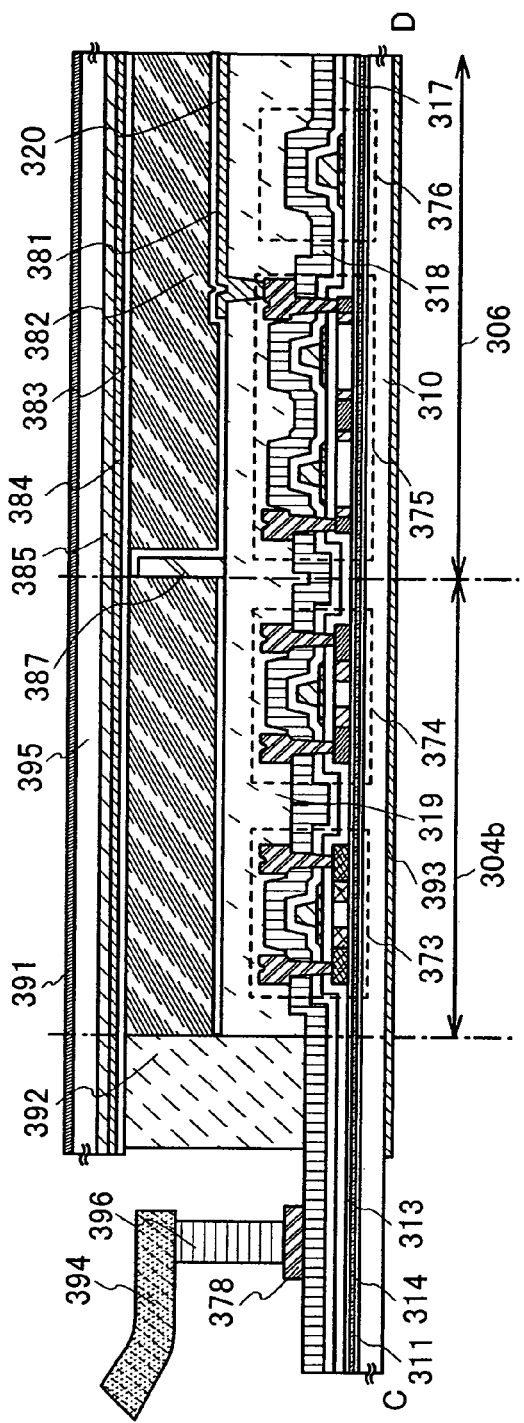

This embodiment mode will describe an example of a manufacturing method of a semiconductor device which is intended to manufacture a semiconductor device (also referred to as a liquid crystal display device) having a display function as a high-performance semiconductor device with high yield, with reference to FIGS. 7A and 7B. Specifically, a liquid crystal display device which uses a liquid crystal display element as a display element will be described.

FIG. 7A is a plan view of a semiconductor device which is one mode of the present invention, and FIG. 7B is a cross-sectional view taken along line C-D of FIG. 7A.

As shown in FIG. 7A, a pixel region 306 and driver circuit regions 304a and 304b which are scanning line driver circuits are sealed between a support substrate 310 and a counter substrate 395 with a sealant 392. In addition, a driver circuit region 307 which is a signal line driver circuit formed using a driver IC is provided over the support substrate 310. A transistor 375 and a capacitor 376 are provided in the pixel region 306. A driver circuit having transistors 373 and 374 is provided in the driver circuit region 304b. In the semiconductor device of this embodiment mode, the high-performance SOI substrate using the present invention which is described in Embodiment Mode 1 is used.

In the pixel region 306, the transistor 375 to serve as a switching element is provided over a blocking layer 311, an insulating layer 314, and a protective layer 313. In this embodiment mode, a multi-gate thin film transistor (TFT) is used as the transistor 375, which includes a semiconductor layer having impurity regions which function as source and drain regions, a gate insulating layer, a gate electrode layer having a two-layer structure, and source and drain electrode layers. The source or drain electrode layer is in contact with and electrically connected to the impurity region of the semiconductor layer and an electrode layer 320 which is used for a display element and also referred to as a pixel electrode layer.

Impurity regions in the semiconductor layer can be formed as high-concentration impurity regions and low-concentration impurity regions by controlling the concentration of the impurity element. A thin film transistor having low-concentration impurity regions is referred to as a transistor having an LDD (lightly doped drain) structure. Further, the low-concentration impurity regions can be formed to overlap with the gate electrode. A thin film transistor having such a structure is referred to as a transistor having a GOLD (gate overlapped LDD) structure. The polarity of the thin film transistor is to be an n-type by using phosphorus (P) or the like in the impurity regions. When p-channel thin film transistors are formed, boron (B) or the like may be added. After that, insulating films 317 and 318 are formed to cover the gate electrode and the like.

Further, in order to enhance the level of planarity, an insulating film 319 is formed as an interlayer insulating film. The insulating film 319 can be formed using an organic material, an inorganic material, or a stacked layer structure of them. For example, the insulating film 319 can be formed using a material selected from silicon oxide, silicon nitride, silicon oxynitride, silicon nitride oxide, aluminum nitride, aluminum oxynitride, aluminum nitride oxide having a higher content of nitrogen than that of oxygen, aluminum oxide, diamond-like carbon (DLC), polysilazane, nitrogen-containing carbon (CN), PSG (phosphosilicate glass), BPSG (borophosphosilicate glass), alumina, or other substances containing an inorganic insulating material. Alternatively, an organic insulating material may be used. The organic material can be either photosensitive or non-photosensitive. For example, polyimide, acrylic, polyamide, polyimide amide, resist, benzocyclobutene, or a siloxane resin can be used.

Since the semiconductor layer used for a semiconductor element is formed similarly to the case of Embodiment Mode 1 using the preset invention, a single-crystal semiconductor layer separated from a single-crystal semiconductor substrate can be used as the semiconductor layer, and the pixel region and the driver circuit region can be formed over the same substrate. In that case, transistors in the pixel region 306 and transistors in the driver circuit region 304b are formed at the same time. Needless to say, the driver circuit region 307 may also be formed over the same substrate in a similar manner. Transistors used for the driver circuit region 304b form a CMOS circuit. Although the thin film transistors which form the CMOS circuit have a GOLD structure, an LDD structure like the transistor 375 can also be employed.

Next, an insulating layer 381 which functions as an alignment film is formed so as to cover the electrode layer 320 used for a display element and the insulating film 319 by a printing method or a droplet discharge method. Note that when a screen printing method or an offset printing method is employed, the insulating layer 381 can be formed selectively. After that, rubbing treatment is performed. This rubbing treatment is not required to be performed depending on modes of liquid crystals, e.g., a VA mode. The same as the insulating layer 381 can be said for an insulating layer 383 which functions as an alignment film. Next, the sealant 392 is formed in a peripheral region of pixels by a droplet discharge method.

Then, the counter substrate 395, which has the insulating layer 383 which functions as the alignment film, an electrode layer 384 which is used for a display element and also referred to as a counter electrode layer, a colored layer 385 which function as a color filter, and a polarizer 391 (also referred to as polarizing plate), is attached to the support substrate 310 which is a TFT substrate, with a spacer 387 interposed therebetween. A gap between the two substrates is provided with a liquid crystal layer 382. The semiconductor device in this embodiment mode is a transmissive type. Therefore, a polarizer (a polarizing plate) 393 is also provided on the side opposite to the surface of the support substrate 310 where elements are formed. The stacked layer structure of the polarizer and the colored layer is also not limited to that of FIGS. 7A and 7B and may be determined as appropriate depending on materials of the polarizer and the colored layer or conditions of a manufacturing process. The polarizer can be provided on the substrate with an adhesive layer. In addition, a filler may be mixed in the sealant and further, a light-shielding film (black matrix) or the like may be formed on the counter substrate 395. When the liquid crystal display device is formed to be a full-color display device, color filters and the like may be formed using materials which exhibit red (R), green (G), and blue (B) colors. On the other hand, when the liquid crystal display device is formed to be a monochrome display device, colored layers are not required. Alternatively, a colored layer may be formed of a material which exhibits at least one color. In addition, an anti-reflective film having an antireflective function may be provided on the viewing side of the semiconductor device. Further, the polarizing plate and the liquid crystal layer may be stacked with a retardation plate interposed therebetween.

Note that the color filter is not provided in some cases when a successive additive color mixture method (a field sequential method) is employed in which RGB light-emitting diodes (LEDs) and the like are used as a backlight and color display is performed by a time division method. The black matrix, which can reduce reflection of external light by wirings of transistors or CMOS circuits, may be provided so as to overlap with the transistors or the CMOS circuits. Note that the black matrix may also be provided so as to overlap with a capacitor. This is because reflection of light by metal films of the capacitor can be prevented.

The liquid crystal layer can be formed by a dispenser method (a dripping method) or an injection method in which the support substrate 310 where elements are formed and the counter substrate 395 are bonded first and then liquid crystals are injected into a space therebetween by using a capillary phenomenon. When handling a large-sized substrate to which the injection method is difficult to be applied, the dripping method may be applied.

The spacer can be provided by dispersing particles with a size of several μm. In this embodiment mode, however, a method of forming a resin film over the entire surface, followed by etching, is employed. After applying such a spacer material by a spinner, the material is subjected to light-exposure and development treatment, so that a predetermined pattern is formed. Further, the material is heated at 150 to 200° C. in a clean oven or the like so as to be hardened. Although the shape of the spacer formed in the above manner can vary depending on the conditions of light-exposure and development treatment, the shape of the spacer is preferably a columnar shape with a flat top, so that mechanical strength which is high enough as a semiconductor device can be secured when attaching the counter substrate to the TFT substrate. The shape of the spacer can also be conic, pyramidal, or the like; however, the present invention is not limited thereto.

Subsequently, an FPC 394 which is a connection wiring board is connected to a terminal electrode layer 378, which is electrically connected to the pixel region, with an anisotropic conductive layer 396 interposed therebetween. The FPC 394 functions to transmit signals and potentials from outside. Through the above-described process, a semiconductor device having a display function can be manufactured.

Also in any of the semiconductor devices of this embodiment mode, as described in Embodiment Mode 1, light irradiation is performed on a semiconductor layer, which is separated from a semiconductor substrate and bonded to a support substrate having an insulating surface, using light having a wavelength of 365 nm or more and 700 nm or less, and a film thickness d (nm) of the semiconductor layer which is irradiated with the light is made to satisfy $d=\lambda/2n \times m \pm \alpha$ (nm), when a light wavelength is $\lambda$ (nm), a refractive index of the semiconductor layer is n, m is a natural number greater than or equal to 1 (m=1, 2, 3, 4, . . . ), and $0 \leq \alpha \leq 10$ is satisfied. By application of the present invention, the semiconductor layer can be irradiated with light, which reflects and resonates in the semiconductor layer and which can perform heat treatment, under an optimum condition where the light absorptance of the semiconductor layer is high. Thus, an SOI substrate having a semiconductor layer with reduced crystal defects can be used.

Thus, a high-performance semiconductor device can be manufactured with high yield.

Embodiment Mode 4

A semiconductor device having a light-emitting element can be formed by application of the present invention, and the light-emitting element emits light by any one of bottom emission, top emission, and dual emission. This embodiment mode will describe an example of a manufacturing method of a semiconductor device which is intended to manufacture a semiconductor device having a display function (also referred to as a display device or a light-emitting device) as a high-performance semiconductor device of a bottom-emission type, a dual-emission type, or a top-emission type with high yield, with reference to FIGS. 8A and 8B, FIG. 9, and FIG. 10.

Figures 8A, 8B:
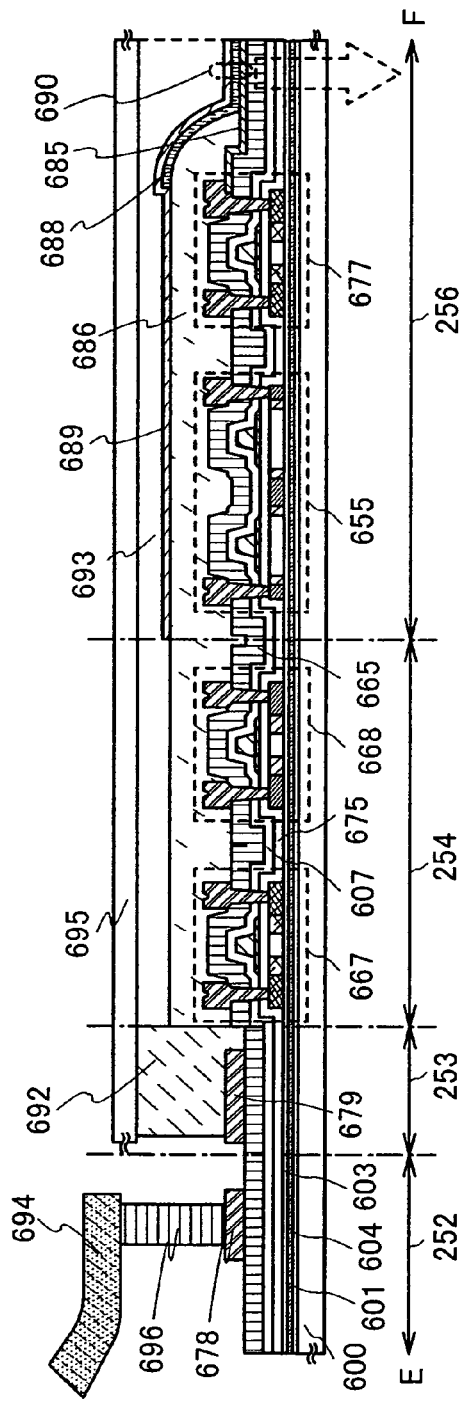
FIGS. 8A and 8B are a plan view and a cross-sectional view showing a semiconductor device of the present invention, respectively.

A semiconductor device shown in FIGS. 8A and 8B employs a bottom-emission structure in which light is emitted in a direction indicated by an arrow. FIG. 8A is a plan view of the semiconductor device, and FIG. 8B is a cross-sectional view taken along line E-F of FIG. 8A. In FIGS. 8A and 8B, the semiconductor device includes an external terminal connection region 252, a sealing region 253, a driver circuit region 254, and a pixel region 256.

The semiconductor device shown in FIGS. 8A and 8B includes an element substrate 600, a thin film transistor 655, a thin film transistor 677, a thin film transistor 667, a thin film transistor 668, a light-emitting element 690 including a first electrode layer 685, a light-emitting layer 688, and a second electrode layer 689, a filler 693, a sealant 692, a blocking layer 601, an insulating layer 604, an oxide film 603, a gate insulating layer 675, an insulating film 607, an insulating film 665, an insulating layer 686, a sealing substrate 695, a wiring layer 679, a terminal electrode layer 678, an anisotropic conductive layer 696, and an FPC 694. The semiconductor device includes the external terminal connection region 252, the sealing region 253, the driver circuit region 254, and the pixel region 256. The filler 693 can be formed by a dropping method, using a composition in a liquid state. A semiconductor device (a light-emitting display device) is sealed by attaching the element substrate 600 provided with the filler by a dropping method and the sealing substrate 695 to each other.

In the semiconductor device shown in FIGS. 8A and 8B, the first electrode layer 685 is formed using a light-transmitting conductive material so as to transmit light emitted from the light-emitting element 690, and the second electrode layer 689 is formed using a reflective conductive material so as to reflect light emitted from the light-emitting element 690.

Since it is acceptable as long as the second electrode layer 689 has reflectivity, a conductive film formed of titanium, tungsten, nickel, gold, platinum, silver, copper, tantalum, molybdenum, aluminum, magnesium, calcium, lithium, or an alloy thereof may be used. It is preferable to use a substance having high reflectivity in a visible region, and an aluminum film is used in this embodiment mode.

The first electrode layer 685 may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Figure 9:
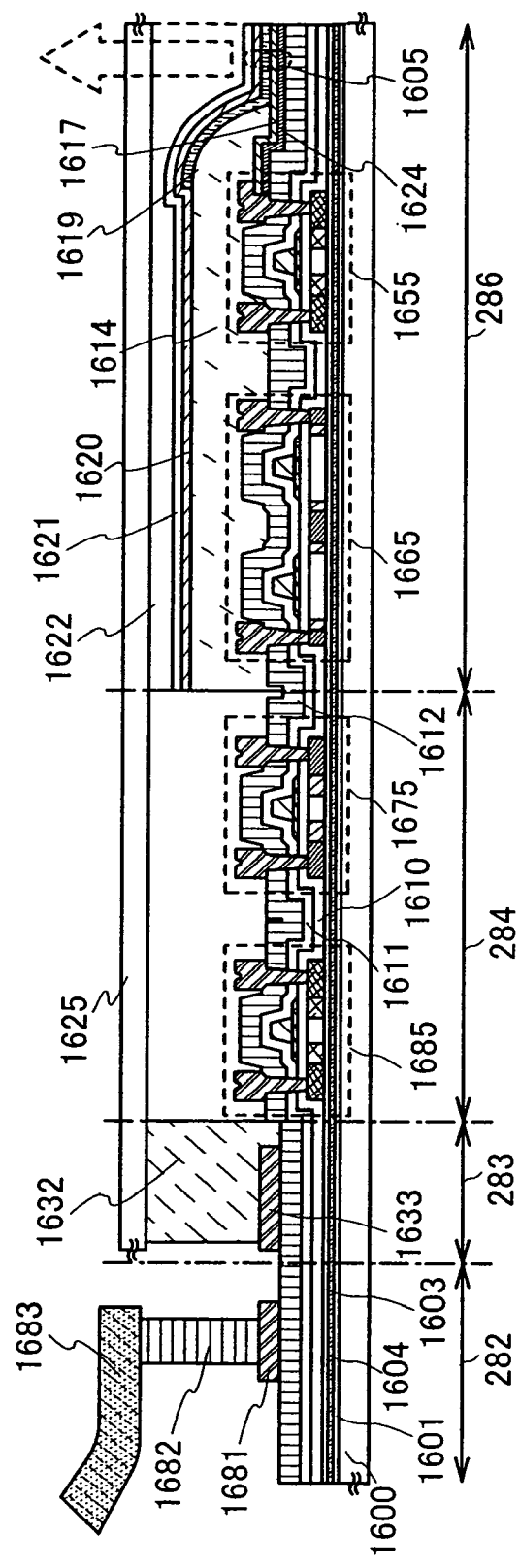
FIG. 9 is a view showing a semiconductor device of the present invention.

A semiconductor device shown in FIG. 9 employs a top-emission structure in which light is emitted in a direction indicated by an arrow. The semiconductor device shown in FIG. 9 includes an element substrate 1600, a thin film transistor 1655, a thin film transistor 1665, a thin film transistor 1675, a thin film transistor 1685, a wiring layer 1624, a first electrode layer 1617, a light-emitting layer 1619, a second electrode layer 1620, a light-emitting element 1605, a protective film 1621, a filler 1622, a sealant 1632, a blocking layer 1601, an insulating layer 1604, an oxide film 1603, a gate insulating layer 1610, an insulating film 1611, an insulating film 1612, an insulating layer 1614, a sealing substrate 1625, a wiring layer 1633, a terminal electrode layer 1681, an anisotropic conductive layer 1682, and an FPC 1683.

The semiconductor device shown in FIG. 9 includes an external terminal connection region 282, a sealing region 283, a driver circuit region 284, and a pixel region 286. In the semiconductor device shown in FIG. 9, the wiring layer 1624 which is a reflective metal layer is provided below the first electrode layer 1617. The first electrode layer 1617 which is a transparent conductive film is formed over the wiring layer 1624. Since it is acceptable as long as the wiring layer 1624 has reflectivity, a conductive film or the like formed of titanium, tungsten, nickel, gold, platinum, silver, copper, tantalum, molybdenum, aluminum, magnesium, calcium, lithium, or an alloy thereof may be used. It is preferable to use a substance having high reflectivity in a visible region. A conductive film may also be used for the first electrode layer 1617, and in that case, the wiring layer 1624 having reflectivity is not necessarily provided.

The first electrode layer 1617 and the second electrode layer 1620 may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Further, when a material such as a metal film having no light-transmitting property is formed thin (preferably a thickness of approximately 5 to 30 nm) so as to be able to transmit light, light can be emitted through the first electrode layer 1617 and the second electrode layer 1620. As a metal thin film which can be used for the first electrode layer 1617 and the second electrode layer 1620, a conductive film formed of titanium, tungsten, nickel, gold, platinum, silver, aluminum, magnesium, calcium, lithium, or an alloy thereof, or the like can be used.

Figure 10:
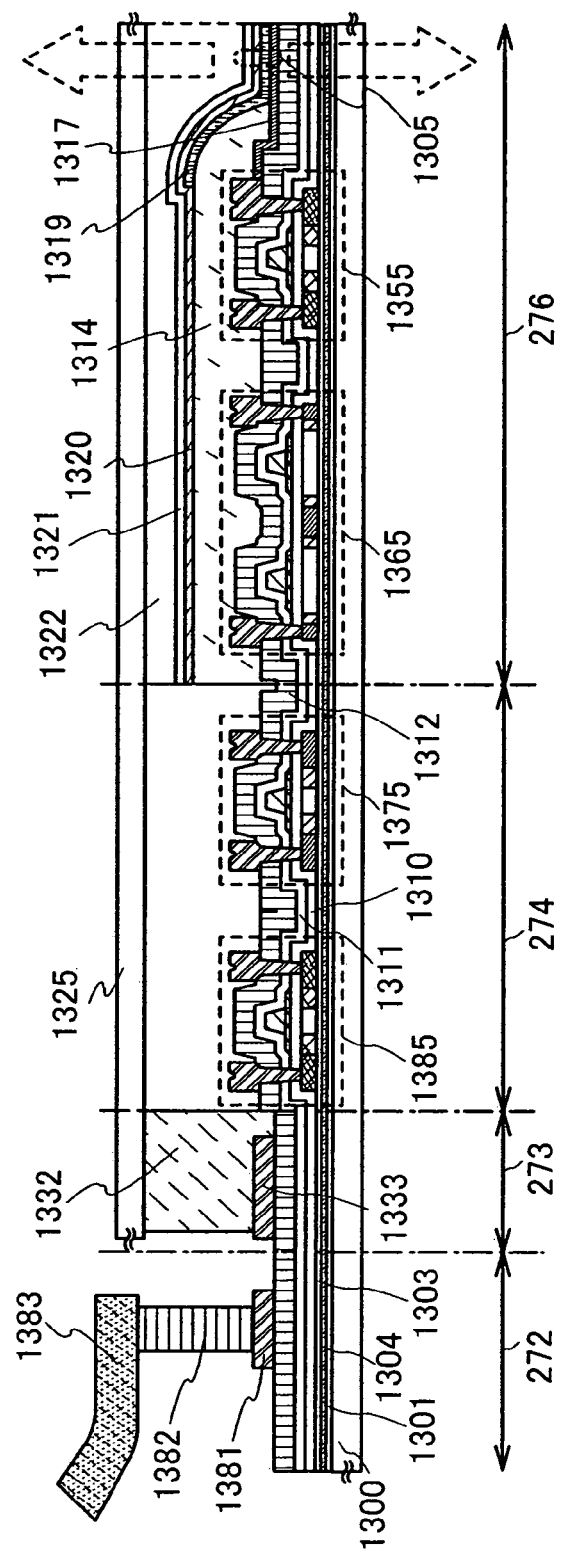
FIG. 10 is a view showing a semiconductor device of the present invention.

A semiconductor device shown in FIG. 10 includes an element substrate 1300, a thin film transistor 1355, a thin film transistor 1365, a thin film transistor 1375, a thin film transistor 1385, a first electrode layer 1317, a light-emitting layer 1319, a second electrode layer 1320, a light-emitting element 1305, a protective film 1321, a filler 1322, a sealant 1332, a blocking layer 1301, an insulating layer 1304, an oxide film 1303, a gate insulating layer 1310, an insulating film 1311, an insulating film 1312, an insulating layer 1314, a sealing substrate 1325, a wiring layer 1333, a terminal electrode layer 1381, an anisotropic conductive layer 1382, and an FPC 1383. The semiconductor device includes an external terminal connection region 272, a sealing region 273, a driver circuit region 274, and a pixel region 276.

The semiconductor device shown in FIG. 10 is dual-emission type and has a structure in which light is emitted in directions indicated by arrows from both the element substrate 1300 side and the sealing substrate 1325 side. Therefore, a light-transmitting electrode layer is used as each of the first electrode layer 1317 and the second electrode layer 1320.

In this embodiment mode, the first electrode layer 1317 and the second electrode layer 1320, which are light-transmitting electrode layers, may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Further, when a material such as a metal film having no light-transmitting property is formed thin (preferably a thickness of approximately 5 to 30 nm) so as to be able to transmit light, light can be emitted through the first electrode layer 1317 and the second electrode layer 1320. As a metal thin film which can be used for the first electrode layer 1317 and the second electrode layer 1320, a conductive film formed of titanium, tungsten, nickel, gold, platinum, silver, aluminum, magnesium, calcium, lithium, or an alloy thereof, or the like can be used.

In the above-described manner, the semiconductor device shown in FIG. 10 has a structure in which light emitted from the light-emitting element 1305 passes through the first electrode layer 1317 and the second electrode layer 1320 so that light is emitted from both sides.

A pixel of a semiconductor device which is formed using a light-emitting element can be driven by a passive matrix mode or an active matrix mode. Alternatively, either digital driving or analog driving can be employed.

A color filter (colored layer) may be formed over a sealing substrate. The color filter (colored layer) can be formed by an evaporation method or a droplet discharge method. High-definition display can also be performed using the color filter (colored layer). This is because a broad peak can be modified to be sharp in the light emission spectrum of each color of RGB by the color filter (colored layer).

Full color display can be performed by formation of a material which emits light of a single color and combination of the material with a color filter or a color conversion layer. The color filter (colored layer) or the color conversion layer may be provided for, for example, the sealing substrate, and the sealing substrate may be attached to the element substrate.

Needless to say, display of single color light emission may also be performed. For example, an area color type semiconductor device may be formed by using single color light emission. The area color type is suitable for a passive matrix display portion, and can mainly display characters and symbols.

With the use of a single-crystalline semiconductor layer, a pixel region and a driver circuit region can be formed to be integrated over the same substrate. In that case, a transistor in the pixel region and a transistor in the driver circuit region are formed simultaneously.

The transistors provided in semiconductor devices of this embodiment mode shown in FIGS. 8A and 8B, FIG. 9, and FIG. 10 can be manufactured in a manner similar to that of the transistors described in Embodiment Mode 2.

Also in any of the semiconductor devices of this embodiment mode, as described in Embodiment Mode 1, light irradiation is performed on a semiconductor layer, which is separated from a semiconductor substrate and bonded to a support substrate having an insulating surface, using light having a wavelength of 365 nm or more and 700 nm or less, and a film thickness d (nm) of the semiconductor layer which is irradiated with the light is made to satisfy $d=\lambda/2n \times m \pm \alpha$ (nm), when a light wavelength is $\lambda$ (nm), a refractive index of the semiconductor layer is n, m is a natural number greater than or equal to 1 (m=1, 2, 3, 4, ... ), and $0 \leq \alpha \leq 10$ is satisfied. By application of the present invention, the semiconductor layer can be irradiated with the light, which reflects and resonates in the semiconductor layer and which can perform heat treatment, under an optimum condition where the light absorptance of the semiconductor layer is high. Thus, an SOI substrate having a semiconductor layer with reduced crystal defects can be used.

Thus, a high-performance semiconductor device can be manufactured with high yield.

This embodiment mode can be combined with Embodiment Mode 1 described above, as appropriate.

Embodiment Mode 5

This embodiment mode will describe an example of a semiconductor device (also referred to as a display device or a light-emitting device) having a display function as a high-performance semiconductor device. Specifically, a light-emitting display device using a light-emitting element for a display element will be described.

This embodiment mode will describe structures of light-emitting elements which can be employed for display elements in the display device of the present invention with reference to FIGS. 13A to 13D.

FIGS. 13A to 13D show structures of a light-emitting element in which an EL layer 860 is sandwiched between a first electrode layer 870 and a second electrode layer 850. The EL layer 860 includes a first layer 804, a second layer 803, and a third layer 802, as shown in the drawings. In FIGS. 13A to 13D, the second layer 803 is a light-emitting layer, and the first layer 804 and the third layer 802 are functional layers.

The first layer 804 is a layer having a function of transporting holes to the second layer 803. In FIGS. 13A to 13D, a hole-injecting layer included in the first layer 804 includes a substance having a high hole-injecting property, and molybdenum oxide, vanadium oxide, ruthenium oxide, tungsten oxide, manganese oxide, or the like can be used. Alternatively, the first layer 804 can be formed using the following: a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or 4,4'-bis(N-{4-[N-(3-methylphenyl)-N-phenylamino]phenyl}-N-phenylamino)biphenyl (abbreviation: DNTPD); a macromolecule such as poly(ethylene dioxythiophene)/poly(styrenesulfonic acid) (abbreviation: PEDOT/PSS); or the like.

Further, a composite material including an organic compound and an inorganic compound can be used for the hole-injecting layer. In particular, a composite material including an organic compound and an inorganic compound showing an electron-accepting property with respect to the organic compound is excellent in a hole-injecting property and a hole-transporting property because electrons are transferred between the organic compound and the inorganic compound and carrier density is increased.

Further, in the case where a composite material including an organic compound and an inorganic compound is used for the hole-injecting layer, the hole-injecting layer can form an ohmic contact with the electrode layer; therefore, a material which forms the electrode layer can be selected regardless of the work function.

As the inorganic compound used as the composite material, an oxide of a transition metal is preferably used. In addition, an oxide of a metal belonging to Groups 4 to 8 of the periodic table can be used. Specifically, the following are preferable because an electron-accepting property is high: vanadium oxide, niobium oxide, tantalum oxide, chromium oxide, molybdenum oxide, tungsten oxide, manganese oxide, and rhenium oxide. Among them, molybdenum oxide is particularly preferable because it is stable in the atmosphere, low in hygroscopicity, and is easy to be handled.

As the organic compound used as the composite material, various compounds can be used, such as an aromatic amine compound, a carbazole derivative, aromatic hydrocarbon, or a macromolecular compound (e.g., an oligomer, a dendrimer, or a polymer). Note that as the organic compound used for the composite material, it is preferable to use an organic compound having a high hole-transporting property. Specifically, it is preferable to use a substance having a hole mobility of greater than or equal to $10^{-6}$ cm$^2$/Vs. Further, other materials may also be used as long as a hole-transporting property thereof is higher than an electron-transporting property. Examples of the organic compound which can be used for the composite material are specifically listed below.

For example, as the aromatic amine compound, the following can be given: N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As specific examples of the carbazole derivative which can be used as the composite material, the following can be given: 3-[N-(9-phenylcarbazol-3-yl)-N-phenylamino]-9-phenylcarbazole (abbreviation: PCzPCA1); 3,6-bis[N-(9-phenyl-carbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Further, the following can also be used: 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; and the like.

Further, as the aromatic hydrocarbon which can be used as the composite material, the following can be given: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used. As described above, aromatic hydrocarbon which has a hole mobility of greater than or equal to $1\times10^{-6}$ cm$^2$/Vs and has 14 to 42 carbon atoms is more preferable.

Note that the aromatic hydrocarbon which can be used as the composite material may have a vinyl skeleton. As examples of the aromatic hydrocarbon having a vinyl group, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given.

Alternatively, a macromolecular compound such as poly (N-vinylcarbazole) (abbreviation: PVK) or poly(4-vinyltriphenylamine) (abbreviation: PVTPA) can be used.

As a substance for forming a hole-transporting layer included in the first layer 804 in FIGS. 13A to 13D, a substance having a high hole-transporting property, specifically, an aromatic amine compound (that is, a compound having a benzene ring-nitrogen bond) is preferable. As examples of the material which are widely used, the following can be given: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4"-tris(N,N-diphenyl-amino)triphenylamine and 4,4',4"-tris[N-(3-methylphenyl)-N-phenylamino]triphenylamine. These substances described here are mainly substances each having a hole mobility of greater than or equal to $10^{-6}$ cm$^2$/Vs. Further, other materials may also be used as long as a hole-transporting property thereof is higher than an electron-transporting property. The hole-transporting layer is not limited to a single layer and may be a mixed layer of any of the above-described substances or a stacked layer which includes two or more layers each containing the above-described substance.

The third layer 802 has a function of transporting and injecting electrons to the second layer 803. With reference to FIGS. 13A to 13D, an electron-transporting layer included in the third layer 802 is described. As the electron-transporting layer, a substance having a high electron-transporting property can be used. For example, a layer containing a metal complex or the like including a quinoline or benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq) can be used. Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Further alternatively, besides the above metal complexes, the following can be used: 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ), bathophenanthroline (abbreviation: BPhen); bathocuproine (abbreviation: BCP); or the like. These substances described here are mainly substances each having an electron mobility of greater than or equal to $10^{-6}$ cm$^2$/Vs. Further, other substances may also be used for the electron-transporting layer as long as an electron transporting property thereof is higher than a hole transporting property. The electron-transporting layer is not limited to a single layer and may be a stacked layer which includes two or more layers each containing the above-described substance.

With reference to FIGS. 13A to 13D, an electron-injecting layer included in the third layer 802 is described. As the electron-injecting layer, a substance having a high electron-injecting property can be used. As the electron-injecting layer, an alkali metal, an alkaline earth metal, or a compound thereof such as lithium fluoride (LiF), cesium fluoride (CsF), or calcium fluoride (CaF$_2$) can be used. For example, a layer which is made of a substance having an electron-transporting property and contains an alkali metal, an alkaline earth metal, or a compound thereof, for example, a layer of Alq containing magnesium (Mg), or the like can be used. It is preferable to use the layer which is made of a substance having an electron-transporting property and contains an alkali metal or an alkaline earth metal as the electron-injecting layer, because electron injection from the electrode layer is efficiently performed by using the layer.

Next, the second layer 803 which is a light-emitting layer is described. The light-emitting layer has a function of emitting light and includes an organic compound having a light-emitting property. Alternatively, the light-emitting layer may include an inorganic compound. The light-emitting layer can be formed using various light-emitting organic compounds and inorganic compounds. The thickness of the light-emitting layer is preferably approximately 10 to 100 nm.

There are no particular limitations on the organic compound used for the light-emitting layer as long as it is a light-emitting organic compound. As the organic compound, for example, the following can be given: 9,10-di(2-naphthyl) anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidin-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. Alternatively, a compound capable of emitting phosphorescence such as bis[2-(4',6'-difluorophenyl)pyridinato-N, $C^{2'}$]iridium(picolinate) (abbreviation: FIrpic), bis{2-[3',5'-bis(trifluoromethyl)phenyl]pyridinato-N, $C^{2'}$}iridium(picolinate) (abbreviation: $Ir(CF_3ppy)_2(pic)$), tris(2-phenylpyridinato-N, $C^{2'}$)iridium (abbreviation: $Ir(ppy)_3$), bis(2-phenylpyridinato-N, $C^{2'}$)iridium(acetylacetonate) (abbreviation: $Ir(ppy)_2(acac)$), bis[2-(2'-thienyl)pyridinato-N, $C^{3'}$]iridium(acetylacetonate) (abbreviation: $Ir(thp)_2(acac)$), bis(2-phenylquinolinato-N, $C^{2'}$) iridium(acetylacetonate) (abbreviation: $Ir(pq)_2(acac)$), or bis [2-(2'-benzothienyl)pyridinato-N, $C^{3'}$]iridium (acetylacetonate) (abbreviation: $Ir(btp)_2(acac)$) can be used.

Alternatively, a triplet excitation light-emitting material containing a metal complex or the like may be used for the light-emitting layer, in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature of favorable light-emitting efficiency, so that less power is consumed to obtain the same luminance. In other words, when a triplet excitation light-emitting material is used for the pixel emitting light of red, a smaller amount of current is necessary to be applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element which emits light of green, which has high visibility for human eyes, using a triplet excitation light-emitting material.

Another organic compound may be further added to the light-emitting layer including any of the above-described organic compounds which emit light. Examples of the organic compound which can be added are TDATA, MTDATA, m-MTDAB, TPD, NPB, DNTPD, TCTA, $Alq_3$, $Almq_3$, $BeBq_2$, BAlq, $Zn(BOX)_2$, $Zn(BTZ)_2$, BPhen, BCP, PBD, OXD-7, TPBI, TAZ, p-EtTAZ, DNA, t-BuDNA, DPVBi, 4,4'-bis(N-carbazolyl)biphenyl (abbreviation: CBP), 1,3,5-tris[4-(N-carbazolyl)phenyl]benzene (abbreviation: TCPB), and the like. However, the present invention is not limited thereto. It is preferable that the organic compound which is added in addition to the organic compound which emits light have a larger excitation energy and be added in a larger amount than the organic compound which emits light, in order to make the organic compound emit light efficiently (which makes it possible to prevent concentration quenching of the organic compound). Further, as another function, the added organic compound may emit light along with the organic compound which emits light (which makes it possible to emit white light or the like).

The light-emitting layer may have a structure in which color display is performed by formation of a light-emitting layer having a different emission wavelength range for each pixel. Typically, light-emitting layers corresponding to respective colors of R (red), G (green), and B (blue) are formed. Also in this case, color purity can be improved and a pixel region can be prevented from having a mirror surface (reflection) by provision of a filter which transmits light of the emission wavelength range on the light-emission side of the pixel. By provision of the filter, a circularly polarizing plate or the like that has been conventionally considered to be necessary can be omitted, and further, the loss of light emitted from the light-emitting layer can be eliminated. Further, change in color tone, which occurs when a pixel region (display screen) is obliquely seen, can be reduced.

Either a low-molecular organic light-emitting material or a macromolecular organic light-emitting material may be used as a material which can be used for the light-emitting layer. A macromolecular organic light-emitting material has higher physical strength than a low-molecular organic light-emitting material, and an element using the macromolecular organic light-emitting material has higher durability than an element using a low-molecular organic light-emitting material. In addition, since a macromolecular organic light-emitting material can be formed by coating, an element can be formed relatively easily.

The color of light emission is determined depending on a material forming the light-emitting layer; therefore, a light-emitting element which emits light of a desired color can be formed by selecting an appropriate material for the light-emitting layer. As a macromolecular electroluminescent material which can be used for forming the light-emitting layer, a polyparaphenylene-vinylene-based material, a polyparaphenylene-based material, a polythiophene-based material, and a polyfluorene-based material can be given.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], and poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] and poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], and poly[3-(4-octylphenyl)-2, 2bithiophene] [PTOPT] can be given. As the polyfluorene-based material, a derivative of polyfluorene [PF] such as poly(9,9-dialkylfluorene) [PDAF] and poly(9,9-dioctylfluorene) [PDOF] can be given.

The inorganic compound used for the light-emitting layer may be any inorganic compound as long as light emission of the organic compound is not easily quenched by the inorganic compound, and various kinds of metal oxide and metal nitride can be used. In particular, an oxide of a metal which belongs to Group 13 or 14 of the periodic table is preferable because light emission of the organic compound is not easily quenched, and specifically, aluminum oxide, gallium oxide, silicon oxide, or germanium oxide is preferable. However, the inorganic compound is not limited thereto.

Note that the light-emitting layer may be formed by stacking a plurality of layers each containing a combination of the organic compound and the inorganic compound, which are described above, or may further contain another organic compound or inorganic compound. A layer structure of the light-emitting layer can be changed, and an electrode layer for injecting electrons may be provided or light-emitting materials may be dispersed, instead of provision of a specific electron-injecting region or light-emitting region. Such a change can be permitted unless it departs from the spirit of the present invention.

A light-emitting element formed using the above-described materials emit light by being forwardly biased. A pixel of a semiconductor device which is formed using a light-emitting element can be driven by a passive matrix mode or an active matrix mode. In either case, each pixel emits light by application of forward bias thereto at a specific timing; however, the pixel is in a non-light-emitting state for a certain period. Reliability of a light-emitting element can be improved by application of reverse bias in the non-light-emitting time. In a light-emitting element, there is a deterioration mode in which light emission intensity is decreased under a constant driving condition or a deterioration mode in which a non-light-emitting region is increased in the pixel and luminance is apparently decreased. However, progression of deterioration can be slowed down by performing alternating driving in which bias is applied forwardly and reversely; thus, reliability of a semiconductor device having a light-emitting element can be improved. In addition, either digital driving or analog driving can be applied.

A color filter (colored layer) may be provided for a sealing substrate. The color filter (colored layer) can be formed by an evaporation method or a droplet discharge method. High-definition display can be performed using the color filter (colored layer). This is because a broad peak can be modified to be sharp in a light emission spectrum of each of RGB by the color filter (colored layer).

Full color display can be performed by formation of a material which emits light of a single color and combination of the material with a color filter or a color conversion layer. The color filter (colored layer) or the color conversion layer may be provided for, for example, the sealing substrate, and the sealing substrate may be attached to the element substrate.

Needless to say, display of single color light emission may also be performed. For example, an area color type semiconductor device may be formed using single color light emission. The area color type is suitable for a passive matrix display portion, and can mainly display characters and symbols.

Figure 13A:
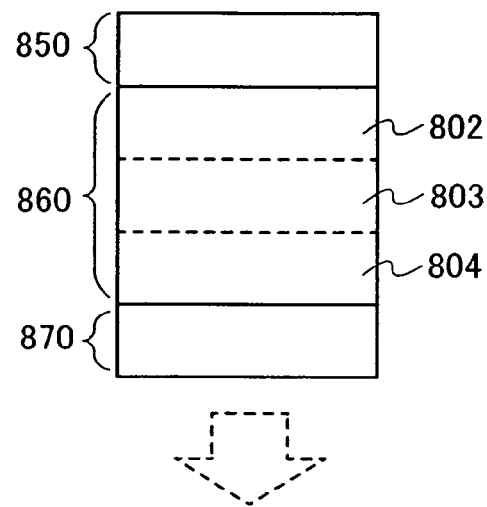
FIGS. 13A to 13D are views each showing a structure of a light-emitting element which can be applied to the present invention.
Figure 13B:
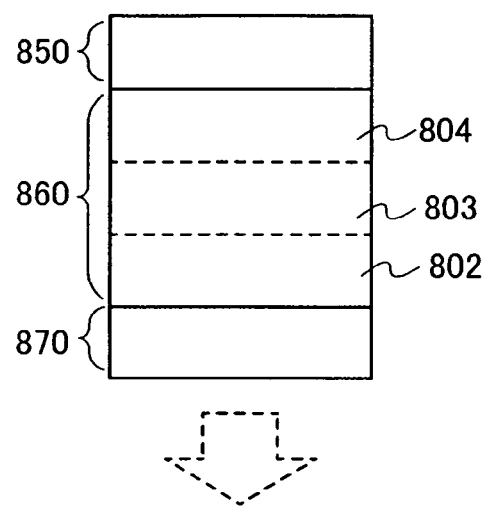

It is necessary to select materials for the first electrode layer 870 and the second electrode layer 850 in consideration of the work function. The first electrode layer 870 and the second electrode layer 850 can be either an anode (an electrode layer with high potential) or a cathode (an electrode layer with low potential) depending on the pixel structure. In the case where the polarity of a driving thin film transistor is a p-channel type, the first electrode layer 870 may serve as an anode and the second electrode layer 850 may serve as a cathode as shown in FIG. 13A. In the case where the polarity of the driving thin film transistor is an n-channel type, the first electrode layer 870 may serve as a cathode and the second electrode layer 850 may serve as an anode as shown in FIG. 13B. Materials which can be used for the first electrode layer 870 and the second electrode layer 850 are described below. It is preferable to use a material having a high work function (specifically, a material having a work function of 4.5 eV or more) for one of the first electrode layer 870 and the second electrode layer 850, which serves as an anode, and a material having a low work function (specifically, a material having a work function of 3.5 eV or less) for the other electrode layer which serves as a cathode. However, since the first layer 804 is excellent in a hole-injecting property and a hole-transporting property and the third layer 802 is excellent in an electron-injecting property and an electron-transporting property, both the first electrode layer 870 and the second electrode layer 850 are scarcely restricted by the work function, and various materials can be used.

The light-emitting elements in FIGS. 13A and 13B each have a structure in which light is extracted from the first electrode layer 870 and thus the second electrode layer 850 does not necessarily have a light-transmitting property. The second electrode layer 850 may be formed of a film containing, as its main component, an element selected from Ti, Ni, W, Cr, Pt, Zn, Sn, In, Ta, Al, Cu, Au, Ag, Mg, Ca, Li, or Mo, or an alloy material or a compound material containing any of the above elements as its main component, such as titanium nitride, $TiSi_xN_y$, $WSi_x$, tungsten nitride, $WSi_xN_y$, or NbN, or a stacked film thereof with a total thickness of 100 to 800 nm.

In addition, when the second electrode layer 850 is formed using a light-transmitting conductive material like the material used for the first electrode layer 870, light can be extracted from the second electrode layer 850 as well, and a dual emission structure can be obtained, in which light emitted from the light-emitting element is emitted through both the first electrode layer 870 and the second electrode layer 850.

Note that the light-emitting element of the present invention can have variations by changing types of the first electrode layer 870 and the second electrode layer 850.

FIG. 13B shows the case where the EL layer 860 is formed by stacking the third layer 802, the second layer 803, and the first layer 804 in this order from the first electrode layer 870 side.

Figure 13C:
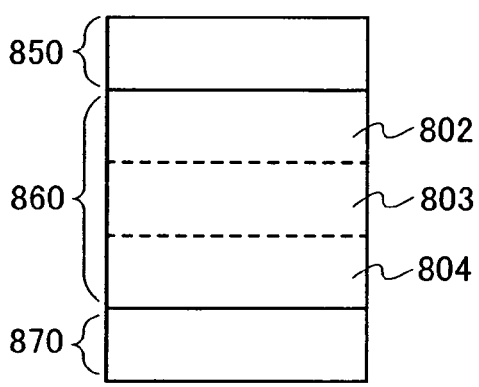
Figure 13D:
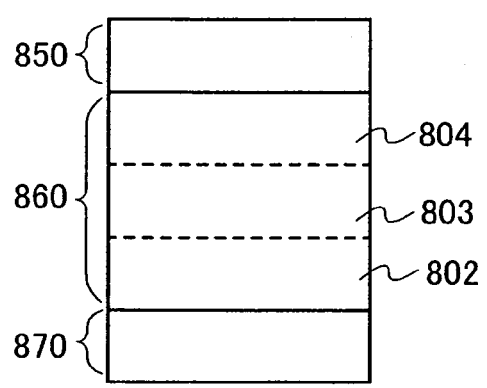

FIG. 13C shows a structure in which an electrode layer having reflectivity is used for the first electrode layer 870 and an electrode layer having a light-transmitting property is used for the second electrode layer 850 in FIG. 13A. Light emitted from the light-emitting element is reflected at the first electrode layer 870, transmitted through the second electrode layer 850, and emitted outside. In a similar manner, FIG. 13D shows a structure in which an electrode layer having reflectivity is used as the first electrode layer 870 and an electrode layer having a light-transmitting property is employed for the second electrode layer 850 in FIG. 13B. Light emitted from the light-emitting element is reflected at the first electrode layer 870, transmitted through the second electrode layer 850, and emitted outside.

Further, various methods can be employed as a method for forming the EL layer 860 when an organic compound and an inorganic compound are mixed in the EL layer 860. For example, there is a co-evaporation method for vaporizing both an organic compound and an inorganic compound by resistance heating. Alternatively, for co-evaporation, an inorganic compound may be vaporized by an electron beam (EB) while an organic compound is vaporized by resistance heating. Further alternatively, a method for sputtering an inorganic compound while vaporizing an organic compound by resistance heating to deposit the both at the same time may also be employed. Instead, the EL layer 860 may be formed by a wet method.

As a method for manufacturing the first electrode layer 870 and the second electrode layer 850, an evaporation method by resistance heating, an EB evaporation method, a sputtering method, a CVD method, a spin coating method, a printing method, a dispenser method, a droplet discharge method, or the like can be employed.

This embodiment mode can be combined with Embodiment Modes 1 and 4, as appropriate.

Also in the semiconductor device of this embodiment mode, as described in Embodiment Mode 1, light irradiation is performed on a semiconductor layer, which is separated from a semiconductor substrate and bonded to a support substrate having an insulating surface, using light having a wavelength of 365 nm or more and 700 nm or less, and a film thickness d (nm) of the semiconductor layer which is irradiated with the light is made to satisfy $d=\lambda/2n \times m \pm \alpha$ (nm), when a light wavelength is $\lambda$ (nm), a refractive index of the semiconductor layer is n, m is a natural number greater than or equal to 1 (m=1, 2, 3, 4, . . . ), and $0 \leq \alpha \leq 10$ is satisfied. By application of the present invention, the semiconductor layer can be irradiated with the light, which reflects and resonates in the semiconductor layer and which can perform heat treatment, under an optimum condition where the light absorptance of the semiconductor layer is high. Thus, an SOI substrate having a semiconductor layer with reduced crystal defects can be used.

Thus, a high-performance semiconductor device can be manufactured with high yield.

Embodiment Mode 6

This embodiment mode will describe other examples of a semiconductor device having a display function as a high-performance semiconductor device. In this embodiment mode, other structures which can be applied to the light-emitting element in the semiconductor device of the present invention will be described with reference to FIGS. 11A to 11C and FIGS. 12A to 12C.

Light-emitting elements using electroluminescence can be roughly classified into light-emitting elements which use an organic compound as a light-emitting material and light-emitting elements which use an inorganic compound as a light-emitting material. In general, the former are referred to as organic EL elements, while the latter are referred to as inorganic EL elements.

Inorganic EL elements are classified into a dispersion-type inorganic EL element and a thin-film-type inorganic EL element according to their element structures. The difference between the two EL elements lies in that the former dispersion-type inorganic EL element includes an electroluminescent layer in which particles of a light-emitting material are dispersed in a binder, while the latter thin-film-type inorganic EL element includes an electroluminescent layer made of a thin film of a light-emitting material. Although the two light-emitting elements are different in the above points, they have a common characteristic in that both require electrons that are accelerated by a high electric field. As light-emission mechanisms, there are donor-acceptor recombination type light emission which utilizes a donor level and an acceptor level, and localized type light emission which utilizes inner-shell electron transition of a metal ion. In general, donor-acceptor recombination light emission is employed in dispersion type inorganic EL elements, and localized type light emission is employed in thin-film type inorganic EL elements in many cases.

A light-emitting material which can be used in the present invention contains a base material and an impurity element which serves as a luminescence center. By changing the impurity element to be contained in the light-emitting material, light emission of various colors can be obtained. As a method of forming a light-emitting material, various methods such as a solid-phase method and a liquid-phase method (a coprecipitation method) can be employed. Alternatively, an evaporative decomposition method, a double decomposition method, a method utilizing thermal decomposition reaction of a precursor, a reversed micelle method, a method which combines any of these methods with high-temperature baking, a liquid-phase method such as a freeze-drying method, or the like can be employed.

A solid phase method is a method in which a base material, and an impurity element or a compound containing an impurity element are weighed, mixed in a mortar, heated in an electric furnace, and baked to be reacted, whereby the impurity element is contained in the base material. The baking temperature is preferably 700 to 1500° C. This is because the solid-phase reaction will not proceed when the temperature is too low, whereas the base material will be decomposed when the temperature is too high. The baking may be performed in a powder state; however, it is preferably performed in a pellet state. Although the solid-phase method requires baking at a relatively high temperature, the solid-phase method is simple. Therefore, the solid-phase method has high productivity and is suitable for mass production.

A liquid-phase method (a coprecipitation method) is a method in which a base material or a compound containing a base material, and an impurity element or a compound containing an impurity element are reacted in a solution, dried, and then baked. Particles of a light-emitting material are uniformly distributed, and the reaction can progress even when the grain size is small and the baking temperature is low.

As a base material which is used for a light-emitting material, sulfide, oxide, or nitride can be used. Examples of sulfide include zinc sulfide (ZnS), cadmium sulfide (CdS), calcium sulfide (CaS), yttrium sulfide ($Y_2S_3$), gallium sulfide ($Ga_2S_3$), strontium sulfide (SrS), and barium sulfide (BaS). Examples of oxide include zinc oxide (ZnO), and yttrium oxide ($Y_2O_3$). Examples of nitride include aluminum nitride (AlN), gallium nitride (GaN), and indium nitride (InN). Further, it is also possible to use zinc selenide (ZnSe), zinc telluride (ZnTe), or ternary mixed crystals such as calcium gallium sulfide ($CaGa_2S_4$), strontium gallium sulfide ($SrGa_2S_4$), or barium gallium sulfide ($BaGa_2S_4$).

For a luminescence center of an EL element which exhibits localized type light emission, the following can be used: manganese (Mn), copper (Cu), samarium (Sm), terbium (Th), erbium (Er), thulium (Tm), europium (Eu), cerium (Ce), praseodymium (Pr), or the like. Note that a halogen element such as fluorine (F) or chlorine (Cl) may also be added. The halogen element can function to compensate electric charge.

Meanwhile, for a luminescence center of an EL element which exhibits donor-acceptor recombination light emission, a light-emitting material containing a first impurity element which forms a donor level and a second impurity element which forms an acceptor level can be used. Examples of the first impurity element include fluorine (F), chlorine (Cl), and aluminum (Al). Meanwhile, examples of the second impurity element include copper (Cu) and silver (Ag).

In the case of synthesizing a light-emitting material of an EL element which exhibits donor-acceptor recombination light emission by a solid-phase method, the following steps are performed: weighing a base material, weighing a first impurity element or a compound containing the first impurity element, weighing a second impurity element or a compound containing the second impurity element, mixing them in a mortar, and heating and baking them in an electric furnace. As a base material, the above-described base materials can be used. As a first impurity element or a compound containing the first impurity element, fluorine (F), chlorine (Cl), aluminum sulfide ($Al_2S_3$), or the like can be used, for example. As a second impurity element or a compound containing the second impurity element, copper (Cu), silver (Ag), copper sulfide ($Cu_2S$), silver sulfide ($Ag_2S$), or the like can be used, for example. The baking temperature is preferably 700 to 1500° C. This is because the solid-phase reaction will not proceed when the temperature is too low, whereas the base material will be decomposed when the temperature is too high. The baking may be performed in a powder state; however, it is preferably performed in a pellet state.

In the case of performing solid-phase reaction, it is also possible to use a compound containing the first impurity element and the second impurity element as the impurity element. In this case, the impurity elements can be easily diffused and solid-phase reaction can easily proceed; therefore, a uniform light-emitting material can be obtained. Further, since unnecessary impurity elements are not mixed, a light-emitting material with high purity can be obtained. As the compound containing the first impurity element and the second impurity element, copper chloride (CuCl), silver chloride (AgCl), or the like can be used.

Note that the concentration of the impurity element with respect to the base material may be 0.01 to 10 atomic %, preferably 0.05 to 5 atomic %.

With regard to a thin-film-type inorganic EL element, an electroluminescent layer contains the above-described light-emitting material and can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low pressure hydride transport CVD method, an atomic layer epitaxy (ALE) method, or the like.

Figure 11A:
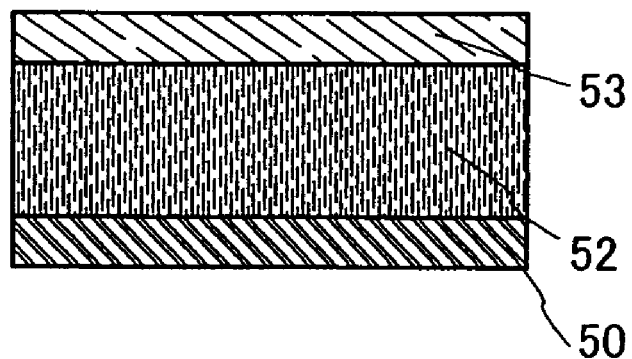
FIGS. 11A to 11C are views each showing a structure of a light-emitting element which can be applied to the present invention.
Figure 11B:
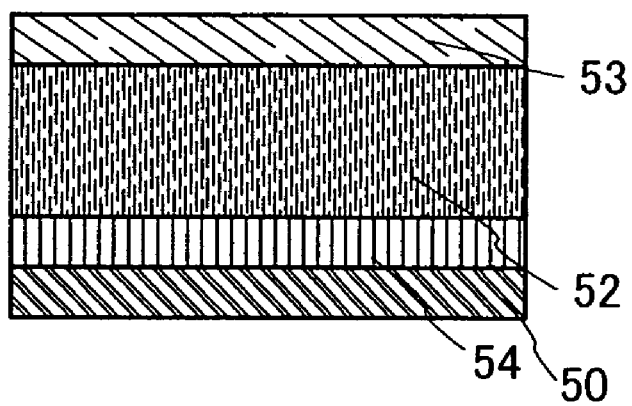
Figure 11C:
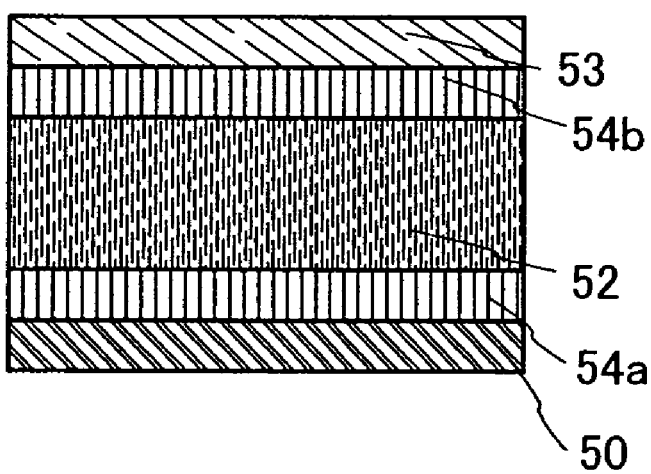

FIGS. 11A to 11C show examples of a thin-film-type inorganic EL element which can be used as a light-emitting element. Each of the light-emitting elements shown in FIGS. 11A to 11C includes a first electrode layer 50, an electroluminescent layer 52, and a second electrode layer 53.

The light-emitting elements shown in FIGS. 11B and 11C each have a structure in which an insulating layer is provided between the electrode layer and the electroluminescent layer of the light-emitting element shown in FIG. 11A. The light-emitting element shown in FIG. 11B has an insulating layer 54 between the first electrode layer 50 and the electroluminescent layer 52. The light-emitting element shown in FIG. 11C has an insulating layer 54a between the first electrode layer 50 and the electroluminescent layer 52, and an insulating layer 54b between the second electrode layer 53 and the electroluminescent layer 52. As described above, the insulating layer may be provided between the electroluminescent layer and one or both of the pair of electrode layers. In addition, the insulating layer may have either a single layer or a stacked layer including a plurality of layers.

Although the insulating layer 54 is provided to be in contact with the first electrode layer 50 in FIG. 11B, the insulating layer 54 may also be provided to be in contact with the second electrode layer 53 by reversing the order of the insulating layer and the electroluminescent layer.

In the case of forming a dispersion-type inorganic EL element, a film-form electroluminescent layer is formed by dispersing particles of a light-emitting material in a binder. When particles with a desired size cannot be sufficiently obtained by a method of forming a light-emitting material, the material may be processed into particulate forms by being ground in a mortar or the like. A binder is a substance for fixing particles of a light-emitting material in a dispersed state in order to keep the shape of the electroluminescent layer. Light-emitting materials are uniformly dispersed and fixed in the electroluminescent layer by the binder.

The electroluminescent layer of the dispersion-type inorganic EL element can be formed by a droplet discharge method by which an electroluminescent layer can be selectively formed, a printing method (e.g., screen printing or offset printing), a coating method such as a spin coating method, a dipping method, a dispenser method, or the like. The thickness of the electroluminescent layer is not limited to a specific value; however, it is preferably in the range of 10 to 1000 nm. In the electroluminescent layer which contains a light-emitting material and a binder, the percentage of the light-emitting material may be greater than or equal to 50 wt % and less than or equal to 80 wt %.

Figure 12A:
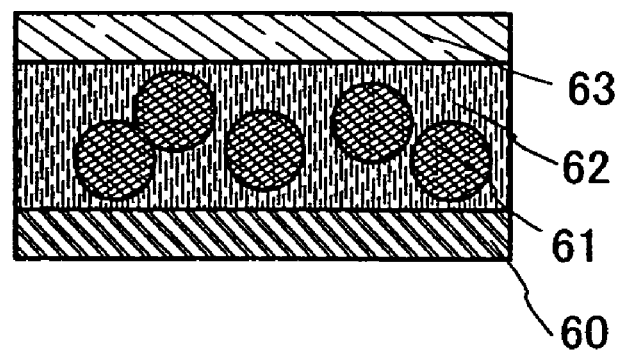
FIGS. 12A to 12C are views each showing a structure of a light-emitting element which can be applied to the present invention.
Figure 12B:
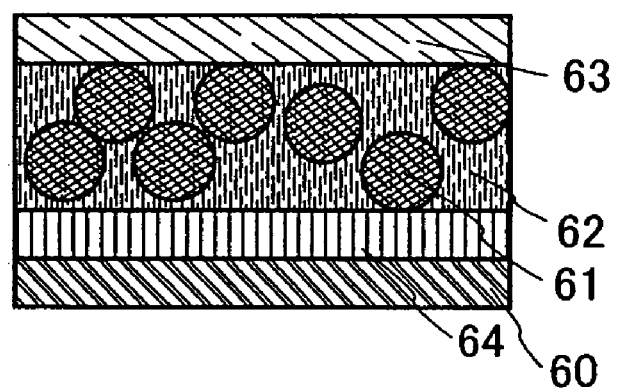
Figure 12C:
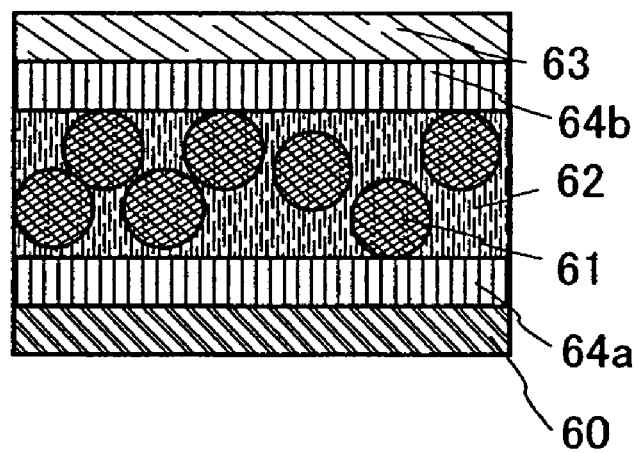

FIGS. 12A to 12C show examples of a dispersion-type inorganic EL element which can be used as a light-emitting element. The light-emitting element shown in FIG. 12A has a structure in which a first electrode layer 60, an electroluminescent layer 62, and a second electrode layer 63 are stacked, and the electroluminescent layer 62 contains a light-emitting material 61 fixed by a binder.

As a binder which can be used in this embodiment mode, an organic material, an inorganic material, or a mixed material of an organic material and an inorganic material may be used. As an organic material, the following resins can be used: a polymer having a relatively high dielectric constant such as a cyanoethyl cellulose based resin, a polyethylene resin, a polypropylene resin, a polystyrene based resin, a silicone resin, an epoxy resin, or vinylidene fluoride. Further, it is also possible to use heat-resistant macromolecule such as aromatic polyamide or polybenzimidazole, or a siloxane resin. Note that a siloxane resin has the bond of Si—O—Si. Siloxane has a skeleton structure with the bond of silicon (Si) and oxygen (O). As a substituent, an organic group containing at least hydrogen (e.g., an alkyl group or aromatic hydrocarbon) is used. Further, a fluoro group may be used for the substituent, or both a fluoro group and an organic group containing at least hydrogen may be used for the substituent. Further, it is also possible to use a resin material such as a vinyl resin (e.g., polyvinyl alcohol or polyvinyl butyral), a phenol resin, a novolac resin, an acrylic resin, a melamine resin, a urethane resin, or an oxazole resin (e.g., polybenzoxazole). When high-dielectric-constant microparticles of, for example, barium titanate ($BaTiO_3$) or strontium titanate ($SrTiO_3$) are mixed as appropriate into any of the above-described resins, the dielectric constant of the material can also be adjusted.

As an inorganic material contained in the binder, a material selected from any of the following can be used: silicon oxide, silicon nitride, silicon containing oxygen and nitrogen, aluminum nitride, aluminum containing oxygen and nitrogen, aluminum oxide, titanium oxide, $BaTiO_3$, $SrTiO_3$, lead titanate, potassium niobate, lead niobate, tantalum oxide, barium tantalate, lithium tantalate, yttrium oxide, zirconium oxide, ZnS, or other substances containing an inorganic material. When a high-dielectric-constant inorganic material is mixed into an organic material (by addition or the like), it becomes possible to control the dielectric constant of the electroluminescent layer which contains a light-emitting material and a binder more efficiently, whereby the dielectric constant can be further increased.

In the manufacturing process, light-emitting materials are dispersed in a solution containing a binder. As a solvent of the solution containing a binder which can be used in this embodiment mode, a solvent may be selected, as appropriate, in which a binder material can be dissolved and with which a solution having a viscosity suitable for a method for forming the electroluminescent layer (various wet processes) and a desired film thickness can be formed. An organic solvent or the like can be used. For example, when a siloxane resin is used for a binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements shown in FIGS. 12B and 12C each have a structure in which an insulating layer is provided between the electrode layer and the electroluminescent layer of the light-emitting element shown in FIG. 12A. The light-emitting element shown in FIG. 12B has an insulating layer 64 between the first electrode layer 60 and the electroluminescent layer 62. The light-emitting element shown in FIG. 12C has an insulating layer 64a between the first electrode layer 60 and the electroluminescent layer 62, and an insulating layer 64b between the second electrode layer 63 and the electroluminescent layer 62. As described above, the insulating layer may be provided between the electroluminescent layer and one or both of the pair of electrode layers. In addition, the insulating layer may have either a single layer or a stacked layer including a plurality of layers.

In addition, although the insulating layer 64 is provided to be in contact with the first electrode layer 60 in FIG. 12B, the insulating layer 64 may also be provided to be in contact with the second electrode layer 63 by reversing the order of the insulating layer and the electroluminescent layer.

Although the insulating layers 54, 54a, and 54b shown in FIGS. 11B and 11C, and the insulating layers 64, 64a, and 64b shown in FIGS. 12B and 12C are not particularly limited to certain types, a preferable insulating layer has a high withstand voltage and dense film quality, and more preferably has a high dielectric constant. For example, the following materials can be used: silicon oxide, yttrium oxide, titanium oxide, aluminum oxide, hafnium oxide, tantalum oxide, barium titanate, strontium titanate, lead titanate, silicon nitride, zirconium oxide, or the like. Further, a mixed film of such materials or a stacked film of two or more layers using such materials can also be used. The insulating films can be formed by sputtering, evaporation, CVD, or the like. Further, it is also possible to form an insulating layer by dispersing particles of an insulating material in a binder. The binder material may be formed using a material and method similar to those of the binder contained in the electroluminescent layer. Although the thickness of such insulating layers is not particularly limited, it is preferably in the range of 10 to 1000 nm.

The light-emitting element shown in this embodiment mode emits light when a voltage is applied between the pair of electrode layers which sandwich the electroluminescent layer, and can be operated by either DC driving or AC driving.

This embodiment mode can be combined with Embodiment Modes 1 and 4, as appropriate.

Also in the semiconductor device of this embodiment mode, as described in Embodiment Mode 1, light irradiation is performed on a semiconductor layer, which is separated from a semiconductor substrate and bonded to a support substrate having an insulating surface, using light having a wavelength of 365 nm or more and 700 nm or less, and a film thickness d (nm) of the semiconductor layer which is irradiated with the light is made to satisfy $d=\lambda/2n \times m \pm \alpha$ (nm), when a light wavelength is $\lambda$ (nm), a refractive index of the semiconductor layer is n, m is a natural number greater than or equal to 1 (m=1, 2, 3, 4, ... ), and $0 \leq \alpha \leq 10$ is satisfied. By application of the present invention, the semiconductor layer can be irradiated with the light, which reflects and resonates in the semiconductor layer and which can perform heat treatment, under an optimum condition where the light absorptance of the semiconductor layer is high. Thus, an SOI substrate having a semiconductor layer with reduced crystal defects can be used.

Thus, a high-performance semiconductor device can be manufactured with high yield.

Embodiment Mode 7

A television device can be completed using a semiconductor device having a display element, which is formed by the present invention. An example of a television device which is intended to have high performance will be described.

Figure 16:
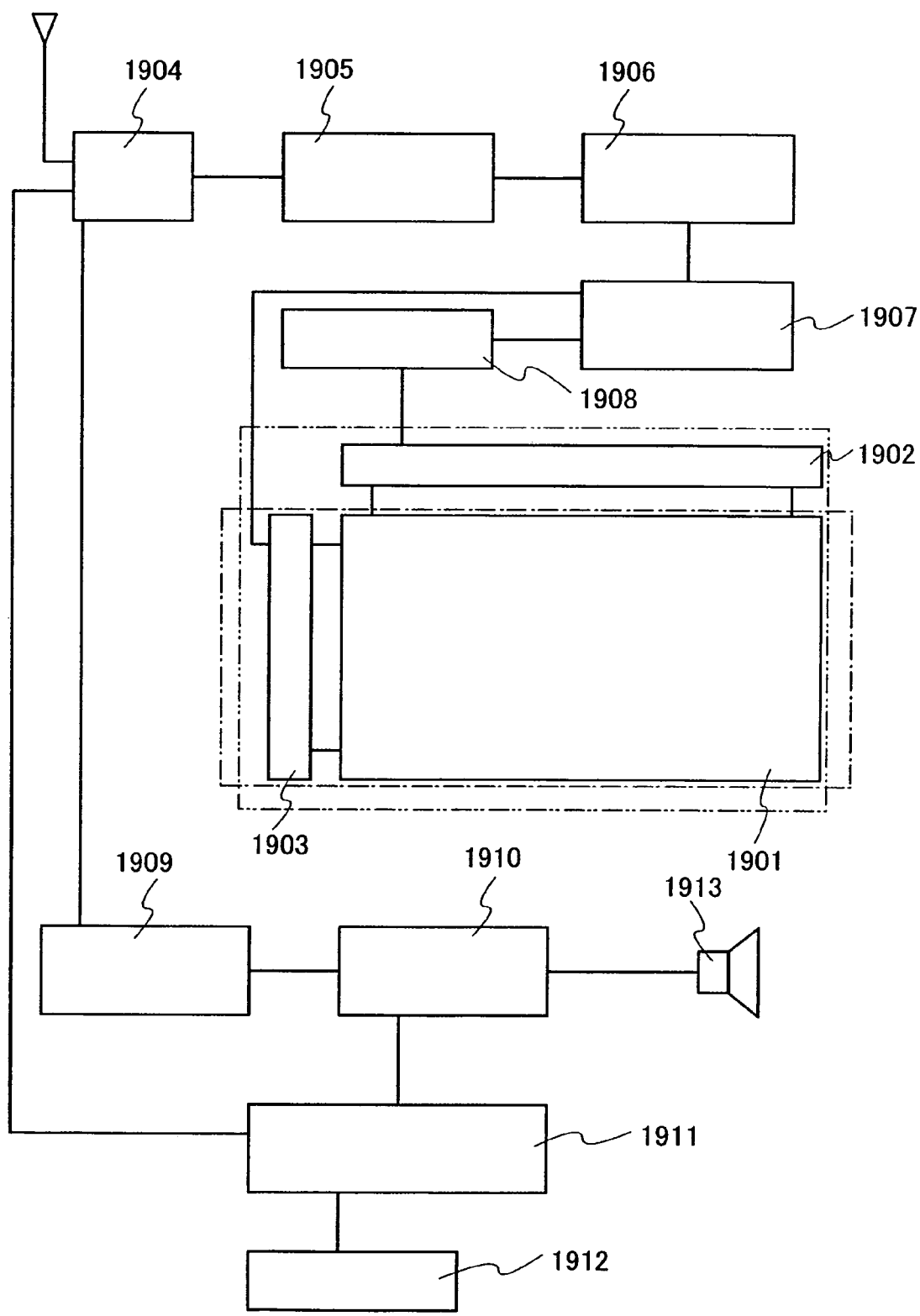
FIG. 16 is a block diagram showing a main configuration of an electronic device to which the present invention is applied.

FIG. 16 is a block diagram showing a main configuration of a television device (e.g., a liquid crystal television device or an EL television device).

As for the structures of other external circuits, a video signal amplifier circuit 1905 for amplifying video signals among signals received at a tuner 1904, a video signal processing circuit 1906 for converting signals outputted from the video signal amplifier circuit 1905 into color signals corresponding to red, green, and blue, a control circuit 1907 for converting the video signals into an input specification of the driver ICs, and the like are provided on the input side of the video signals. The control circuit 1907 outputs signals to each of the scanning line side and the signal line side. In the case of digital driving, a signal divider circuit 1908 may be provided on the signal line side so that input digital signals are divided into m pieces to be supplied.

Audio signals among the signals received at the tuner 1904 are transmitted to an audio signal amplifier circuit 1909, and an output thereof is supplied to a speaker 1913 through an audio signal processing circuit 1910. A control circuit 1911 receives control data on the receiving station (reception frequency) or sound volume from an input portion 1912, and transmits signals to the tuner 1904 and the audio signal processing circuit 1910.

Figure 20A:
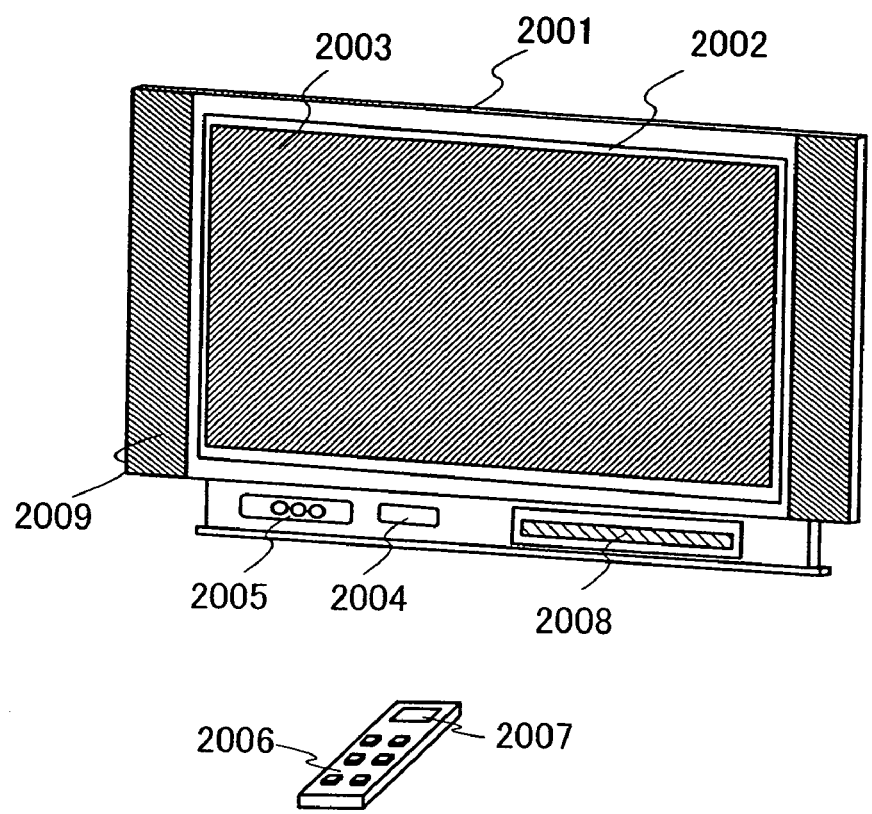
FIGS. 20A and 20B are views each showing an electronic device to which the present invention is applied.
Figure 20B:
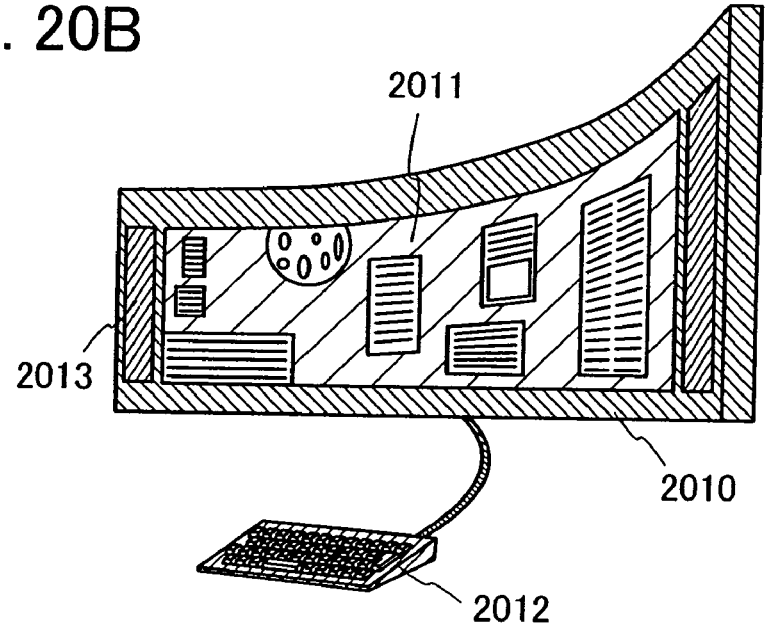
Figure 21A:
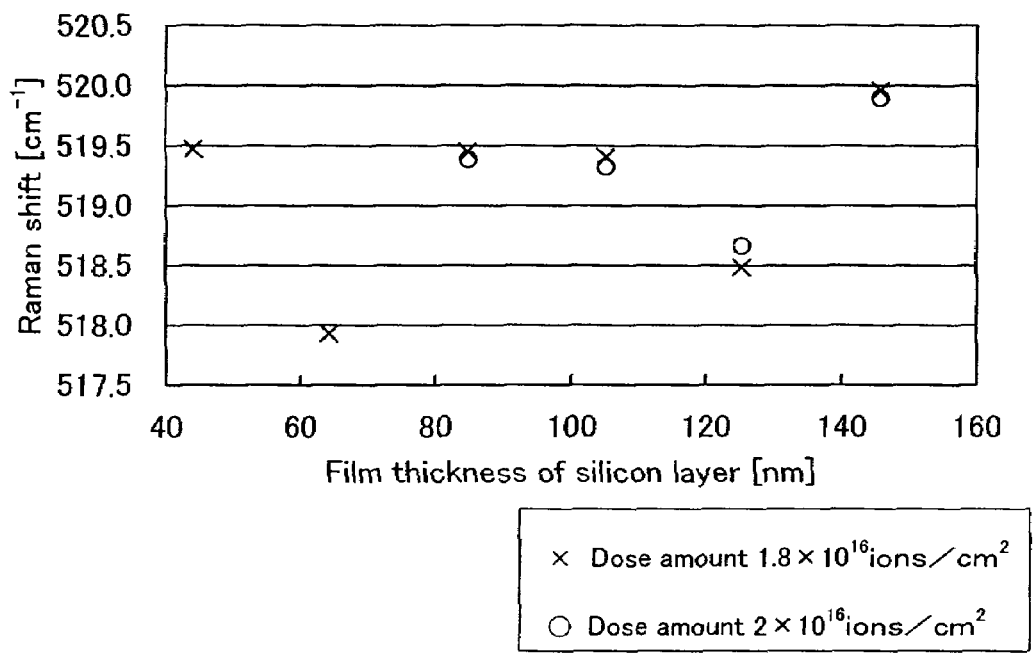
FIGS. 21A and 21B are graphs showing the results of Raman spectroscopy.
Figure 21B:
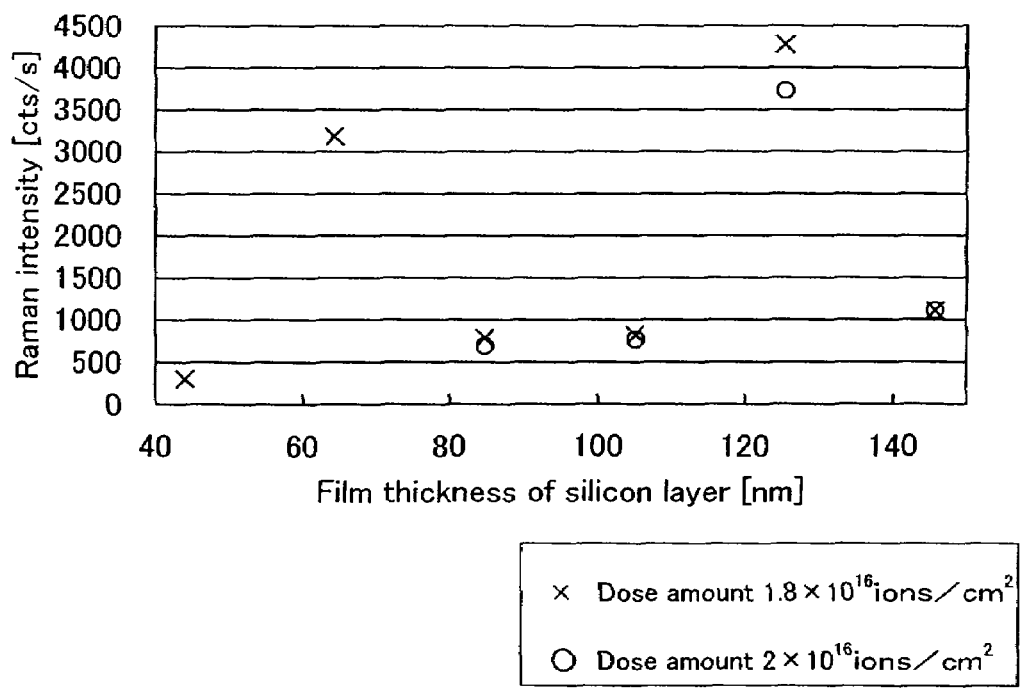

By incorporating a display module into a housing as shown in FIGS. 20A and 20B, a television device can be completed. A display panel in which components up to an FPC are set as shown in FIGS. 8A and 8B is generally called an EL display module. When an EL display module as shown in FIGS. 8A and 8B is used, an EL television device can be completed, and when a liquid crystal display module as shown in FIGS. 7A and 7B is used, a liquid crystal television device can be completed. With the use of a display module, a main display screen 2003 is formed, and other accessories such as speaker portions 2009 and operation switches are provided. In this manner, a television device can be completed according to the present invention.

In addition, reflected light of incident light from external may be blocked with the use of a retardation plate or a polarizing plate. In a top-emission semiconductor device, an insulating layer serving as a partition wall may be colored to be used for a black matrix. The partition wall can also be formed by a droplet discharge method or the like. Carbon black or the like may be mixed into a black resin of a pigment material or a resin material such as polyimide, or a stacked layer thereof may be used. By a droplet discharge method, different materials may be discharged to the same region plural times to form the partition wall. A quarter wave plate ($\lambda/4$) or a half wave plate ($\lambda/2$) may be used as the retardation plate and may be designed to be able to control light. As the structure, the light-emitting element, the sealing substrate (sealant), the retardation plates (a quarter wave plate ($\lambda/4$) and a half wave plate ($\lambda/2$)), and the polarizing plate are formed over a TFT element substrate in this order, and light emitted from the light-emitting element is transmitted therethrough and is emitted to the outside from the polarizing plate side. The retardation plate or the polarizing plate may be provided on a side to which light is emitted or may be provided on both sides in the case of a dual-emission semiconductor device in which light is emitted from the both sides. In addition, an antireflective film may be provided on the outer side of the polarizing plate. Accordingly, high-definition and precise images can be displayed.

A display panel 2002 using a display element is incorporated into a housing 2001 as shown in FIG. 20A. In addition to reception of general TV broadcast with the use of a receiver 2005, communication of information can also be performed in one way (from a transmitter to a receiver) or in two ways (between a transmitter and a receiver or between receivers) by connection to a wired or wireless communication network through a modem 2004. The television device can be operated with switches incorporated in the housing or with a remote control device 2006 separated from the main body. A display portion 2007 which displays information to be outputted may also be provided for the remote control device.

In addition, for the television device, a structure for displaying a channel, sound volume, or the like may be additionally provided by formation of a sub-screen 2008 with a second display panel in addition to the main screen 2003. In this structure, the main screen 2003 may be formed using an EL display panel excellent in viewing angle, and the sub-screen 2008 may be formed using a liquid crystal display panel capable of displaying with low power consumption. In order to prioritize low power consumption, a structure in which the main screen 2003 is formed using a liquid crystal display panel, the sub-screen 2008 is formed using an EL display panel, and the sub-screen 2008 is able to flash on and off may be employed. By the present invention, a semiconductor device with high performance and high reliability can be manufactured with high productivity even with the use of such a large-sized substrate with a number of TFTs and electronic components.

FIG. 20B shows a television device which has a large display portion, for example, 20 to 80-inch display portion and includes a housing 2010, a keyboard portion 2012 which is an operation portion, a display portion 2011, a speaker portion 2013, and the like. The present invention is applied to manufacture of the display portion 2011. The display portion in FIG. 20B is formed using a bendable material; therefore, the television device has the bent display portion. Since the shape of the display portion can be freely set, a television device having a desired shape can be manufactured.

According to the present invention, a high-performance semiconductor device having a display function can be manufactured with high productivity. Therefore, a high-performance television device can be manufactured with high productivity.

The present invention is certainly not limited to the television device and is also applicable to various usages such as a monitor of a personal computer and a display medium having a large area, for example, an information display board at a train station, an airport, or the like, or an advertisement display board on the street.

Embodiment Mode 8

This embodiment mode will describe an example of a semiconductor device which is intended to have high performance. Specifically, as examples of the semiconductor device, examples of a microprocessor and a semiconductor device which has an arithmetic function and can transmit and receive data without contact will be described.

Figure 17:
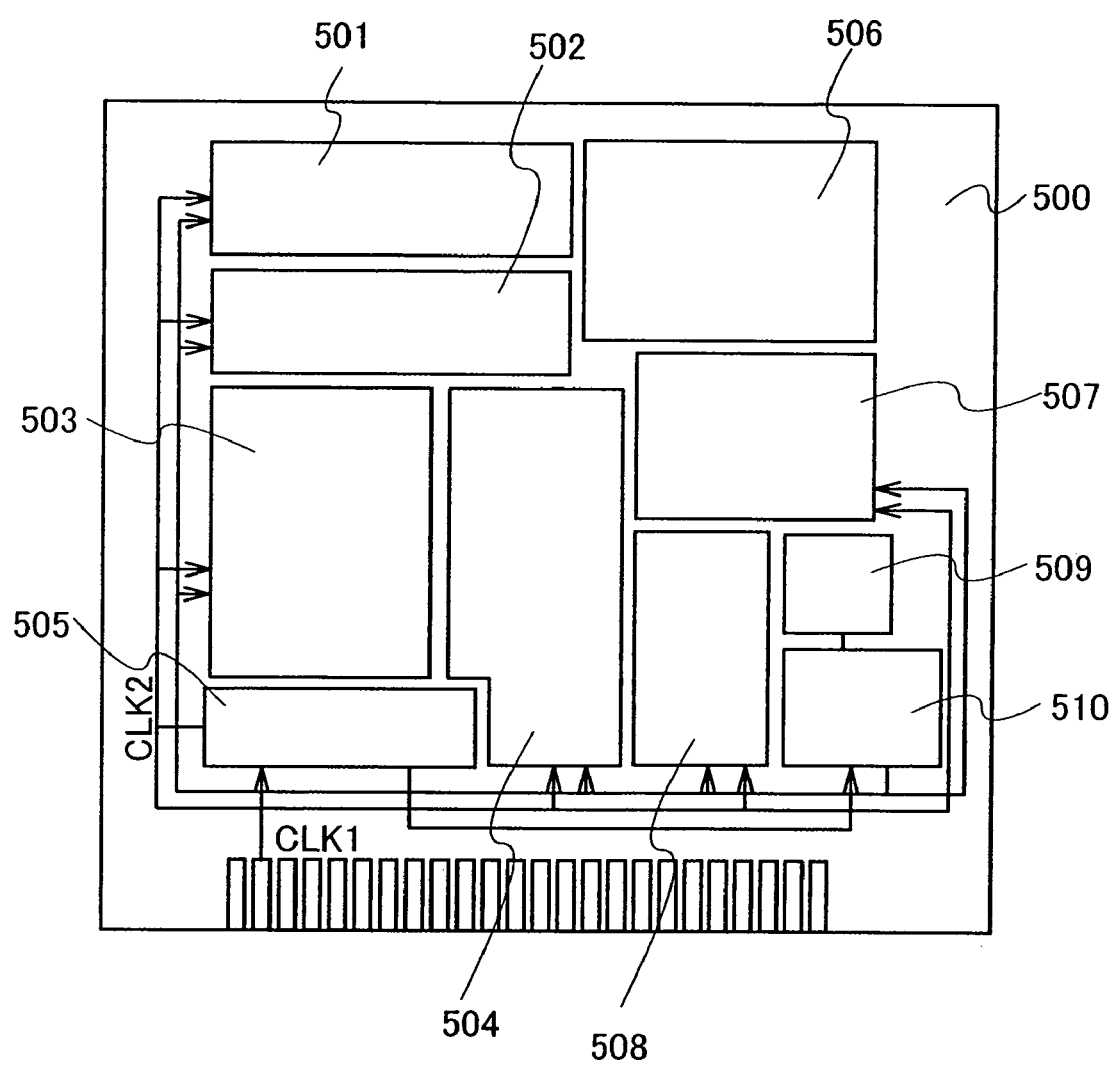
FIG. 17 is a block diagram showing a configuration of a microprocessor which is obtained from a semiconductor substrate.

FIG. 17 shows a microprocessor 500 as an example of a semiconductor device. As described above, the microprocessor 500 is manufactured using the semiconductor substrate of the present invention. The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction inputted to the microprocessor 500 through the bus interface 508 is inputted to the instruction decoder 503 and decoded. Then, the instruction is inputted to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 depending on the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. Note that the microprocessor 500 shown in FIG. 17 is just an example of the simplified structure, and practical microprocessors have various structures depending on usage.

Since an integrated circuit is formed using a single-crystalline semiconductor layer whose crystals are oriented in a certain direction and which is bonded over a glass substrate in such a microprocessor 500, high processing speed and low power consumption can be achieved.

Figure 18:
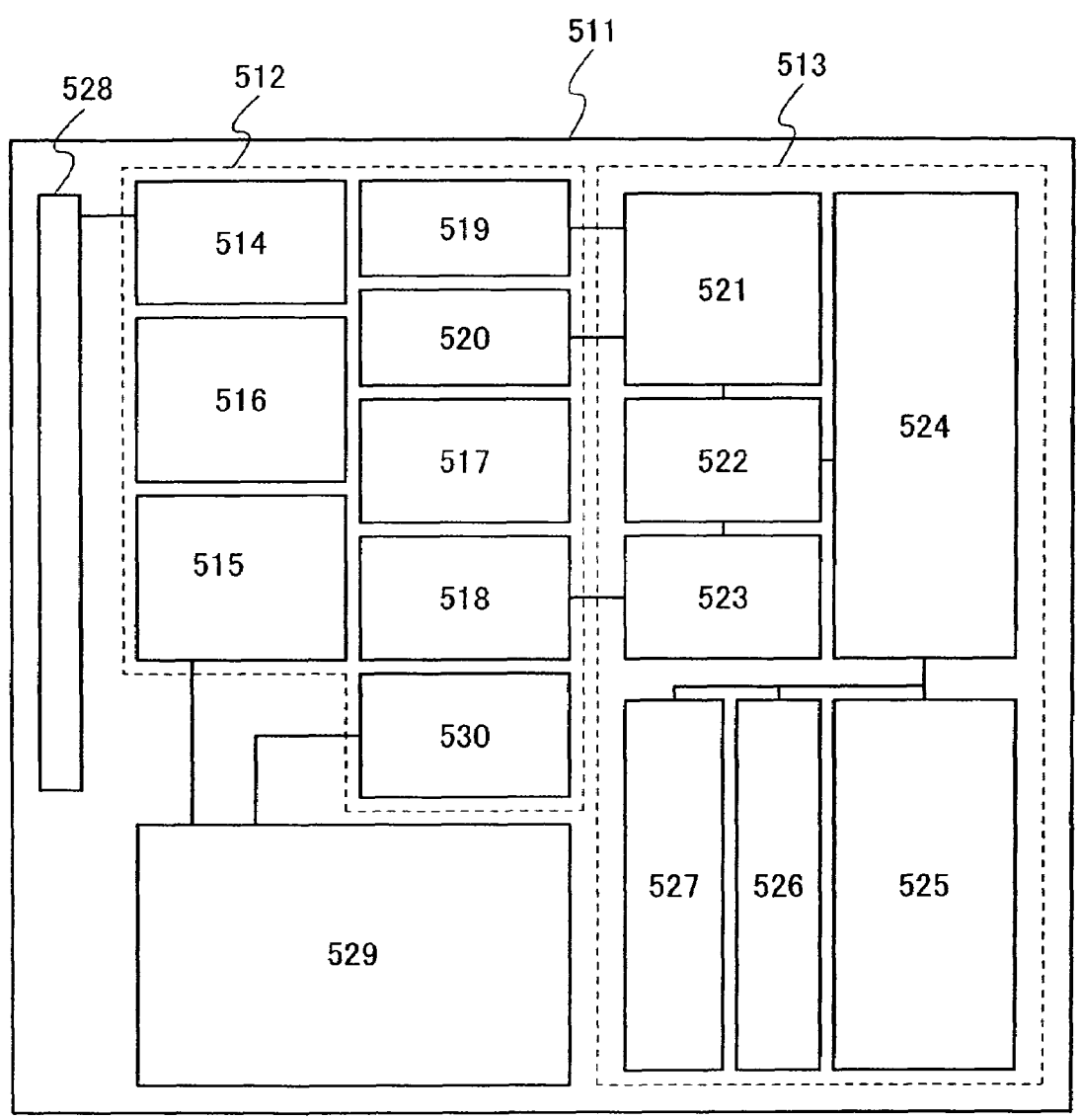
FIG. 18 is a block diagram showing a configuration of an RFCPU which is obtained from a semiconductor substrate.

Next, an example of a semiconductor device which has an arithmetic function and can transmit and receive data without contact is described with reference to FIG. 18. FIG. 18 shows an example of a computer (hereinafter also referred to as an RFCPU) which transmits and receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and the power supply control circuit 530. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is roughly described below. The resonance circuit 514 generates induced electromotive force based on a signal received at an antenna 528. The induced electromotive force is stored in a capacitor portion 529 through the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface which partially constitutes the RFCPU 511.

The reset circuit 517 generates a signal which resets the digital circuit portion 513 to be initialized. For example, the reset circuit 517 generates, as a reset signal, a signal which rises with delay after increase in the power supply voltage. The oscillator circuit 518 changes the frequency and the duty ratio of a clock signal depending on a control signal generated by the constant voltage circuit 516. The demodulation circuit 519 having a low pass filter, for example, binarizes changes in amplitude of reception signals of an amplitude shift keying (ASK) system of transmission data. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 generates a control signal for changing the frequency and the duty ratio of the clock signal depending on the power supply voltage or current consumption in the central processing unit 525. The power supply voltage is monitored by the power supply control circuit 530.

A signal which is inputted to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 through the CPU interface 524. The CPU interface 524 has a function of generating an access signal for any one of the read only memory 527, the random access memory 526, and the control register 522 in accordance with an address requested by the central processing unit 525.

As an arithmetic method of the central processing unit 525, a method may be employed in which the read only memory 527 stores an OS (operating system) and a program is read at the time of starting operation and then executed. Alternatively, a method may be employed in which a circuit dedicated to arithmetic is formed as an arithmetic circuit and an arithmetic processing is conducted using hardware. In a method in which both hardware and software are used, a method can be employed in which part of process is conducted in the circuit dedicated to arithmetic and the other part of the arithmetic process is conducted by the central processing unit 525, using a program.

Since an integrated circuit is formed using a single-crystalline semiconductor layer whose crystals are oriented in a certain direction and which is bonded over a glass substrate in the RFCPU 511, high processing speed and low power consumption can be achieved. Accordingly, even when the capacitor portion 529 which supplies electric power is miniaturized, long-term operation can be secured.

Embodiment Mode 9

This embodiment mode will be described with reference to FIGS. 14A and 14B. This embodiment mode shows an example of a module using a panel including the SOI substrate or the semiconductor device manufactured in any of Embodiment Modes 1 to 8. In this embodiment mode, an example of a module having a semiconductor device which is intended to have high performance will be described.

Figure 14A:
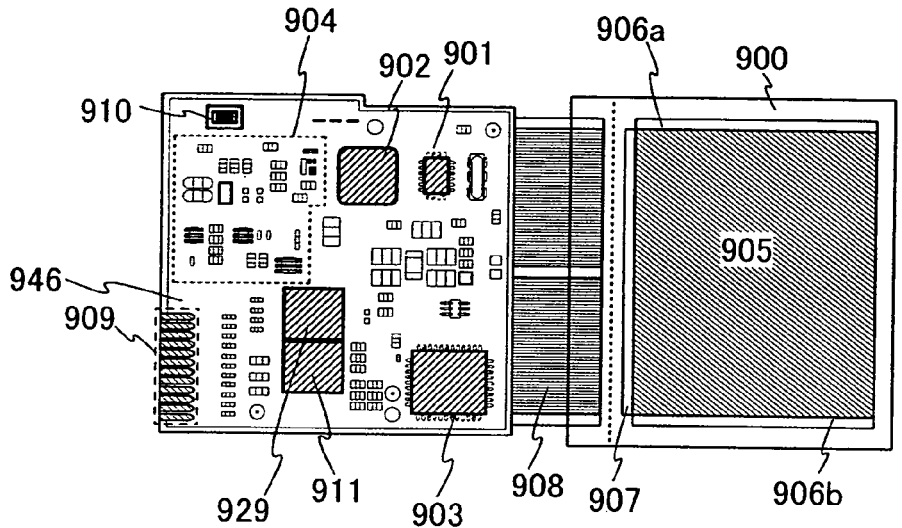
FIGS. 14A and 14B are a view and a diagram each showing an electronic device to which the present invention is applied.

A module of an information terminal shown in FIG. 14A includes a printed wiring board 946 on which a controller 901, a central processing unit (CPU) 902, a memory 911, a power supply circuit 903, an audio processing circuit 929, a transmission/reception circuit 904, and other elements such as a resistor, a buffer, and a capacitor are mounted. In addition, a panel 900 is connected to the printed wiring board 946 through a flexible printed circuit (FPC) 908.

The panel 900 is provided with a pixel region 905 having a light-emitting element in each pixel, a first scanning line driver circuit 906a and a second scanning line driver circuit 906b which select a pixel included in the pixel region 905, and a signal line driver circuit 907 which supplies a video signal to the selected pixel.

Various control signals are inputted and outputted through an interface (I/F) 909 provided over the printed wiring board 946. An antenna port 910 for transmitting and receiving signals to/from an antenna is provided over the printed wiring board 946.

In this embodiment mode, the printed wiring board 946 is connected to the panel 900 through the FPC 908; however, the present invention is not limited to this structure. The controller 901, the audio processing circuit 929, the memory 911, the CPU 902, or the power supply circuit 903 may be directly mounted on the panel 900 by a COG (chip on glass) method. Moreover, various elements such as a capacitor and a buffer are provided over the printed wiring board 946, so that a noise in power supply voltage or a signal and delay in signal rising are prevented.

Figure 14B:
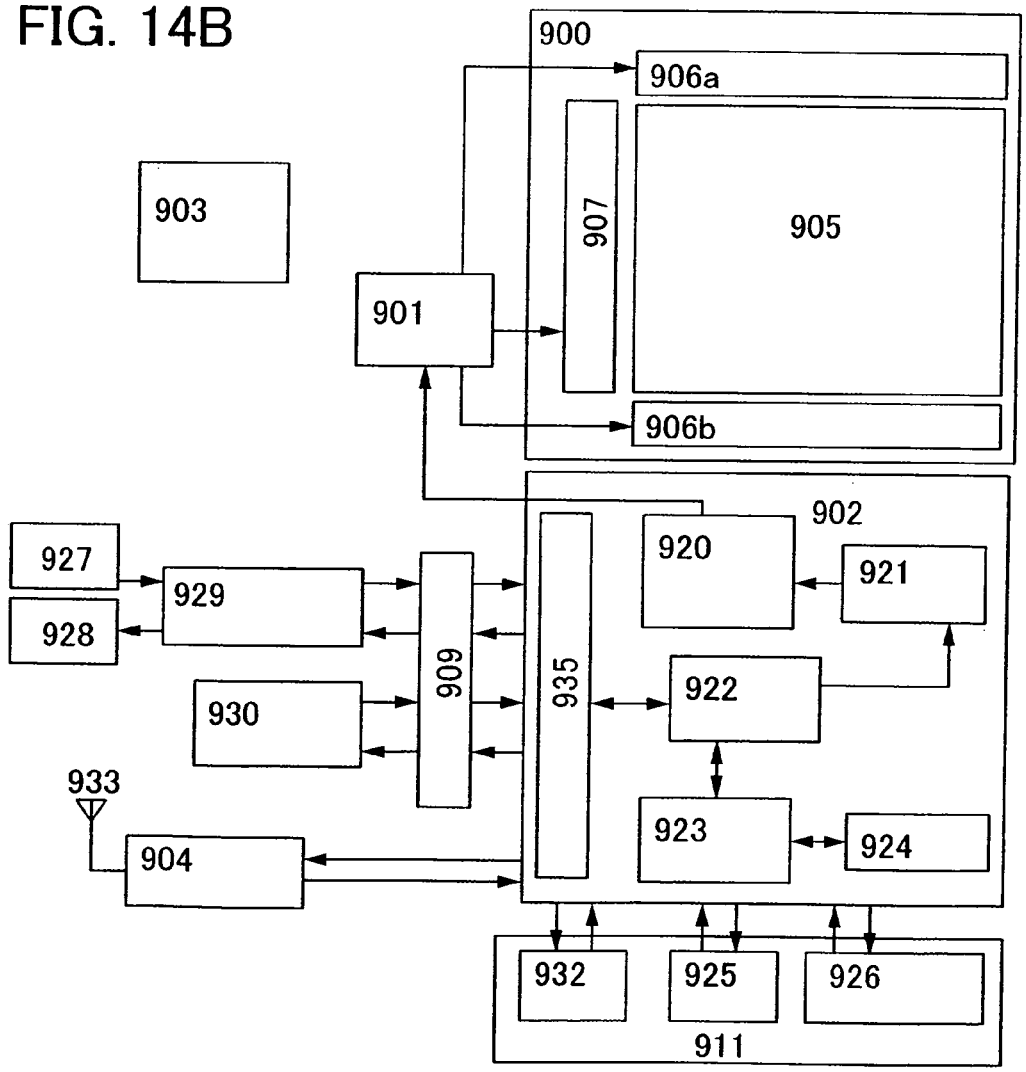

FIG. 14B is a block diagram of the module shown in FIG. 14A. A module 999 includes a VRAM 932, a DRAM 925, a flash memory 926, and the like in the memory 911. The VRAM 932 stores image data to be displayed on the panel, the DRAM 925 stores image data or audio data, and the flash memory stores various programs.

The power supply circuit 903 generates power supply voltage applied to the panel 900, the controller 901, the CPU 902, the audio processing circuit 929, the memory 911, and the transmission/reception circuit 904. Moreover, depending on the specifications of the panel, a current source is provided in the power supply circuit 903 in some cases.

The CPU 902 includes a control signal generating circuit 920, a decoder 921, a register 922, an arithmetic circuit 923, a RAM 924, an interface 935 for the CPU, and the like. Various signals inputted to the CPU 902 through the interface 935 are inputted to the arithmetic circuit 923, the decoder 921, and the like after once being held in the register 922. The arithmetic circuit 923 performs an arithmetic operation based on the inputted signal and specifies an address to which various instructions are sent. On the other hand, the signal inputted to the decoder 921 is decoded and inputted to the control signal generating circuit 920. The control signal generating circuit 920 generates a signal including various instructions based on the inputted signal and sends it to the address specified by the arithmetic circuit 923, specifically, the memory 911, the transmission/reception circuit 904, the audio processing circuit 929, the controller 901, and the like.

The memory 911, the transmission/reception circuit 904, the audio processing circuit 929, and the controller 901 operate in accordance with respective received instructions. The operations are briefly described below.

The signal inputted from an input unit 930 is transmitted to the CPU 902 mounted on the printed wiring board 946 through the interface 909. The control signal generating circuit 920 converts the image data stored in the VRAM 932 into a predetermined format in accordance with the signal transmitted from the input unit 930 such as a pointing device and a keyboard, and then transmits it to the controller 901.

The controller 901 processes a signal including image data transmitted from the CPU 902 in accordance with the specifications of the panel and supplies it to the panel 900. The controller 901 generates a Hsync signal, a Vsync signal, a clock signal CLK, alternating voltage (AC Cont), and a switching signal L/R based on the power supply voltage inputted from the power supply circuit 903 and various signals inputted from the CPU 902, and supplies them to the panel 900.

In the transmission/reception circuit 904, a signal transmitted and received as an electric wave at the antenna 933 is processed. Specifically, high frequency circuits such as an isolator, a band path filter, a VCO (voltage controlled oscillator), an LPF (low pass filter), a coupler, and a balun are included. Among the signals transmitted and received at the transmission/reception circuit 904, signals including audio data are transmitted to the audio processing circuit 929 in accordance with an instruction transmitted from the CPU 902.

The signals including audio data transmitted in accordance with the instruction from the CPU 902 are demodulated into audio signals in the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power supply circuit 903, the audio processing circuit 929, and the memory 911 can be mounted as a package of this embodiment mode. This embodiment mode can be applied to any circuit other than the high frequency circuits such as an isolator, a band path filter, a VCO (voltage controlled oscillator), an LPF (low pass filter), a coupler, and a balun.

Embodiment Mode 10

Figure 15:
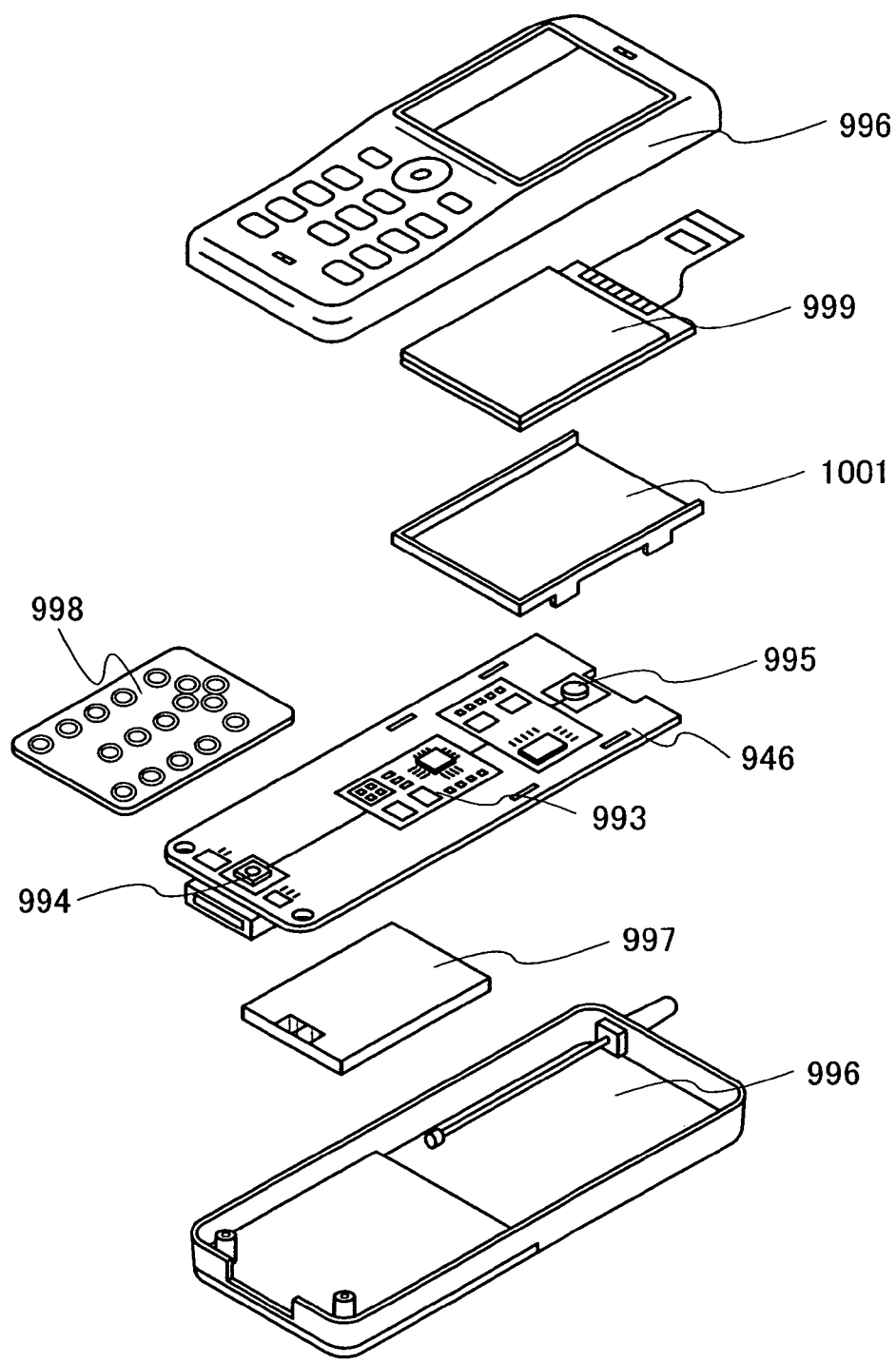
FIG. 15 is a view showing an electronic device to which the present invention is applied.

This embodiment mode will be described with reference to FIGS. 14A and 14B and FIG. 15. FIG. 15 shows one mode of a portable compact phone (mobile phone) which includes the module manufactured in Embodiment Mode 9 and operates wirelessly. The panel 900 is detachably incorporated into a housing 1001 so as to be easily combined with the module 999. The shape and the size of the housing 1001 can be changed, as appropriate, in accordance with an electronic device incorporated therein.

The housing 1001 in which the panel 900 is fixed is fitted to the printed wiring board 946 and set up as a module. A controller, a CPU, a memory, a power supply circuit, and other elements such as a resistor, a buffer, and a capacitor are mounted on the printed wiring board 946. Moreover, an audio processing circuit including a microphone 994 and a speaker 995 and a signal processing circuit 993 such as a transmission/reception circuit are provided. The panel 900 is connected to the printed wiring board 946 through the FPC 908.

The module 999 as described above, an input unit 998, and a battery 997 are stored in a housing 996. The pixel region of the panel 900 is arranged so that it can be seen through a window formed in the housing 996.

The housing 996 shown in FIG. 15 is an example of an exterior shape of a telephone. However, an electronic device related to this embodiment mode can be changed into various modes depending on functions and usage. In the following embodiment mode, examples of the modes will be described.

Embodiment Mode 11

By application of the present invention, various semiconductor devices having a display function can be manufactured. In other words, the present invention can be applied to various electronic devices in which these semiconductor devices having a display function are incorporated into display portions. In this embodiment mode, examples of electronic devices including a semiconductor device which is intended to have high performance will be described.

As such electronic devices related to the present invention, television devices (also simply referred to as televisions or television receivers), cameras such as digital cameras or digital video cameras, mobile phone sets (also simply referred to as mobile phones or cell-phones), portable information terminals such as PDAs, portable game machines, monitors for computers, computers, audio reproducing devices such as car audio systems, image reproducing devices provided with a recording medium such as home game machines (specifically, a digital versatile disc (DVD)), and the like can be given. Specific examples thereof will be described with reference to FIGS. 19A to 19E.

Figure 19A:
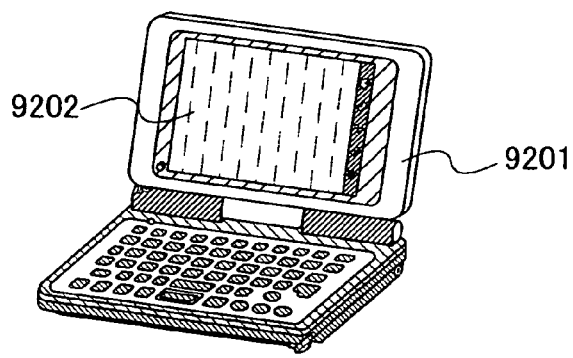
FIGS. 19A to 19E are views each showing an electronic device to which the present invention is applied.

A portable information terminal device shown in FIG. 19A includes a main body 9201, a display portion 9202, and the like. The semiconductor device of the present invention can be applied to the display portion 9202. Consequently, a high-performance portable information terminal device can be provided.

Figure 19B:
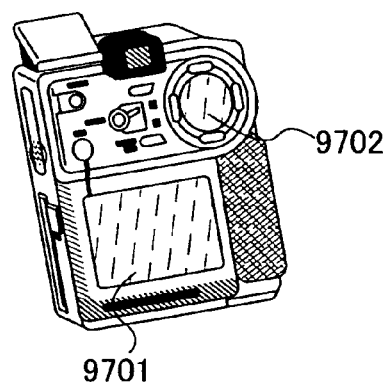

A digital video camera shown in FIG. 19B includes a display portion 9701, a display portion 9702, and the like. The semiconductor device of the present invention can be applied to the display portion 9701. Consequently, a high-performance digital video camera can be provided.

Figure 19C:
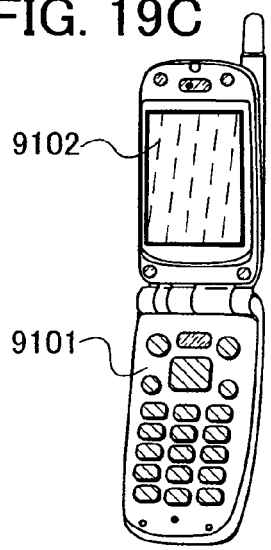

A mobile phone shown in FIG. 19C includes a main body 9101, a display portion 9102, and the like. The semiconductor device of the present invention can be applied to the display portion 9102. Consequently, a high-performance mobile phone can be provided.

Figure 19D:
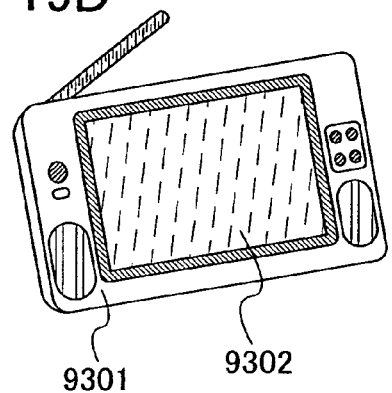

A portable television device shown in FIG. 19D includes a main body 9301, a display portion 9302, and the like. The semiconductor device of the present invention can be applied to the display portion 9302. Consequently, a high-performance portable television device can be provided. The semiconductor device of the present invention can be applied widely to various types of television devices including a small-sized television incorporated in a portable terminal such as a mobile phone, a medium-sized television which is portable, and a large-sized television (e.g., 40 inches or more in size).

Figure 19E:
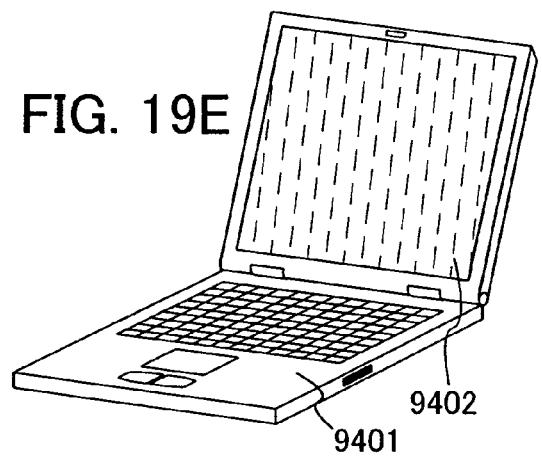

A portable computer shown in FIG. 19E includes a main body 9401, a display portion 9402, and the like. The semiconductor device of the present invention can be applied to the display portion 9402. Consequently, a high-performance portable computer can be provided.

In addition a semiconductor device of the present invention can be used as a lighting device. The display device to which the present invention is applied can also be used for a small table lamp or a large-scale lighting system in a room. Further, the display device of the present invention can also be used for a backlight of a liquid crystal display device.

In this manner, with the use of a semiconductor device of the present invention, a high-performance electronic device can be provided.

Embodiment 1

This embodiment will describe an example of controlling the film thickness of a semiconductor layer which is transferred over a support substrate.

In this embodiment, a correlation between an accelerating voltage in an ion irradiation step at formation of an embrittlement layer in a semiconductor substrate and the film thickness of a semiconductor layer which is transferred from the semiconductor substrate was evaluated.

A manufacturing method of a sample is described below. First, a silicon oxynitride film was formed with a 100 nm film thickness over a single-crystal silicon substrate, and a silicon nitride oxide film was formed with a 50 nm film thickness over the silicon oxynitride film. Then, hydrogen ion irradiation was performed to form an embrittlement layer. Further, a silicon oxide film was formed with a 50 nm film thickness as an insulating layer, and the silicon oxide film was transferred to a glass substrate to form a silicon layer.

Hydrogen ion irradiation was performed by an ion shower doping apparatus. The silicon oxynitride film and the silicon nitride oxide film were formed by a plasma CVD method, and the silicon oxide film which is an insulating layer was formed by a CVD method, using tetraethoxysilane as an organic silane gas. In the step of separating the silicon oxide film from the semiconductor substrate and transferring to a support substrate, heat treatment was performed in a vertical furnace at 200° C. for 2 hours and further at 600° C. for 2 hours.

Figure 22:
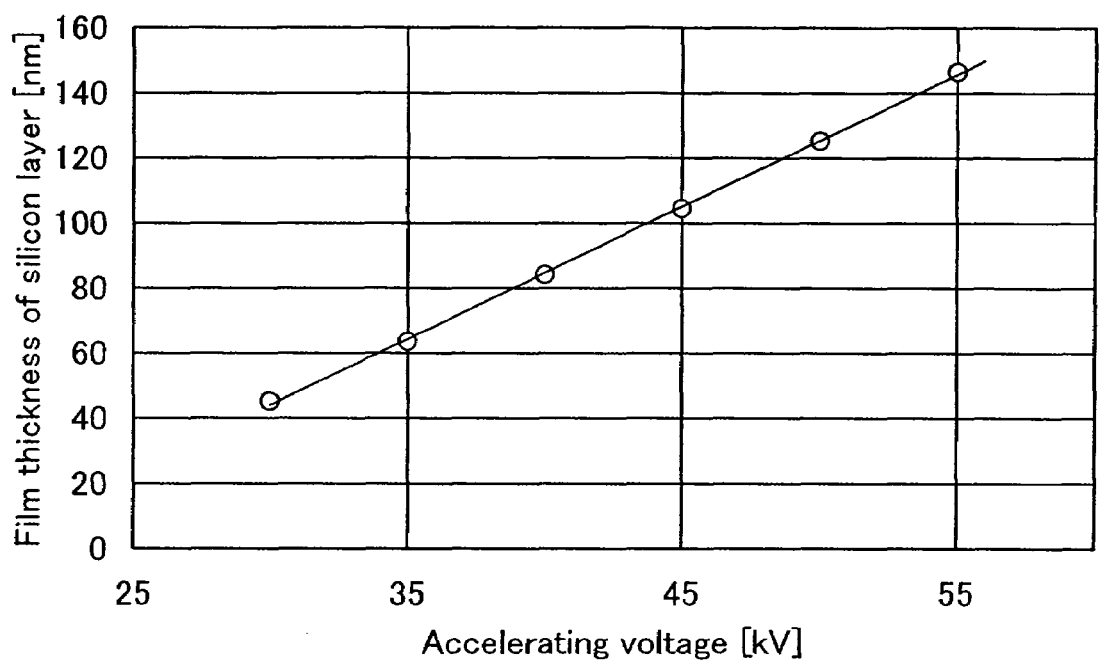
FIG. 22 is a graph showing the relation between an accelerating voltage in an ion irradiation step and a film thickness of a silicon layer.
Figure 23:
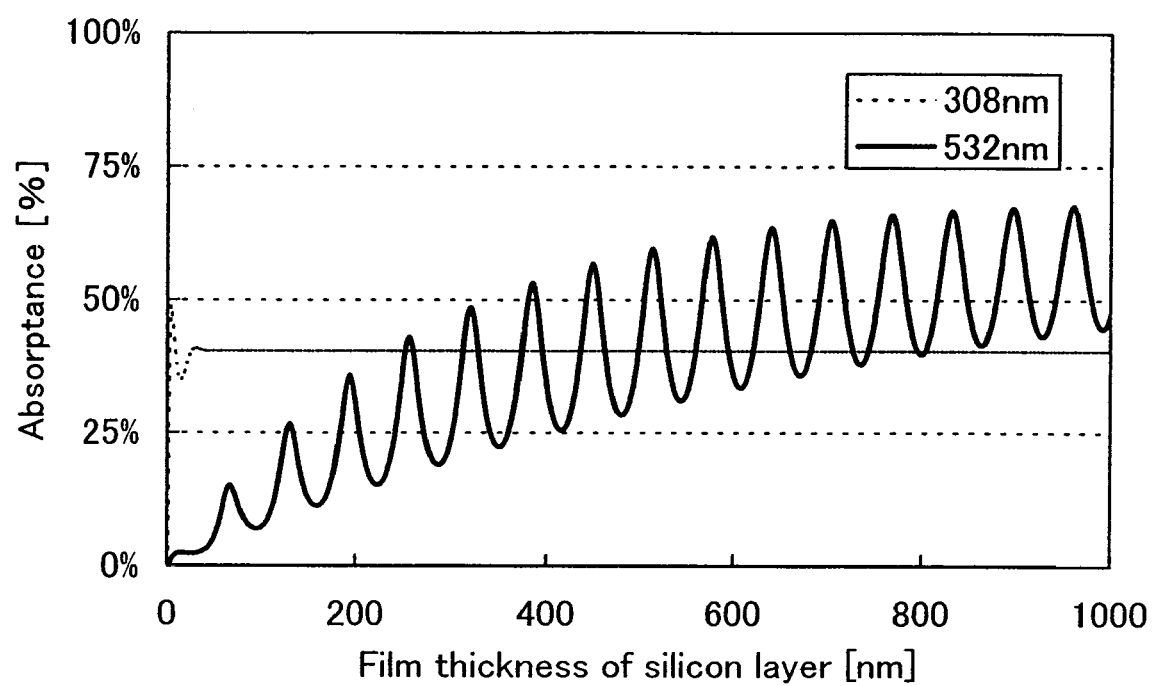
FIG. 23 is a graph showing the relation between a film thickness and light absorptance of a silicon layer.
Figure 24A:
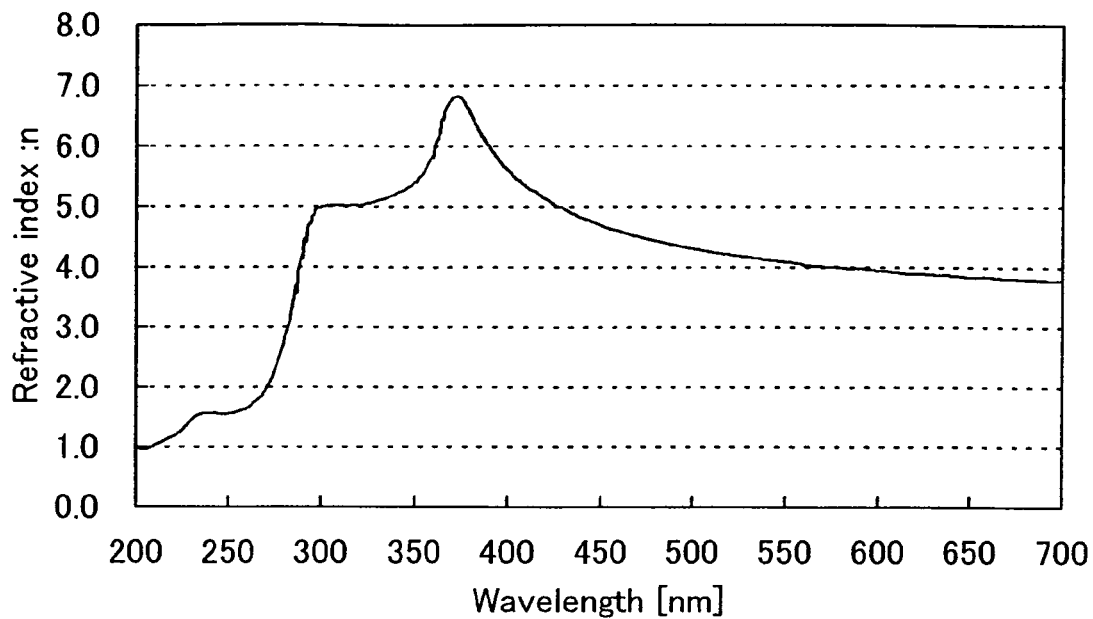
FIGS. 24A and 24B are graphs each showing optical characteristics of a silicon layer with respect to a light wavelength.
Figure 24B:
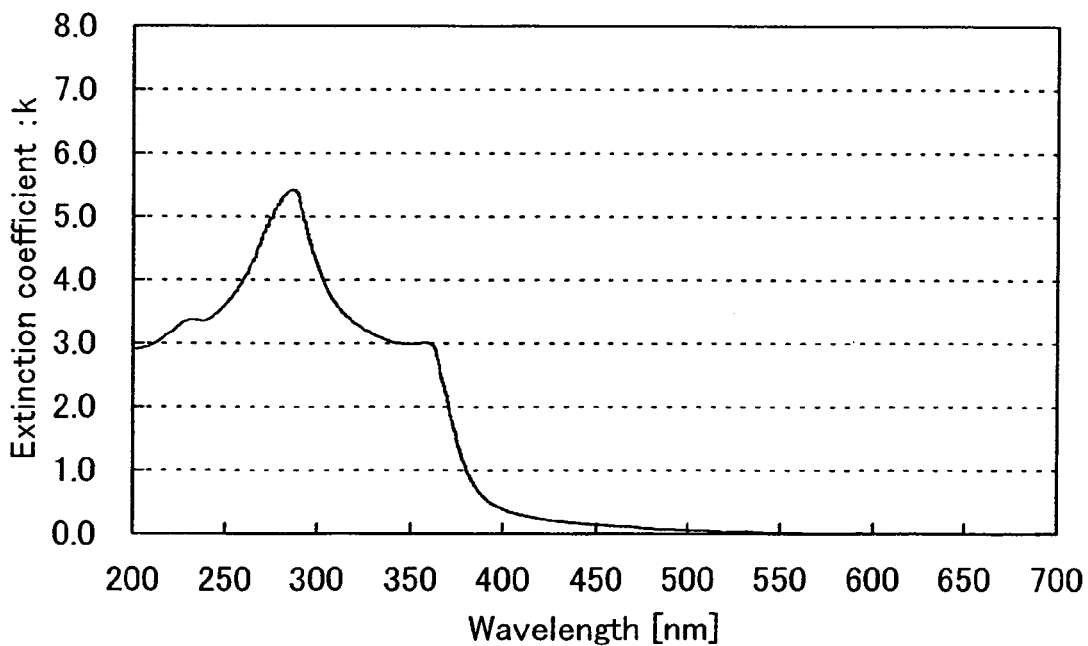

A relation between an accelerating voltage in the hydrogen ion irradiation step and the film thickness of the silicon layer after the separation and transfer is shown in FIG. 22. It was found that a linear relation d=4.0671V−78.008 is obtained under an accelerating voltage V [kV] in the hydrogen ion irradiation step and a silicon layer d [nm] after the separation and transfer. The single-crystal silicon substrate is irradiated with ions more deeply as the accelerating voltage increases. Therefore, it can be said that the embrittlement layer is formed at a deeper position and the thickness of the silicon layer which is transferred over the glass substrate larger as the accelerating voltage increases. In addition, when V of d=4.0671V−78.008 is solved, V=0.2459d+19.18. With the use of the equation V=0.2459d+19.18, an accelerating voltage condition in the hydrogen ion irradiation step for obtaining an arbitrary film thickness of the silicon layer can be calculated.

As an example, as light with which the silicon layer is irradiated, the irradiation is performed with a second harmonic ($\lambda$=532 nm) of an Nd: YAG laser. According to the present invention, the film thickness d of the silicon layer satisfies d=$\lambda$/2n×m±$\alpha$ (m=1, 2, 3, 4, . . . , 0≦$\alpha$≦10) in order to perform light irradiation efficiently. When a light wavelength $\lambda$=532 nm and a refractive index of the silicon layer n=4.16 are substituted into the equation and $\alpha$ is set equal to 0, the film thickness d of the silicon layer having maximal absorptance is at approximately 64 nm, 128 nm, 192 nm, 256 nm, and so on.

The condition of the hydrogen ion irradiation step is determined if the relational expression between the accelerating voltage in the hydrogen ion irradiation step and the film thickness of the silicon layer after the separation and transfer is experimentally obtained in advance. In this embodiment, according to the equation V=0.2459d+19.18 which is obtained from the experimental result of FIG. 22, an accelerating voltage corresponding to a predetermined film thickness of the silicon layer was obtained. In Table 2 of light wavelength $\lambda$=532 nm, the film thickness of the silicon layer having maximal absorptance and the accelerating voltage condition in the hydrogen ion irradiation step corresponding to the film thickness of each silicon layer are shown.

TABLE 2

| film thickness of silicon layer d [nm] | hydrogen doping accelerating voltage V [kV] |
|---|---|
| 64 | 35 |
| 128 | 51 |
| 192 | 66 |
| 256 | 82 |
| . . . | . . . |
| d | 0.2459d + 19.18 |

In the above-described manner, it was confirmed that the film thickness of a semiconductor layer which is transferred to a support substrate can be controlled by control of an accelerating voltage in an ion irradiation step at formation of an embrittlement layer to form the embrittlement layer at an arbitrary depth. Then, the semiconductor layer is controlled so as to satisfy an optimum film thickness condition where light absorptance of the semiconductor layer is high, so that light irradiation treatment can be performed efficiently on the semiconductor layer. Accordingly, performance of light treatment is improved, processing of a large-sized substrate can be realized, and thus productivity is improved.

This application is based on Japanese Patent Application serial No. 2007-175757 filed with Japan Patent Office on Jul. 4, 2007, the entire contents of which are hereby incorporated by reference.

What is claimed is:

1. A method for manufacturing an SOI substrate comprising the steps of:
   forming a semiconductor layer over a support substrate by separating the semiconductor layer from a single-crystal semiconductor substrate; and
   irradiating the semiconductor layer with light having a wavelength of 365 nm or more and 700 nm or less from the semiconductor layer side,
   wherein a film thickness d of the semiconductor layer irradiated with the light satisfies:

$d=\lambda/2n \times m \pm \alpha$ (nm), wherein $\lambda$ (nm) is a wavelength of the light, n is a refractive index of the semiconductor layer, m is a natural number greater than or equal to 1, and $\alpha$ is a parameter which satisfies 0≦$\alpha$≦10.

2. The method for manufacturing an SOI substrate according to claim 1, wherein the light is laser light.

3. The method for manufacturing an SOI substrate according to claim 1, wherein at least part of the semiconductor layer is melted by irradiating the semiconductor layer with the light.

4. The method for manufacturing an SOI substrate according to claim 1, wherein irradiating the semiconductor layer with the light is performed in an atmosphere in which oxygen is contained at 10% or more.

5. The method for manufacturing an SOI substrate according to claim 1, wherein irradiating the semiconductor layer with the light is performed in an atmosphere in which oxygen is contained at 10 ppm or less.

6. The method for manufacturing an SOI substrate according to claim 1 further comprising the steps of:
   performing ion irradiation on one surface of the single-crystal semiconductor substrate to form an embrittlement layer at a predetermined depth from one surface of the single-crystal semiconductor substrate;
   forming an insulating layer either over one surface of the single-crystal semiconductor substrate or over the support substrate; and
   performing heat treatment for separating the single-crystal semiconductor substrate at the embrittlement layer with the single-crystal semiconductor substrate and the support substrate overlapped, with the insulating layer interposed therebetween, whereby forming the semiconductor layer over the support substrate.

7. The method for manufacturing an SOI substrate according to claim 6, wherein the film thickness d of the semiconductor layer irradiated with the light is controlled by control of the predetermined depth from one surface of the single-crystal semiconductor substrate at which the embrittlement layer is formed.

8. The method for manufacturing an SOI substrate according to claim 6, further comprising a step of forming a protective layer over one surface of the single-crystal semiconductor substrate, wherein ion irradiation is performed on the single-crystal semiconductor substrate through the protective layer to form the embrittlement layer at the predetermined depth from one surface of the single-crystal semiconductor substrate.

9. The method for manufacturing an SOI substrate according to claim 8, wherein the protective layer is formed of a single layer selected from a silicon nitride layer, a silicon oxide layer, a silicon nitride oxide layer, or a silicon oxynitride layer, or a stacked layer structure of a plurality of the layers.

10. The method for manufacturing an SOI substrate according to claim 1 further comprising the steps of:
    performing ion irradiation on the single-crystal semiconductor substrate through an insulating layer which is formed over one surface of the single-crystal semiconductor substrate to form an embrittlement layer at a predetermined depth from one surface of the single-crystal semiconductor substrate; and
    performing heat treatment for separating the single-crystal semiconductor substrate at the embrittlement layer with the single-crystal semiconductor substrate and the support substrate overlapped, with the insulating layer interposed therebetween, whereby forming the semiconductor layer over the support substrate.

11. The method for manufacturing an SOI substrate according to claim 10, further comprising a step of forming a protective layer over one surface of the single-crystal semiconductor substrate, wherein the insulating layer is formed over the protective layer.

12. The method for manufacturing an SOI substrate according to claim 11, wherein the protective layer is formed of a single layer selected from a silicon nitride layer, a silicon oxide layer, a silicon nitride oxide layer, or a silicon oxynitride layer, or a stacked layer structure of a plurality of the layers.

13. A method for manufacturing an SOI substrate comprising the steps of:
    forming a semiconductor layer over a support substrate by separating the semiconductor layer from a single-crystal semiconductor substrate;
    irradiating the semiconductor layer with light having a wavelength of 365 nm or more and 700 nm or less from a side of the semiconductor layer; and
    controlling a film thickness d of the semiconductor layer irradiated with the light so as to satisfy:

$d = \lambda/2n \times m \pm \alpha$ (nm), wherein $\lambda$ (nm) is a wavelength of the light, n is a refractive index of the semiconductor layer, m is a natural number greater than or equal to 1, and $\alpha$ is a parameter which satisfies $0 \leq \alpha \leq 10$.

14. The method for manufacturing an SOI substrate according to claim 13, wherein the light is laser light.

15. The method for manufacturing an SOI substrate according to claim 13, wherein at least part of the semiconductor layer is melted by irradiating the semiconductor layer with the light.

16. The method for manufacturing an SOI substrate according to claim 13, wherein irradiating the semiconductor layer with the light is performed in an atmosphere in which oxygen is contained at 10% or more.

17. The method for manufacturing an SOI substrate according to claim 13, wherein irradiating the semiconductor layer with the light is performed in an atmosphere in which oxygen is contained at 10 ppm or less.

18. The method for manufacturing an SOI substrate according to claim 13 further comprising the steps of:
    performing ion irradiation on one surface of the single-crystal semiconductor substrate to form an embrittlement layer at a predetermined depth from one surface of the single-crystal semiconductor substrate;
    forming an insulating layer either over one surface of the single-crystal semiconductor substrate or over the support substrate; and
    performing heat treatment for separating the single-crystal semiconductor substrate at the embrittlement layer with the single-crystal semiconductor substrate and the support substrate overlapped, with the insulating layer interposed therebetween, whereby forming the semiconductor layer over the support substrate.

19. The method for manufacturing an SOI substrate according to claim 18, wherein the film thickness d of the semiconductor layer irradiated with the light is controlled by control of the predetermined depth from one surface of the single-crystal semiconductor substrate at which the embrittlement layer is formed.

20. The method for manufacturing an SOI substrate according to claim 18, further comprising a step of forming a protective layer over one surface of the single-crystal semiconductor substrate, wherein ion irradiation is performed on the single-crystal semiconductor substrate through the protective layer to form the embrittlement layer at the predetermined depth from one surface of the single-crystal semiconductor substrate.

21. The method for manufacturing an SOI substrate according to claim 20, wherein the protective layer is formed of a single layer selected from a silicon nitride layer, a silicon oxide layer, a silicon nitride oxide layer, or a silicon oxynitride layer, or a stacked layer structure of a plurality of the layers.

22. The method for manufacturing an SOI substrate according to claim 13 further comprising the steps of:
    performing ion irradiation on the single-crystal semiconductor substrate through an insulating layer which is formed over one surface of the single-crystal semiconductor substrate to form an embrittlement layer at a predetermined depth from one surface of the single-crystal semiconductor substrate; and
    performing heat treatment for separating the single-crystal semiconductor substrate at the embrittlement layer with the single-crystal semiconductor substrate and the support substrate overlapped, with the insulating layer interposed therebetween, whereby forming the semiconductor layer over the support substrate.

23. The method for manufacturing an SOI substrate according to claim 22, further comprising a step of forming a protective layer over one surface of the single-crystal semiconductor substrate, wherein the insulating layer is formed over the protective layer.

24. The method for manufacturing an SOI substrate according to claim 23, wherein the protective layer is formed of a single layer selected from a silicon nitride layer, a silicon oxide layer, a silicon nitride oxide layer, or a silicon oxynitride layer, or a stacked layer structure of a plurality of the layers.

25. The method for manufacturing an SOI substrate according to claim 13, wherein the controlling the film thickness d of the semiconductor layer irradiated with the light is conducted by performing etching treatment on a surface of the semiconductor layer.

26. The method for manufacturing an SOI substrate according to claim 13, wherein the controlling the film thickness d of the semiconductor layer irradiated with the light is conducted by performing polishing treatment on a surface of the semiconductor layer.

27. The method for manufacturing an SOI substrate according to claim 26, wherein the polishing treatment is performed by a chemical mechanical polishing method.

28. A method for manufacturing a semiconductor device comprising the steps of:
- forming a semiconductor layer over a support substrate by separating the semiconductor layer from a single-crystal semiconductor substrate;
- irradiating the semiconductor layer with light having a wavelength of 365 nm or more and 700 nm or less from the semiconductor layer side; and
- forming a semiconductor element using the semiconductor layer,
- wherein a film thickness d of the semiconductor layer irradiated with the light satisfies:

$d=\lambda/2n\times m\pm\alpha$ (nm),

- wherein $\lambda$ (nm) is a wavelength of the light, n is a refractive index of the semiconductor layer, m is a natural number greater than or equal to 1, and $\alpha$ is a parameter which satisfies $0\leq\alpha\leq 10$.

29. The method for manufacturing a semiconductor device according to claim 28 further comprising a step of:
- forming a display element which is electrically connected to the semiconductor element.

30. The method for manufacturing a semiconductor device according to claim 29, wherein the display element is a liquid crystal display element.

31. The method for manufacturing a semiconductor device according to claim 29, wherein the display element is a light-emitting element.

32. A method for manufacturing a semiconductor device comprising the steps of:
- forming a semiconductor layer over a support substrate by separating the semiconductor layer from a single-crystal semiconductor substrate;
- irradiating the semiconductor layer with light having a wavelength of 365 nm or more and 700 nm or less from a side of the semiconductor layer;
- controlling a film thickness d of the semiconductor layer irradiated with the light so as to satisfy:

$d=\lambda/2n\times m\pm\alpha$ (nm); and

- forming a semiconductor element using the semiconductor layer,
- wherein $\lambda$ (nm) is a wavelength of the light, n is a refractive index of the semiconductor layer, m is a natural number greater than or equal to 1, and $\alpha$ is a parameter which satisfies $0\leq\alpha\leq 10$.

33. The method for manufacturing a semiconductor device according to claim 32 further comprising a step of:
- forming a display element which is electrically connected to the semiconductor element.

34. The method for manufacturing a semiconductor device according to claim 33, wherein the display element is a liquid crystal display element.

35. The method for manufacturing a semiconductor device according to claim 33, wherein the display element is a light-emitting element.

* * * * *